United States Patent
Baek et al.

(10) Patent No.: US 9,577,861 B2
(45) Date of Patent: Feb. 21, 2017

(54) BROADCAST SIGNAL TRANSMISSION APPARATUS, BROADCAST SIGNAL RECEPTION APPARATUS, BROADCAST SIGNAL TRANSMISSION METHOD, AND BROADCAST SIGNAL RECEPTION METHOD

(71) Applicant: LG ELECTRONICS INC., Seoul (KR)

(72) Inventors: Jongseob Baek, Seoul (KR); Byounggill Kim, Seoul (KR); Woochan Kim, Seoul (KR); Jaehyung Kim, Seoul (KR); Woosuk Ko, Seoul (KR); Sungryong Hong, Seoul (KR); Chulkyu Moon, Seoul (KR); Jinyong Choi, Seoul (KR); Jaeho Hwang, Seoul (KR); Kookyeon Kwak, Seoul (KR); Byeongkook Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/759,604

(22) PCT Filed: May 9, 2014

(86) PCT No.: PCT/KR2014/004191
§ 371 (c)(1),
(2) Date: Jul. 7, 2015

(87) PCT Pub. No.: WO2014/182135
PCT Pub. Date: Nov. 13, 2014

(65) Prior Publication Data
US 2015/0349997 A1 Dec. 3, 2015

Related U.S. Application Data

(60) Provisional application No. 61/821,697, filed on May 9, 2013, provisional application No. 61/825,076, filed (Continued)

(51) Int. Cl.
*H04H 20/71* (2008.01)
*H04L 27/26* (2006.01)
(Continued)

(52) U.S. Cl.
CPC ......... *H04L 27/2637* (2013.01); *H04B 7/0413* (2013.01); *H04H 20/71* (2013.01);
(Continued)

(58) Field of Classification Search
CPC ........ H04H 20/44; H04H 20/46; H04H 20/65; H04H 20/71; H04L 27/2626; H04L 27/2647; H04L 27/2637; H04L 27/3494; H04L 1/0009; H04L 1/0041; H04L 1/0045; H04L 1/0054; H04L 1/0063; H04L 1/0064; H04L 1/0071; H03M 13/27; H04B 7/0413
(Continued)

(56) References Cited

U.S. PATENT DOCUMENTS 8,179,954 B2 * 5/2012 Taylor .................. H04L 5/0044
375/230
9,191,082 B2 * 11/2015 Choi .................... H04B 7/0413
(Continued)

FOREIGN PATENT DOCUMENTS

EP 2216926 A1 8/2010
EP 2237468 A1 10/2010
(Continued)

OTHER PUBLICATIONS

International Search Report and Written Opinion from PCT/KR2014/004191, dated Sep. 1, 2014.
(Continued)

*Primary Examiner* — Betsy Deppe
(74) *Attorney, Agent, or Firm* — Dentons US LLP

(57) ABSTRACT

The present invention provides a method for transmitting a broadcast signal. The method for transmitting the broadcast signal according to the present invention may comprise the steps of: formatting input streams into multiple data pipes (DPs); encoding data of the multiple DPs according to a code rate for each DP; generating at least one signal frame by mapping the encoded data of the multiple DPs; and modulating data of the generated signal frame in an orthogonal frequency division multiplexing (OFDM) scheme, and transmitting the broadcast signal including data of the modulated signal frame.

18 Claims, 63 Drawing Sheets

Related U.S. Application Data on May 9, 2013, provisional application No. 61/825,531, filed on May 21, 2013, provisional application No. 61/825,533, filed on May 21, 2013, provisional application No. 61/832,936, filed on Jun. 9, 2013.

(51) Int. Cl.

| | | |
|---|---|---|
| *H04L 1/00* | (2006.01) | |
| *H04L 27/34* | (2006.01) | |
| *H04B 7/04* | (2006.01) | |
| *H03M 13/11* | (2006.01) | |
| *H03M 13/15* | (2006.01) | |
| *H03M 13/27* | (2006.01) | |
| *H03M 13/29* | (2006.01) | |

(52) U.S. Cl.
CPC .......... *H04L 1/0009* (2013.01); *H04L 1/0041* (2013.01); *H04L 1/0045* (2013.01); *H04L 1/0054* (2013.01); *H04L 1/0063* (2013.01); *H04L 1/0064* (2013.01); *H04L 1/0071* (2013.01); *H04L 27/2626* (2013.01); *H04L 27/2647* (2013.01); *H04L 27/3494* (2013.01); *H03M 13/1165* (2013.01); *H03M 13/152* (2013.01); *H03M 13/27* (2013.01); *H03M 13/2906* (2013.01)

(58) Field of Classification Search
USPC ....... 375/260, 261, 267, 268, 299, 332, 340, 375/347; 341/81
See application file for complete search history.

(56) References Cited

U.S. PATENT DOCUMENTS

| | | | | |
|---|---|---|---|---|
| 2009/0168909 | A1* | 7/2009 | Stadelmeier | H04H 20/46 375/260 |
| 2010/0115361 | A1* | 5/2010 | Peng | H03M 13/2703 714/748 |
| 2011/0299493 | A1 | 12/2011 | Guitierrez et al. | |
| 2011/0317785 | A1* | 12/2011 | Petrov | H04L 27/2611 375/295 |
| 2012/0243596 | A1* | 9/2012 | Lovell | H04L 25/0232 375/229 |
| 2012/0314762 | A1 | 12/2012 | Herrmann | |
| 2013/0308505 | A1* | 11/2013 | Hong | H04B 7/0413 370/310 |
| 2013/0329811 | A1* | 12/2013 | Breiling | H04H 20/72 375/240.26 |

FOREIGN PATENT DOCUMENTS

| | | |
|---|---|---|
| EP | 2541917 A2 | 1/2013 |
| KR | 10-2011-0108395 A | 10/2011 |
| WO | 2012-067362 A2 | 5/2012 |

OTHER PUBLICATIONS

Search Report of European Patent Office in Application No. 14795181.8, dated Nov. 18, 2016.

* cited by examiner

FIG. 18
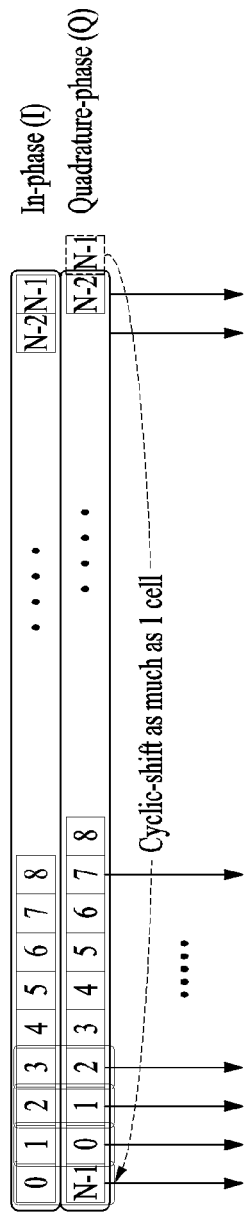
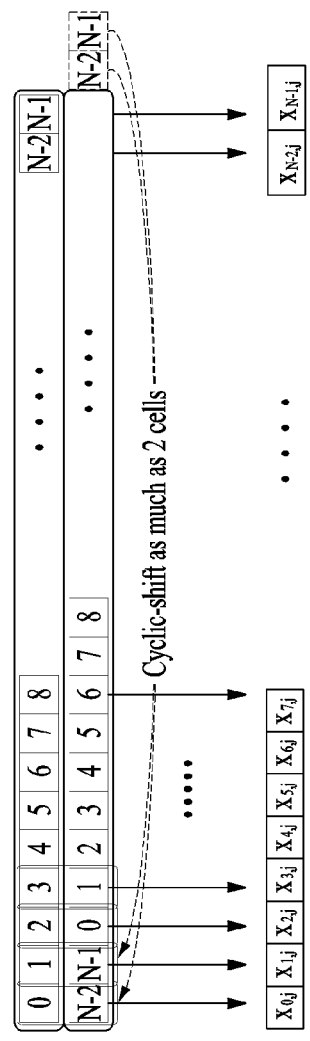

FIG. 19
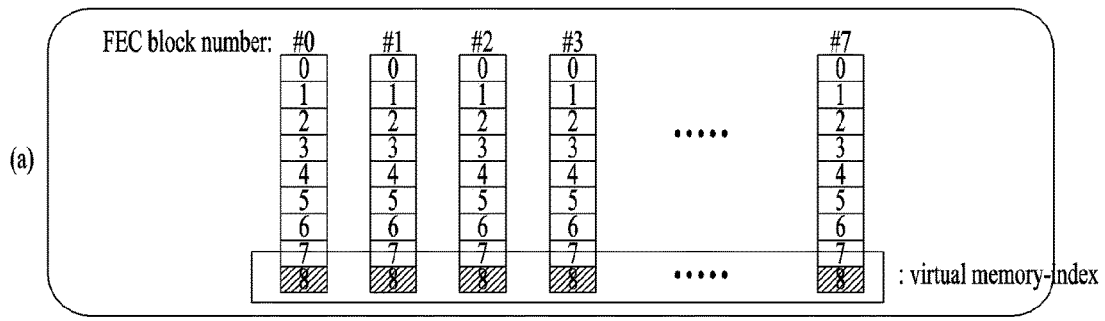
(a) Memory-index for writing operation
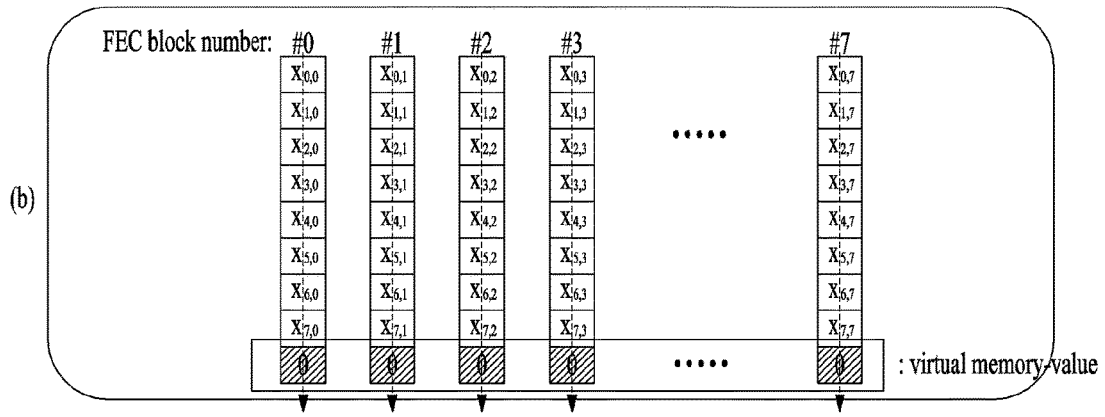
(b) Memory-value after writing operation

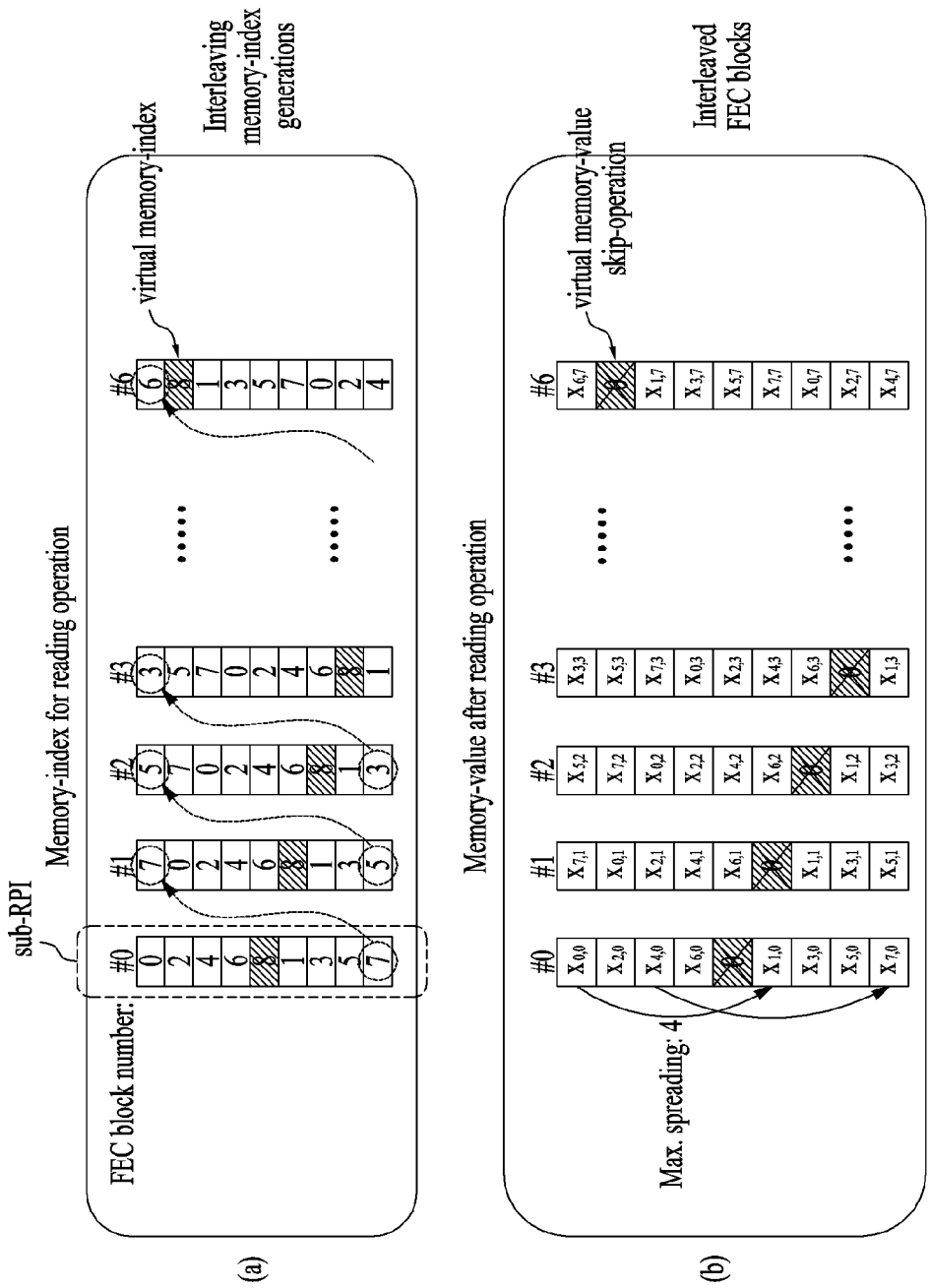

FIG. 21

$$C_{cnt} = 0$$
$$\text{for } j = 0, \ldots, N_{FEC\_NUM} - 1, \; k = 0, \ldots, V_{Cell\_NUM} - 1$$
$$\theta_j(k) = (I_j + D_{SSD} k) \bmod V_{Cell\_NUM}$$

skip operation $$\text{if } \theta_j(k) \; N_{Cell\_NUM} - 1$$
$$\pi_j(C_{cnt}) = \theta_j(k); \; C_{cnt} = C_{cnt} + 1$$
end end
$$\text{where } I_j = \pi_{j-1}(V_{Cell\_NUM} - 1) \text{ with } I_0 = 0, \; V_{Cell\_NUM} = N_{Cell\_NUM} + D_{SSD} - 1$$

$I_j$ : the initial-offset value at the $j^{th}$ RPI for interleaving
mod : modulus operation
$\pi_j(k)$ : interleaving output memory-index (RPI output value) for the $k^{th}$ input cell-index in the $j^{th}$ FEC block
$C_{cnt,j}$ : counter of actual interleaving output memory-index for the jth FEC block

FIG. 22

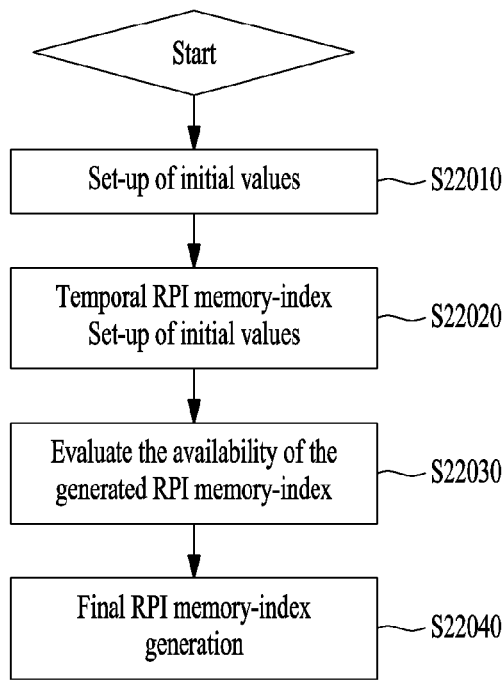

FIG. 27

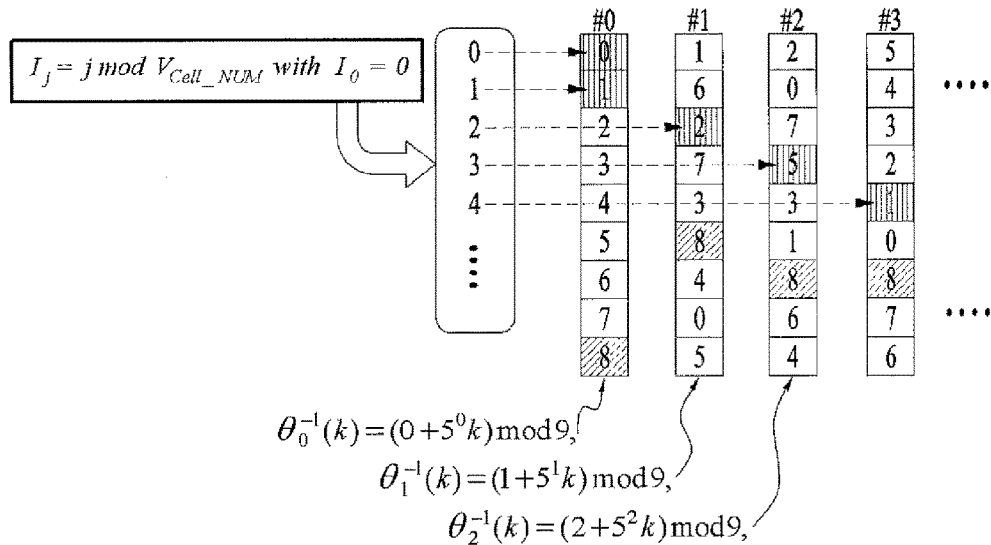

FIG. 28

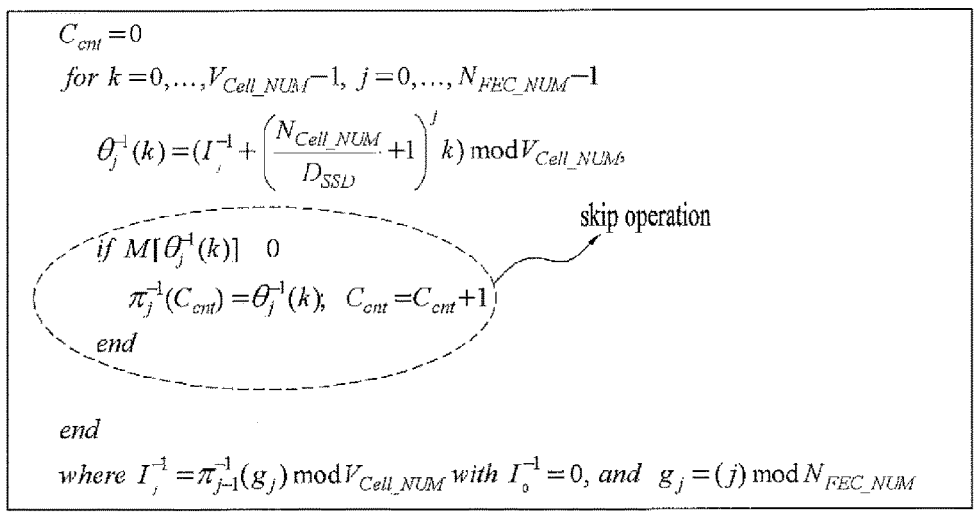

$M(\theta_j^{-1}(k))$ : memory-value at $\theta_j^{-1}(k)$ $I_j^{-1}$ : the initial-offset value at the $j^{th}$ RPI for deinterleaving $\pi_j^{-1}(k)$ : deinterleaving output memory-index for the $k^{th}$ input cell-index in the $j^{th}$ FEC block $\pi_j^{-1}(g_j)$ : the $(g_j)th$ deinterleaving output memory-index in the $j^{th}$ FEC block $C_{cnt,j}$ : counter of actual deinterleaving output memory-index for the $j$th FEC block FIG. 35
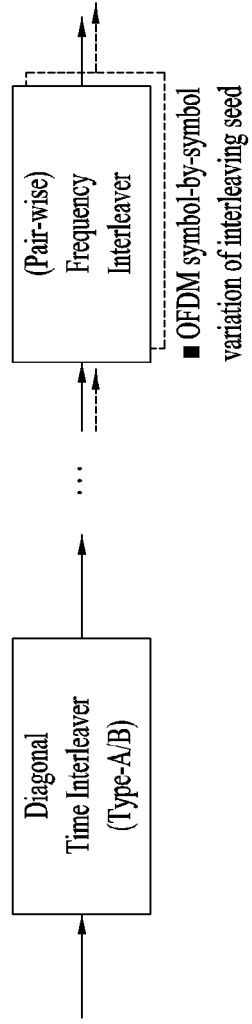
(a) Interleaving architecture at transmitter
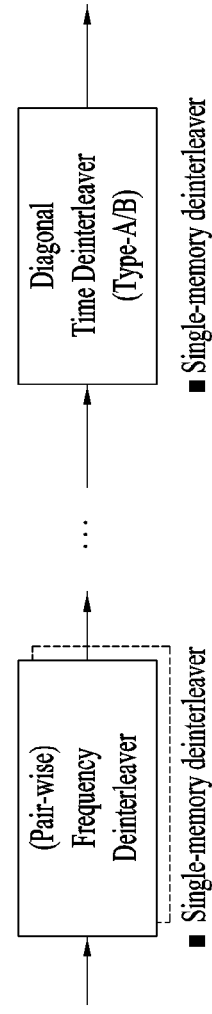
(b) Deinterleaving architecture at receiver (a) BRGC (b) bit package allocation 8-bit package (bb7/bb6/bb5/bb4/bb3/bb2/bb1/bb0)
→ 1) b7/b6/b5/b4/b3/b2/b1/b0
→ 2) b7/b3/b6/b2/b5/b1/b4/b0
→ 3) b7/b1/b6/b0/b5/b3/b4/b2

< constellation mapping: 256-QAM case >

256-QAM Constellation

< Modification of Constellation >
(in-phase, quadrature-phase)

(15,11) ⟶ (17,5)
(15,13) ⟶ (17,3)
(15,15) ⟶ (17,1)

(11,15) ⟶ (5,17)
(13,15) ⟶ (3,17)

(-11,15) ⟶ (-5,17)
(-13,15) ⟶ (-3,17)
(-15,15) ⟶ (-1,17)

(-15,11) ⟶ (-17,5)
(-15,13) ⟶ (-17,3)

(-15,-11) ⟶ (-17,-5)
(-15,-13) ⟶ (-17,-3)
(-15,-15) ⟶ (-17,-1)

(-11,-15) ⟶ (-5,-17)
(-13,-15) ⟶ (-3,-17)

(11,-15) ⟶ (5,-17)
(13,-15) ⟶ (3,-17)
(15,-15) ⟶ (1,-17)

(15,-11) ⟶ (17,-5)
(15,-13) ⟶ (17,-3)

(b)

< Modified Constellation of New m256 -QAM #1/#2 >
(in-phase, quadrature-phase)

New m256 -QAM #1: (17,x), (x,17) ⟶ (18,x), (x,18)

New m256 -QAM #1: (17,x), (x,17) ⟶ (19,x), (x,19)

BROADCAST SIGNAL TRANSMISSION APPARATUS, BROADCAST SIGNAL RECEPTION APPARATUS, BROADCAST SIGNAL TRANSMISSION METHOD, AND BROADCAST SIGNAL RECEPTION METHOD

This application is a National Phase application of International Application No. PCT/KR2014/004191, filed May 9, 2014, and claims the benefit of U.S. Application No. 61/821,697, filed on May 9, 2013, 61/825,076, filed May 19, 2013, 61/825,531, filed May 21, 2013, 61/825,533, filed May 21, 2013 and 61/832,936, filed Jun. 9, 2013 all of which are hereby incorporated by reference in their entirety for all purposes as if fully set forth herein.

TECHNICAL FIELD

The present invention relates to an apparatus for transmitting broadcast signals, an apparatus for receiving broadcast signals and methods for transmitting and receiving broadcast signals.

BACKGROUND ART

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

DISCLOSURE

Technical Problem

Accordingly, the present invention is directed to an apparatus for transmitting broadcast signals and an apparatus for receiving broadcast signals for future broadcast services and methods for transmitting and receiving broadcast signals for future broadcast services.

Technical Solution

The object of the present invention can be achieved by providing a broadcast signal transmission method including formatting input streams into a plurality of data pipes (DPs), encoding data of the DPs per DP based on a code rate, wherein the encoding of the data of the DPs per DP includes low density parity check (LDPC)-encoding the data of the DPs, bit-interleaving the LDPC-encoded data, mapping the bit-interleaved data to a constellation based on the code rate, multiple-input multiple-output (MIMO)-encoding the mapped data, and diagonal-time-interleaving the MIMO-encoded data, generating at least one signal frame by mapping the encoded data of the DPs, and modulating data of the generated signal frame using an orthogonal frequency division multiplexing (OFDM) scheme and transmitting a broadcast signal including the modulating data of the signal frame.

The diagonal-time-interleaving may further include performing column-wise write operation to store the MIMO-encoded data in a memory, and interleaving the stored data by performing diagonal-wise read operation from the memory.

The generating of the signal frame may further include frequency-interleaving data of the generated signal frame on an OFDM symbol pair basis.

The frequency-interleaving may include performing interleaving using two memories.

The constellation may be a quadrature amplitude modulation (QAM) constellation or a non-uniform QAM (NU-QAM) constellation having a maximum capacity per DP.

The encoding of the data of the DPs per DP may further include interleaving the data mapped to the constellation, and the interleaving of the data mapped to the constellation may further include splitting the data mapped to the constellation into real number components and imaginary number components and delaying the imaginary number components, and sequentially writing the delayed data to store the data in a memory and reading the data stored in the memory using memory indexes.

In another aspect of the present invention, provided herein is a broadcast signal reception method including receiving a broadcast signal and demodulating data of a signal frame included in the received broadcast signal, using an orthogonal frequency division multiplexing (OFDM) scheme, parsing the signal frame by demapping data of a plurality of data pipes (DPs), decoding the data of the DPs per DP based on a code rate, wherein the decoding of the data of the DPs per DP includes diagonal-time-deinterleaving the data of the DPs, multiple-input multiple-output (MIMO)-decoding the time-deinterleaved data, demapping the MIMO-decoded data from a constellation based on the code rate, bit-deinterleaving the data demapped from the constellation, and low density parity check (LDPC)-decoding the bit-deinterleaved data, and deformatting the data of the DPs into output streams.

The diagonal-time-deinterleaving may further include performing diagonal-wise write operation to store the data of the DPs in a memory, and deinterleaving the stored data by performing column-wise read operation from the memory.

The parsing of the signal frame may further include frequency-deinterleaving the data of the signal frame on an OFDM symbol pair basis.

The frequency-deinterleaving may include performing deinterleaving using one memory.

The constellation may be a quadrature amplitude modulation (QAM) constellation or a non-uniform QAM (NU-QAM) constellation having a maximum capacity per DP.

The decoding of the data of the DPs per DP may further include deinterleaving the time-deinterleaved data, and the deinterleaving of the time-deinterleaved data may further include inserting 0 to memory index locations ignored due to skip operation of the time-deinterleaved data and performing write operation using memory indexes to store the data in a single memory simultaneously with read operation performed on the data stored in the single memory, and splitting the read data into real number components and imaginary number components and delaying the real number components.

In another aspect of the present invention, provided herein is a broadcast signal transmission apparatus including an input formatting module for formatting input streams into a plurality of data pipes (DPs), a coding & modulation module for encoding data of the DPs per DP based on a code rate, wherein the coding & modulation module includes a low density parity check (LDPC) encoding block for LDPC-encoding the data of the DPs, a bit interleaving block for bit-interleaving the LDPC-encoded data, a constellation mapping block for mapping the bit-interleaved data to a constellation based on the code rate, a multiple-input multiple-output (MIMO) encoding block for MIMO-encoding the mapped data, and a diagonal time interleaving block for diagonal-time-interleaving the MIMO-encoded data, a frame generation module for generating at least one signal frame by mapping the encoded data of the DPs, and an orthogonal frequency division multiplexing (OFDM) module for modulating data of the generated signal frame using an OFDM scheme and transmitting a broadcast signal including the modulating data of the signal frame.

The diagonal time interleaving block may perform column-wise write operation to store the MIMO-encoded data in a memory, and interleave the stored data by performing diagonal-wise read operation from the memory.

The frame generation module may further include a frequency interleaving block for frequency-interleaving data of the generated signal frame on an OFDM symbol pair basis.

The frequency interleaving block may perform interleaving using two memories.

The constellation may be a quadrature amplitude modulation (QAM) constellation or a non-uniform QAM (NU-QAM) constellation having a maximum capacity per DP.

The coding & modulation module may further include an interleaving block for interleaving the data mapped to the constellation, and the interleaving block may split the data mapped to the constellation into real number components and imaginary number components and delay the imaginary number components, and sequentially write the delayed data to store the data in a memory and read the data stored in the memory using memory indexes.

In another aspect of the present invention, provided herein is a broadcast signal reception apparatus including an orthogonal frequency division multiplexing (OFDM) module for receiving a broadcast signal and demodulating data of a signal frame included in the received broadcast signal, using an OFDM scheme, a frame parsing module for parsing the signal frame by demapping data of a plurality of data pipes (DPs), a demapping & decoding module for decoding the data of the DPs per DP based on a code rate, wherein the demapping & decoding module includes a diagonal time deinterleaving block for diagonal-time-deinterleaving the data of the DPs, a multiple-input multiple-output (MIMO) decoding block for MIMO-decoding the time-deinterleaved data, a constellation demapping block for demapping the MIMO-decoded data from a constellation based on the code rate, a bit deinterleaving block for bit-deinterleaving the data demapped from the constellation, and a low density parity check (LDPC) decoding block for LDPC-decoding the bit-deinterleaved data, and an output processing module for deformatting the data of the DPs into output streams.

The diagonal time deinterleaving block may perform diagonal-wise write operation to store the data of the DPs in a memory, and deinterleave the stored data by performing column-wise read operation from the memory.

The frame parsing module may further include a frequency deinterleaving block for frequency-deinterleaving the data of the signal frame on an OFDM symbol pair basis.

The frequency deinterleaving block may perform deinterleaving using one memory.

The constellation may be a quadrature amplitude modulation (QAM) constellation or a non-uniform QAM (NU-QAM) constellation having a maximum capacity per DP.

The demapping & decoding module may further include a deinterleaving block for deinterleaving the time-deinterleaved data, and the deinterleaving block may insert 0 to memory index locations ignored due to skip operation of the time-deinterleaved data and perform write operation using memory indexes to store the data in a single memory simultaneously with read operation performed on the data stored in the single memory, and split the read data into real number components and imaginary number components and delay the real number components.

Advantageous Effects

The present invention may control quality of service (QoS) per service or per service component by processing data based on characteristics of service to provide a variety of broadcast services.

The present invention may ensure transmission flexibility by transmitting a variety of broadcast services through the same radio frequency (RF) signal bandwidth.

The present invention may increase data transmission efficiency and broadcast signal transmission/reception robustness using an multiple-input multiple-output (MIMO) system.

DESCRIPTION OF DRAWINGS

FIG. 18 is a view illustrating operation of a Q1/Q2 delay block according to an embodiment of the present invention.

FIG. 19 is a view illustrating a writing process of RPI according to an embodiment of the present invention.

FIG. 20 is a view illustrating a reading process of the RPI according to an embodiment of the present invention.

FIG. 21 is a mathematical expression of a memory index generation process for the reading process of the RPI according to an embodiment of the present invention.

FIG. 22 is a flowchart of the memory index generation process of the RPI according to an embodiment of the present invention.

FIG. 27 is a view illustrating a memory index generation process in a reading process of the RPD according to an embodiment of the present invention.

FIG. 28 is a mathematical expression of the memory index generation process for the reading process of the RPD according to an embodiment of the present invention.

FIG. 35 is a view illustrating a fourth scenario S4 among the combinations of interleavers according to an embodiment of the present invention, when SSD is not considered.

FIG. 57 is a view illustrating constellation moving methods of new modified 256 QAM using coordinate values according to an embodiment of the present invention.

BEST MODE

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

Figure 1:
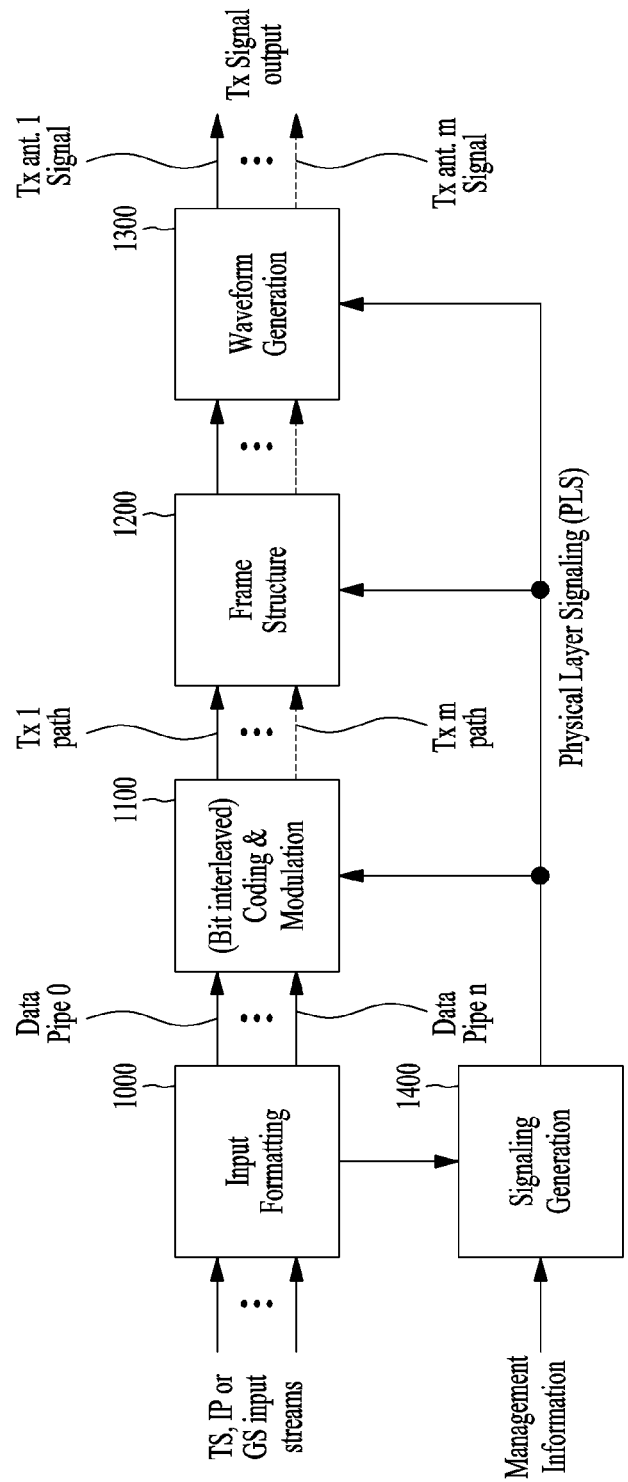
FIG. 1 illustrates a structure of an apparatus for transmitting broadcast signals for future broadcast services according to an embodiment of the present invention.

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting module 1000, a coding & modulation module 1100, a frame structure module 1200, a waveform generation module 1300 and a signaling generation module 1400. A description will be given of the operation of each module of the apparatus for transmitting broadcast signals.

Referring to FIG. 1, the apparatus for transmitting broadcast signals for future broadcast services according to an embodiment of the present invention can receive MPEG-TSs, IP streams (v4/v6) and generic streams (GSs) as an input signal. In addition, the apparatus for transmitting broadcast signals can receive management information about the configuration of each stream constituting the input signal and generate a final physical layer signal with reference to the received management information.

The input formatting module 1000 according to an embodiment of the present invention can classify the input streams on the basis of a standard for coding and modulation or services or service components and output the input streams as a plurality of logical data pipes (or data pipes or DP data). The data pipe is a logical channel in the physical layer that carries service data or related metadata, which may carry one or multiple service(s) or service component (s). In addition, data transmitted through each data pipe may be called DP data.

In addition, the input formatting module 1000 according to an embodiment of the present invention can divide each data pipe into blocks necessary to perform coding and modulation and carry out processes necessary to increase transmission efficiency or to perform scheduling. Details of operations of the input formatting module 1000 will be described later.

The coding & modulation module 1100 according to an embodiment of the present invention can perform forward error correction (FEC) encoding on each data pipe received from the input formatting module 1000 such that an apparatus for receiving broadcast signals can correct an error that may be generated on a transmission channel. In addition, the coding & modulation module 1100 according to an embodiment of the present invention can convert FEC output bit data to symbol data and interleave the symbol data to correct burst error caused by a channel. As shown in FIG. 1, the coding & modulation module 1100 according to an embodiment of the present invention can divide the processed data such that the divided data can be output through data paths for respective antenna outputs in order to transmit the data through two or more Tx antennas.

The frame structure module 1200 according to an embodiment of the present invention can map the data output from the coding & modulation module 1100 to signal frames. The frame structure module 1200 according to an embodiment of the present invention can perform mapping using scheduling information output from the input formatting module 1000 and interleave data in the signal frames in order to obtain additional diversity gain.

The waveform generation module 1300 according to an embodiment of the present invention can convert the signal frames output from the frame structure module 1200 into a signal for transmission. In this case, the waveform generation module 1300 according to an embodiment of the present invention can insert a preamble signal (or preamble) into the signal for detection of the transmission apparatus and insert a reference signal for estimating a transmission channel to compensate for distortion into the signal. In addition, the waveform generation module 1300 according to an embodiment of the present invention can provide a guard interval and insert a specific sequence into the same in order to offset the influence of channel delay spread due to multi-path reception. Additionally, the waveform generation module 1300 according to an embodiment of the present invention can perform a procedure necessary for efficient transmission in consideration of signal characteristics such as a peak-to-average power ratio of the output signal.

The signaling generation module 1400 according to an embodiment of the present invention generates final physical layer signaling information using the input management information and information generated by the input formatting module 1000, coding & modulation module 1100 and frame structure module 1200. Accordingly, a reception apparatus according to an embodiment of the present invention can decode a received signal by decoding the signaling information.

As described above, the apparatus for transmitting broadcast signals for future broadcast services according to one embodiment of the present invention can provide terrestrial broadcast service, mobile broadcast service, UHDTV service, etc. Accordingly, the apparatus for transmitting broadcast signals for future broadcast services according to one embodiment of the present invention can multiplex signals for different services in the time domain and transmit the same.

Figure 2:
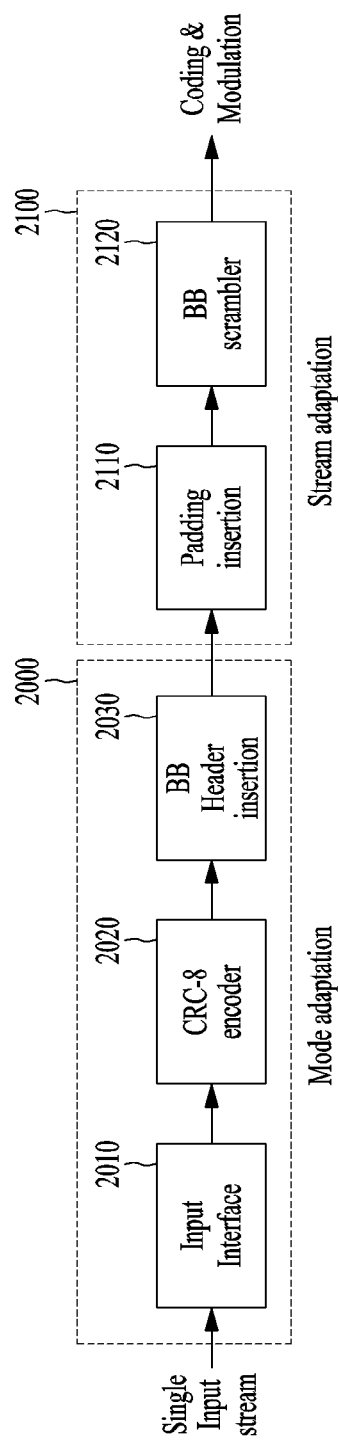
FIG. 2 illustrates an input formatting module according to an embodiment of the present invention.
Figure 3:
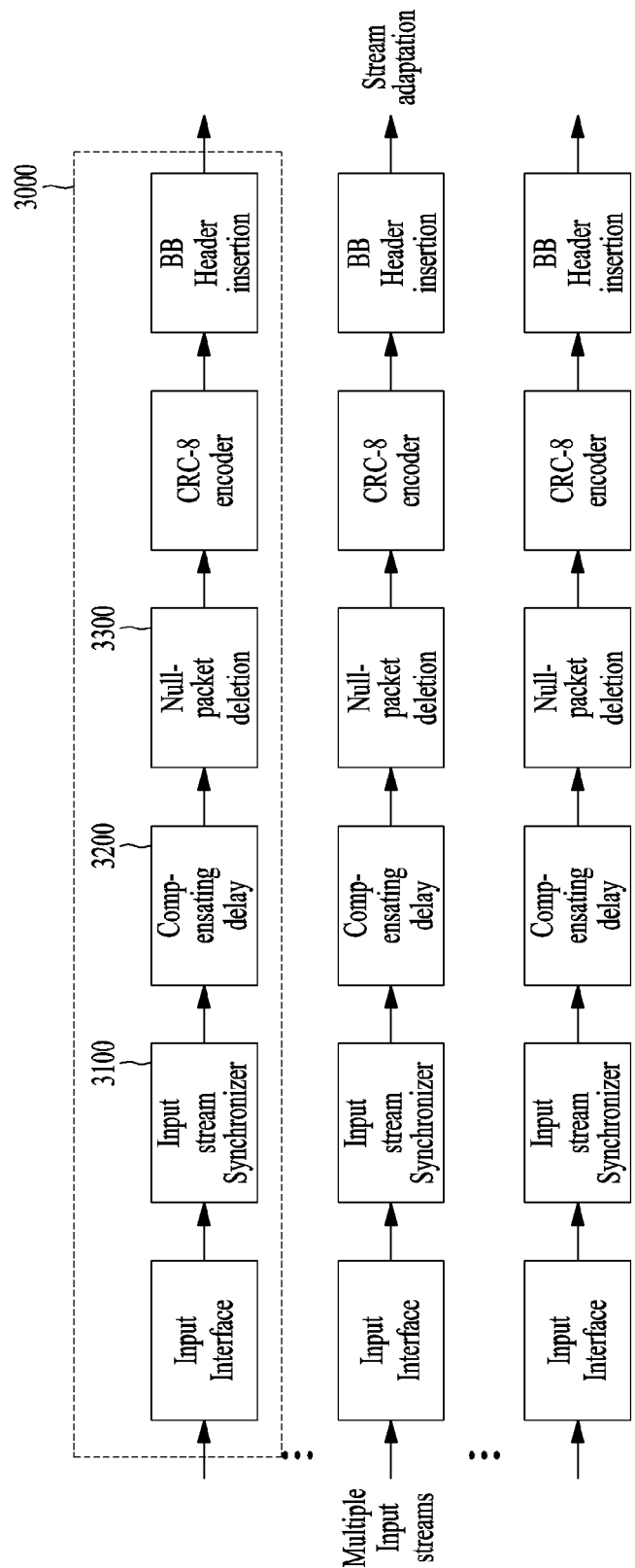
FIG. 3 illustrates an input formatting module according to another embodiment of the present invention.
Figure 4:
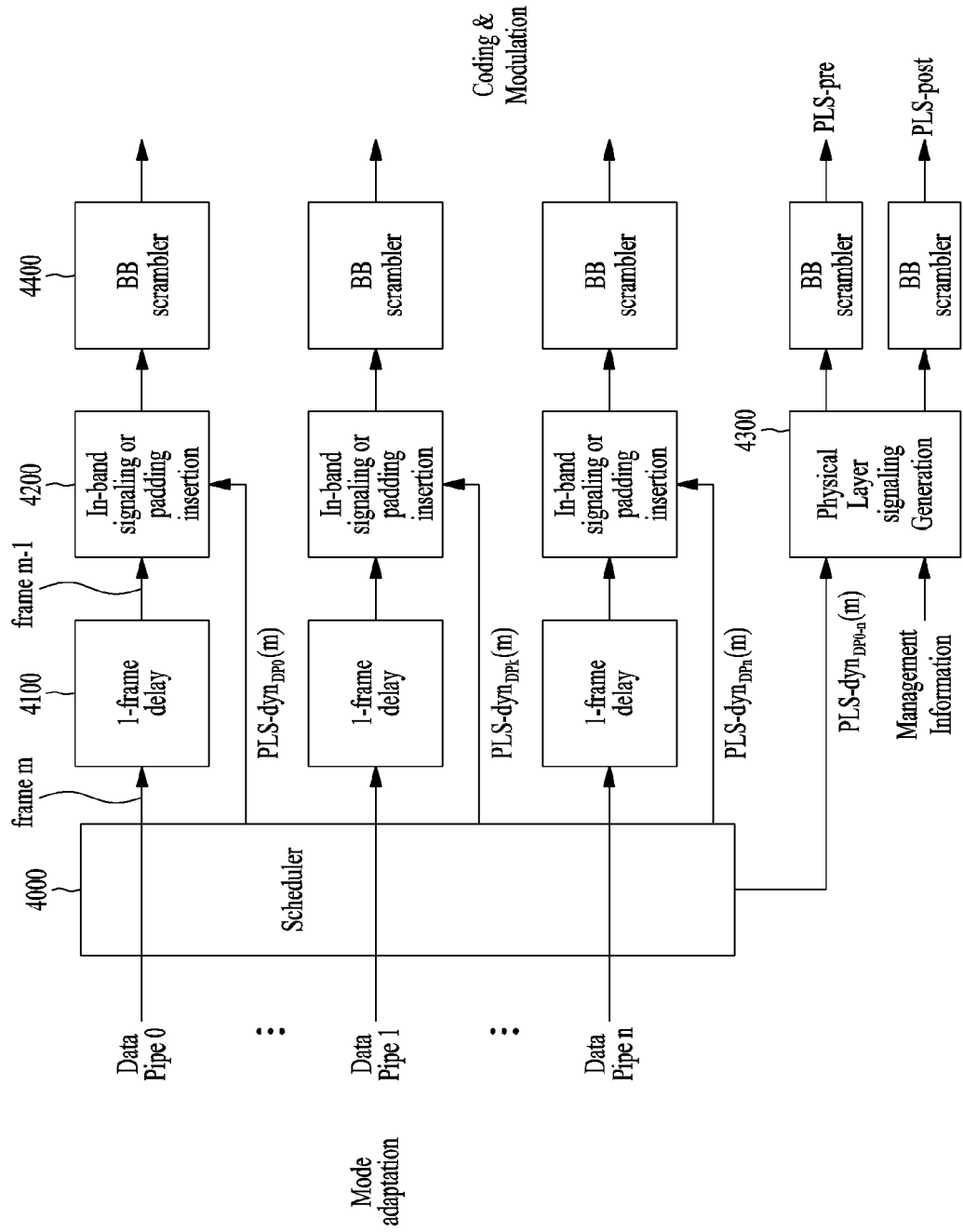
FIG. 4 illustrates an input formatting module according to another embodiment of the present invention.

FIGS. 2, 3 and 4 illustrate the input formatting module 1000 according to embodiments of the present invention. A description will be given of each figure.

FIG. 2 illustrates an input formatting module according to one embodiment of the present invention. FIG. 2 shows an input formatting module when the input signal is a single input stream.

Referring to FIG. 2, the input formatting module according to one embodiment of the present invention can include a mode adaptation module 2000 and a stream adaptation module 2100.

As shown in FIG. 2, the mode adaptation module 2000 can include an input interface block 2010, a CRC-8 encoder block 2020 and a BB header insertion block 2030. Description will be given of each block of the mode adaptation module 2000.

The input interface block 2010 can divide the single input stream input thereto into data pieces each having the length of a baseband (BB) frame used for FEC (BCH/LDPC) which will be performed later and output the data pieces.

The CRC-8 encoder block 2020 can perform CRC encoding on BB frame data to add redundancy data thereto.

The BB header insertion block 2030 can insert, into the BB frame data, a header including information such as mode adaptation type (TS/GS/IP), a user packet length, a data field length, user packet sync byte, start address of user packet sync byte in data field, a high efficiency mode indicator, an input stream synchronization field, etc.

As shown in FIG. 2, the stream adaptation module 2100 can include a padding insertion block 2110 and a BB scrambler block 2120. Description will be given of each block of the stream adaptation module 2100.

If data received from the mode adaptation module 2000 has a length shorter than an input data length necessary for FEC encoding, the padding insertion block 2110 can insert a padding bit into the data such that the data has the input data length and output the data including the padding bit.

The BB scrambler block 2120 can randomize the input bit stream by performing an XOR operation on the input bit stream and a pseudo random binary sequence (PRBS).

The above-described blocks may be omitted or replaced by blocks having similar or identical functions.

As shown in FIG. 2, the input formatting module can finally output data pipes to the coding & modulation module.

FIG. 3 illustrates an input formatting module according to another embodiment of the present invention. FIG. 3 shows a mode adaptation module 3000 of the input formatting module when the input signal corresponds to multiple input streams.

The mode adaptation module 3000 of the input formatting module for processing the multiple input streams can independently process the multiple input streams.

Referring to FIG. 3, the mode adaptation module 3000 for respectively processing the multiple input streams can include input interface blocks, input stream synchronizer blocks 3100, compensating delay blocks 3200, null packet deletion blocks 3300, CRC-8 encoder blocks and BB header insertion blocks. Description will be given of each block of the mode adaptation module 3000.

Operations of the input interface block, CRC-8 encoder block and BB header insertion block correspond to those of the input interface block, CRC-8 encoder block and BB header insertion block described with reference to FIG. 2 and thus description thereof is omitted.

The input stream synchronizer block 3100 can transmit input stream clock reference (ISCR) information to generate timing information necessary for the apparatus for receiving broadcast signals to restore the TSs or GSs.

The compensating delay block 3200 can delay input data and output the delayed input data such that the apparatus for receiving broadcast signals can synchronize the input data if a delay is generated between data pipes according to processing of data including the timing information by the transmission apparatus.

The null packet deletion block 3300 can delete unnecessarily transmitted input null packets from the input data, insert the number of deleted null packets into the input data based on positions in which the null packets are deleted and transmit the input data.

The above-described blocks may be omitted or replaced by blocks having similar or identical functions.

FIG. 4 illustrates an input formatting module according to another embodiment of the present invention.

Specifically, FIG. 4 illustrates a stream adaptation module of the input formatting module when the input signal corresponds to multiple input streams.

The stream adaptation module of the input formatting module when the input signal corresponds to multiple input streams can include a scheduler 4000, a 1-frame delay block 4100, an in-band signaling or padding insertion block 4200, a physical layer signaling generation block 4300 and a BB scrambler block 4400. Description will be given of each block of the stream adaptation module.

The scheduler 4000 can perform scheduling for a MIMO system using multiple antennas having dual polarity. In addition, the scheduler 4000 can generate parameters for use in signal processing blocks for antenna paths, such as a bit-to-cell demux block, a cell interleaver block, a time interleaver block, etc. included in the coding & modulation module illustrated in FIG. 1.

The 1-frame delay block 4100 can delay the input data by one transmission frame such that scheduling information about the next frame can be transmitted through the current frame for in-band signaling information to be inserted into the data pipes.

The in-band signaling or padding insertion block 4200 can insert undelayed physical layer signaling (PLS)-dynamic signaling information into the data delayed by one transmission frame. In this case, the in-band signaling or padding insertion block 4200 can insert a padding bit when a space for padding is present or insert in-band signaling information into the padding space. In addition, the scheduler 4000 can output physical layer signaling-dynamic signaling information about the current frame separately from in-band signaling information. Accordingly, a cell mapper, which will be described later, can map input cells according to scheduling information output from the scheduler 4000.

The physical layer signaling generation block 4300 can generate physical layer signaling data which will be transmitted through a preamble symbol of a transmission frame or spread and transmitted through a data symbol other than the in-band signaling information. In this case, the physical layer signaling data according to an embodiment of the present invention can be referred to as signaling information. Furthermore, the physical layer signaling data according to an embodiment of the present invention can be divided into PLS-pre information and PLS-post information. The PLS-pre information can include parameters necessary to encode the PLS-post information and static PLS signaling data and the PLS-post information can include parameters necessary to encode the data pipes. The parameters necessary to encode the data pipes can be classified into static PLS signaling data and dynamic PLS signaling data. The static PLS signaling data is a parameter commonly applicable to all frames included in a super-frame and can be changed on a super-frame basis. The dynamic PLS signaling data is a parameter differently applicable to respective frames included in a super-frame and can be changed on a frame-by-frame basis. Accordingly, the reception apparatus can acquire the PLS-post information by decoding the PLS-pre information and decode desired data pipes by decoding the PLS-post information.

The BB scrambler block 4400 can generate a pseudo-random binary sequence (PRBS) and perform an XOR operation on the PRBS and the input bit streams to decrease the peak-to-average power ratio (PAPR) of the output signal of the waveform generation block. As shown in FIG. 4, scrambling of the BB scrambler block 4400 is applicable to both data pipes and physical layer signaling information.

The above-described blocks may be omitted or replaced by blocks having similar or identical functions according to designer.

As shown in FIG. 4, the stream adaptation module can finally output the data pipes to the coding & modulation module.

Figure 5:
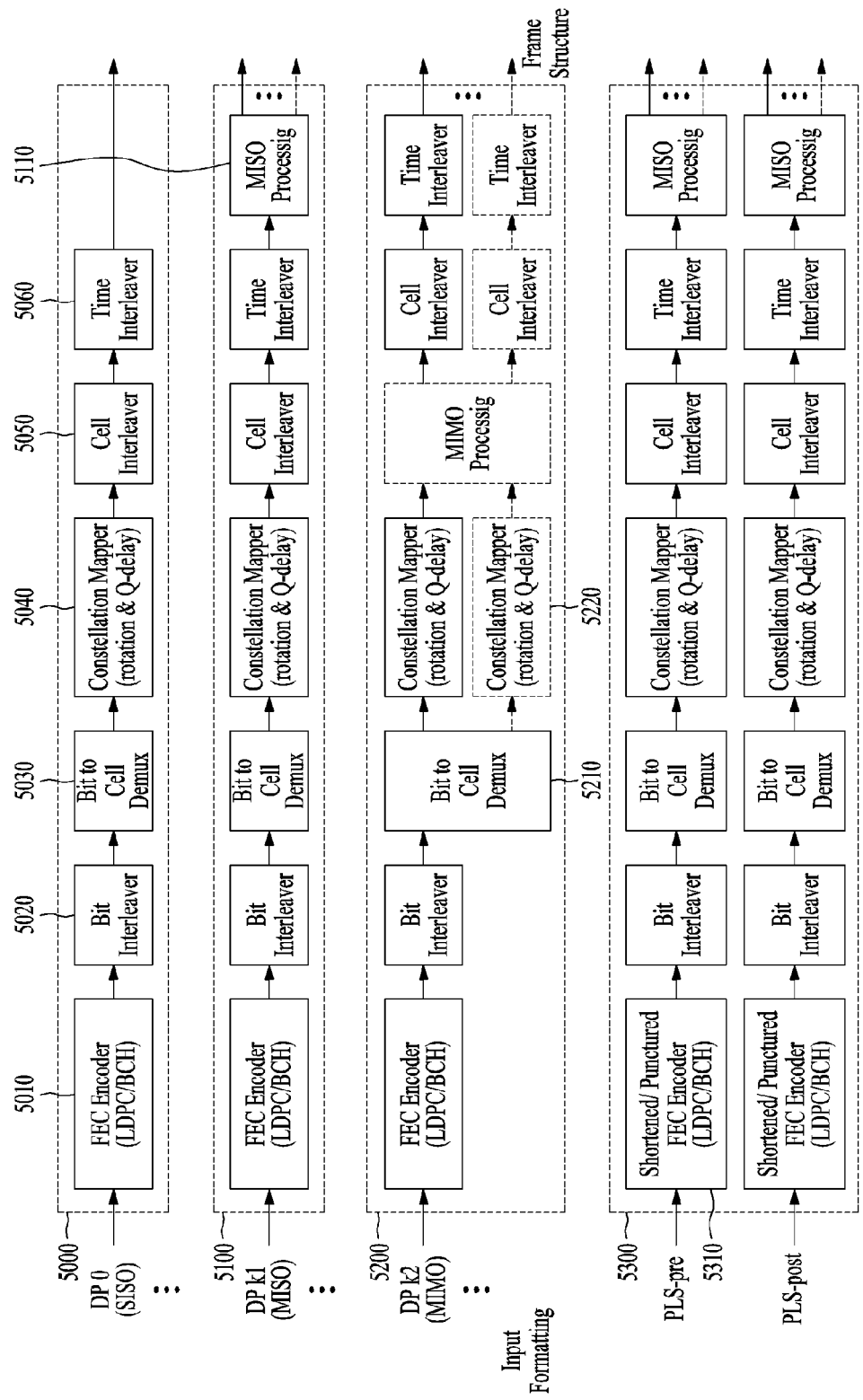
FIG. 5 illustrates a coding & modulation module according to an embodiment of the present invention.

FIG. 5 illustrates a coding & modulation module according to an embodiment of the present invention.

The coding & modulation module shown in FIG. 5 corresponds to an embodiment of the coding & modulation module illustrated in FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the coding & modulation module according to an embodiment of the present invention can independently process data pipes input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each data pipe.

Accordingly, the coding & modulation module according to an embodiment of the present invention can include a first block 5000 for SISO, a second block 5100 for MISO, a third block 5200 for MIMO and a fourth block 5300 for processing the PLS-pre/PLS-post information. The coding & modulation module illustrated in FIG. 5 is an exemplary and may include only the first block 5000 and the fourth block 5300, the second block 5100 and the fourth block 5300 or the third block 5200 and the fourth block 5300 according to design. That is, the coding & modulation module can include blocks for processing data pipes equally or differently according to design.

A description will be given of each block of the coding & modulation module.

The first block 5000 processes an input data pipe according to SISO and can include an FEC encoder block 5010, a bit interleaver block 5020, a bit-to-cell demux block 5030, a constellation mapper block 5040, a cell interleaver block 5050 and a time interleaver block 5060.

The FEC encoder block 5010 can perform BCH encoding and LDPC encoding on the input data pipe to add redundancy thereto such that the reception apparatus can correct an error generated on a transmission channel.

The bit interleaver block 5020 can interleave bit streams of the FEC-encoded data pipe according to an interleaving rule such that the bit streams have robustness against burst error that may be generated on the transmission channel. Accordingly, when deep fading or erasure is applied to QAM symbols, errors can be prevented from being generated in consecutive bits from among all codeword bits since interleaved bits are mapped to the QAM symbols.

The bit-to-cell demux block 5030 can determine the order of input bit streams such that each bit in an FEC block can be transmitted with appropriate robustness in consideration of both the order of input bit streams and a constellation mapping rule.

The constellation mapper block 5040 can map a bit word input thereto to one constellation. In this case, the constellation mapper block 5040 can additionally perform rotation & Q-delay. That is, the constellation mapper block 5040 can rotate input constellations according to a rotation angle, divide the constellations into an in-phase component and a quadrature-phase component and delay only the quadrature-phase component by an arbitrary value. Then, the constellation mapper block 5040 can remap the constellations to new constellations using a paired in-phase component and quadrature-phase component.

The cell interleaver block 5050 can randomly interleave cells corresponding to one FEC block and output the interleaved cells such that cells corresponding to respective FEC blocks can be output in different orders.

The time interleaver block 5060 can interleave cells belonging to a plurality of FEC blocks and output the interleaved cells. Accordingly, the cells corresponding to the FEC blocks are dispersed and transmitted in a period corresponding to a time interleaving depth and thus diversity gain can be obtained.

The second block 5100 processes an input data pipe according to MISO and can include the FEC encoder block, bit interleaver block, bit-to-cell demux block, constellation mapper block, cell interleaver block and time interleaver block in the same manner as the first block 5000. However, the second block 5100 is distinguished from the first block 5000 in that the second block 5100 further includes a MISO processing block 5110. The second block 5100 performs the same procedure including the input operation to the time interleaver operation as those of the first block 5000 and thus description of the corresponding blocks is omitted.

The MISO processing block 5110 can encode input cells according to a MISO encoding matrix providing transmit diversity and output MISO-processed data through two paths. MISO processing according to one embodiment of the present invention can include OSTBC (orthogonal space time block coding)/OSFBC (orthogonal space frequency block coding, Alamouti coding).

The third block 5200 processes an input data pipe according to MIMO and can include the FEC encoder block, bit interleaver block, bit-to-cell demux block, constellation mapper block, cell interleaver block and time interleaver block in the same manner as the second block 5100, as shown in FIG. 5. However, the data processing procedure of the third block 5200 is different from that of the second block 5100 since the third block 5200 includes a MIMO processing block 5220.

That is, in the third block 5200, basic roles of the FEC encoder block and the bit interleaver block are identical to those of the first and second blocks 5000 and 5100 although functions thereof may be different from those of the first and second blocks 5000 and 5100.

The bit-to-cell demux block 5210 can generate as many output bit streams as input bit streams of MIMO processing and output the output bit streams through MIMO paths for MIMO processing. In this case, the bit-to-cell demux block 5210 can be designed to optimize the decoding performance of the reception apparatus in consideration of characteristics of LDPC and MIMO processing.

Basic roles of the constellation mapper block, cell interleaver block and time interleaver block are identical to those of the first and second blocks 5000 and 5100 although functions thereof may be different from those of the first and second blocks 5000 and 5100. As shown in FIG. 5, as many constellation mapper blocks, cell interleaver blocks and time interleaver blocks as the number of MIMO paths for MIMO processing can be present. In this case, the constellation mapper blocks, cell interleaver blocks and time interleaver blocks can operate equally or independently for data input through the respective paths.

The MIMO processing block 5220 can perform MIMO processing on two input cells using a MIMO encoding matrix and output the MIMO-processed data through two paths. The MIMO encoding matrix according to an embodiment of the present invention can include spatial multiplexing, Golden code, full-rate full diversity code, linear dispersion code, etc.

The fourth block 5300 processes the PLS-pre/PLS-post information and can perform SISO or MISO processing.

The basic roles of the bit interleaver block, bit-to-cell demux block, constellation mapper block, cell interleaver block, time interleaver block and MISO processing block included in the fourth block 5300 correspond to those of the second block 5100 although functions thereof may be different from those of the second block 5100.

A shortened/punctured FEC encoder block 5310 included in the fourth block 5300 can process PLS data using an FEC encoding scheme for a PLS path provided for a case in which the length of input data is shorter than a length necessary to perform FEC encoding. Specifically, the shortened/punctured FEC encoder block 5310 can perform BCH encoding on input bit streams, pad Os corresponding to a desired input bit stream length necessary for normal LDPC encoding, carry out LDPC encoding and then remove the padded Os to puncture parity bits such that an effective code rate becomes equal to or lower than the data pipe rate.

The blocks included in the first block 5000 to fourth block 5300 may be omitted or replaced by blocks having similar or identical functions according to design.

As illustrated in FIG. 5, the coding & modulation module can output the data pipes (or DP data), PLS-pre information and PLS-post information processed for the respective paths to the frame structure module.

Figure 6:
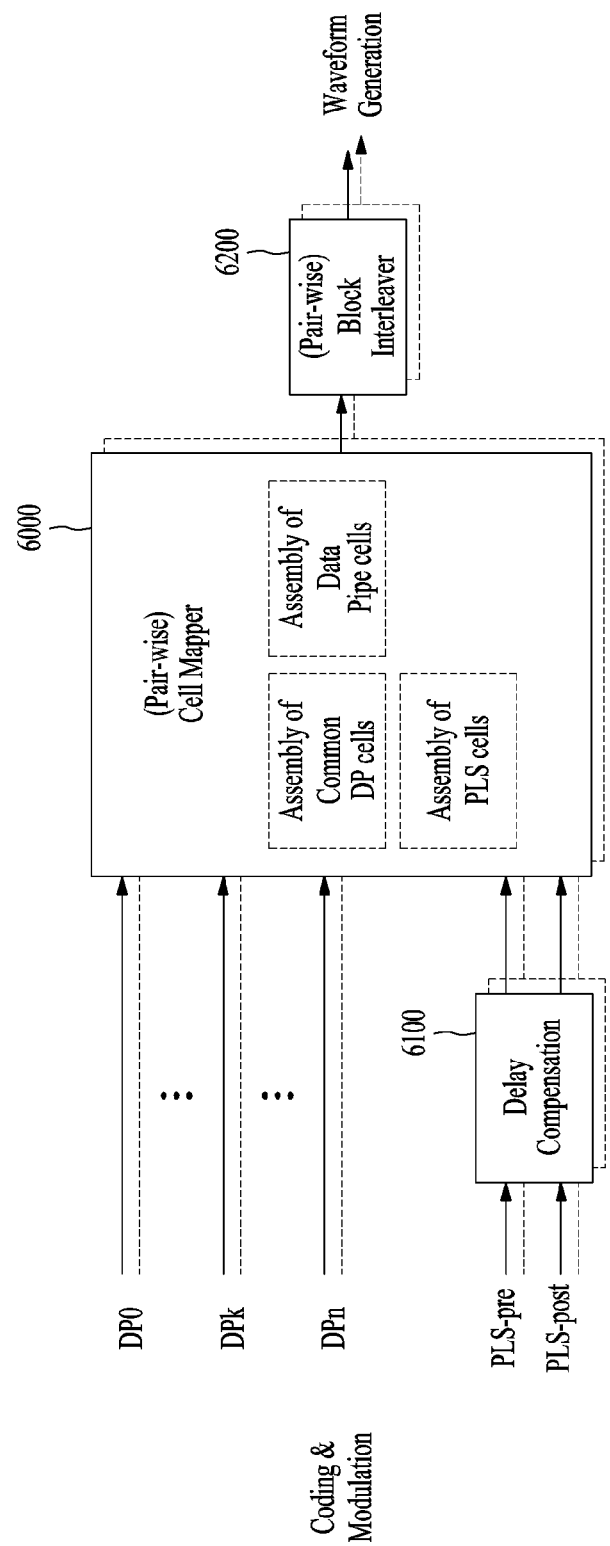
FIG. 6 illustrates a frame structure module according to an embodiment of the present invention.

FIG. 6 illustrates a frame structure module according to one embodiment of the present invention.

The frame structure module shown in FIG. 6 corresponds to an embodiment of the frame structure module 1200 illustrated in FIG. 1.

The frame structure module according to one embodiment of the present invention can include at least one cell-mapper 6000, at least one delay compensation module 6100 and at least one block interleaver 6200. The number of cell mappers 6000, delay compensation modules 6100 and block interleavers 6200 can be changed. A description will be given of each module of the frame structure block.

The cell-mapper 6000 can allocate cells corresponding to SISO-, MISO- or MIMO-processed data pipes output from the coding & modulation module, cells corresponding to common data commonly applicable to the data pipes and cells corresponding to the PLS-pre/PLS-post information to signal frames according to scheduling information. The common data refers to signaling information commonly applied to all or some data pipes and can be transmitted through a specific data pipe. The data pipe through which the common data is transmitted can be referred to as a common data pipe and can be changed according to design.

When the apparatus for transmitting broadcast signals according to an embodiment of the present invention uses two output antennas and Alamouti coding is used for MISO processing, the cell-mapper 6000 can perform pair-wise cell mapping in order to maintain orthogonality according to Alamouti encoding. That is, the cell-mapper 6000 can process two consecutive cells of the input cells as one unit and map the unit to a frame. Accordingly, paired cells in an input path corresponding to an output path of each antenna can be allocated to neighboring positions in a transmission frame.

The delay compensation block 6100 can obtain PLS data corresponding to the current transmission frame by delaying input PLS data cells for the next transmission frame by one frame. In this case, the PLS data corresponding to the current frame can be transmitted through a preamble part in the current signal frame and PLS data corresponding to the next signal frame can be transmitted through a preamble part in the current signal frame or in-band signaling in each data pipe of the current signal frame. This can be changed by the designer.

The block interleaver 6200 can obtain additional diversity gain by interleaving cells in a transport block corresponding to the unit of a signal frame. In addition, the block interleaver 6200 can perform interleaving by processing two consecutive cells of the input cells as one unit when the above-described pair-wise cell mapping is performed. Accordingly, cells output from the block interleaver 6200 can be two consecutive identical cells.

When pair-wise mapping and pair-wise interleaving are performed, at least one cell mapper and at least one block interleaver can operate equally or independently for data input through the paths.

The above-described blocks may be omitted or replaced by blocks having similar or identical functions according to design.

Figure 7:
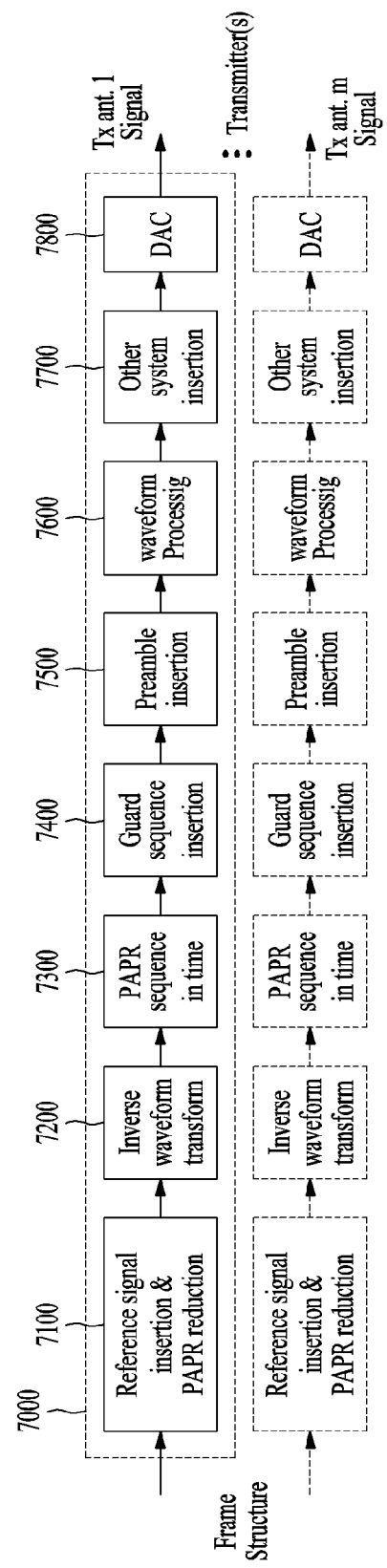
FIG. 7 illustrates a waveform generation module according to an embodiment of the present invention.

FIG. 7 illustrates a waveform generation module according to an embodiment of the present invention.

The waveform generation module illustrated in FIG. 7 corresponds to an embodiment of the waveform generation module 1300 described with reference to FIG. 1.

The waveform generation module according to an embodiment of the present invention can modulate and transmit as many signal frames as the number of antennas for receiving and outputting signal frames output from the frame structure module illustrated in FIG. 6.

Specifically, the waveform generation module illustrated in FIG. 7 is an embodiment of a waveform generation module of an apparatus for transmitting broadcast signals using m Tx antennas and can include m processing blocks for modulating and outputting frames corresponding to m paths. The m processing blocks can perform the same processing procedure. A description will be given of operation of the first processing block 7000 from among the m processing blocks.

The first processing block 7000 can include a reference signal & PAPR reduction block 7100, an inverse waveform transform block 7200, a PAPR reduction in time block 7300, a guard sequence insertion block 7400, a preamble insertion block 7500, a waveform processing block 7600, other system insertion block 7700 and a DAC (digital analog converter) block 7800.

The reference signal insertion & PAPR reduction block 7100 can insert a reference signal into a predetermined position of each signal block and apply a PAPR reduction scheme to reduce a PAPR in the time domain. If a broadcast transmission/reception system according to an embodiment of the present invention corresponds to an OFDM system, the reference signal insertion & PAPR reduction block 7100 can use a method of reserving some active subcarriers rather than using the same. In addition, the reference signal insertion & PAPR reduction block 7100 may not use the PAPR reduction scheme as an optional feature according to broadcast transmission/reception system.

The inverse waveform transform block 7200 can transform an input signal in a manner of improving transmission efficiency and flexibility in consideration of transmission channel characteristics and system architecture. If the broadcast transmission/reception system according to an embodiment of the present invention corresponds to an OFDM system, the inverse waveform transform block 7200 can employ a method of transforming a frequency domain signal into a time domain signal through inverse FFT operation. If the broadcast transmission/reception system according to an embodiment of the present invention corresponds to a single carrier system, the inverse waveform transform block 7200 may not be used in the waveform generation module.

The PAPR reduction in time block 7300 can use a method for reducing PAPR of an input signal in the time domain. If the broadcast transmission/reception system according to an embodiment of the present invention corresponds to an OFDM system, the PAPR reduction in time block 7300 may use a method of simply clipping peak amplitude. Furthermore, the PAPR reduction in time block 7300 may not be used in the broadcast transmission/reception system according to an embodiment of the present invention since it is an optional feature.

The guard sequence insertion block 7400 can provide a guard interval between neighboring signal blocks and insert a specific sequence into the guard interval as necessary in order to minimize the influence of delay spread of a transmission channel. Accordingly, the reception apparatus can easily perform synchronization or channel estimation. If the broadcast transmission/reception system according to an embodiment of the present invention corresponds to an OFDM system, the guard sequence insertion block 7400 may insert a cyclic prefix into a guard interval of an OFDM symbol.

The preamble insertion block 7500 can insert a signal of a known type (e.g. the preamble or preamble symbol) agreed upon between the transmission apparatus and the reception apparatus into a transmission signal such that the reception apparatus can rapidly and efficiently detect a target system signal. If the broadcast transmission/reception system according to an embodiment of the present invention corresponds to an OFDM system, the preamble insertion block 7500 can define a signal frame composed of a plurality of OFDM symbols and insert a preamble symbol into the beginning of each signal frame. That is, the preamble carries basic PLS data and is located in the beginning of a signal frame.

The waveform processing block 7600 can perform waveform processing on an input baseband signal such that the input baseband signal meets channel transmission characteristics. The waveform processing block 7600 may use a method of performing square-root-raised cosine (SRRC) filtering to obtain a standard for out-of-band emission of a transmission signal. If the broadcast transmission/reception system according to an embodiment of the present invention corresponds to a multi-carrier system, the waveform processing block 7600 may not be used.

The other system insertion block 7700 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 7800 can convert an input digital signal into an analog signal and output the analog signal. The signal output from the DAC block 7800 can be transmitted through m output antennas. A Tx antenna according to an embodiment of the present invention can have vertical or horizontal polarity.

The above-described blocks may be omitted or replaced by blocks having similar or identical functions according to design.

Figure 8:
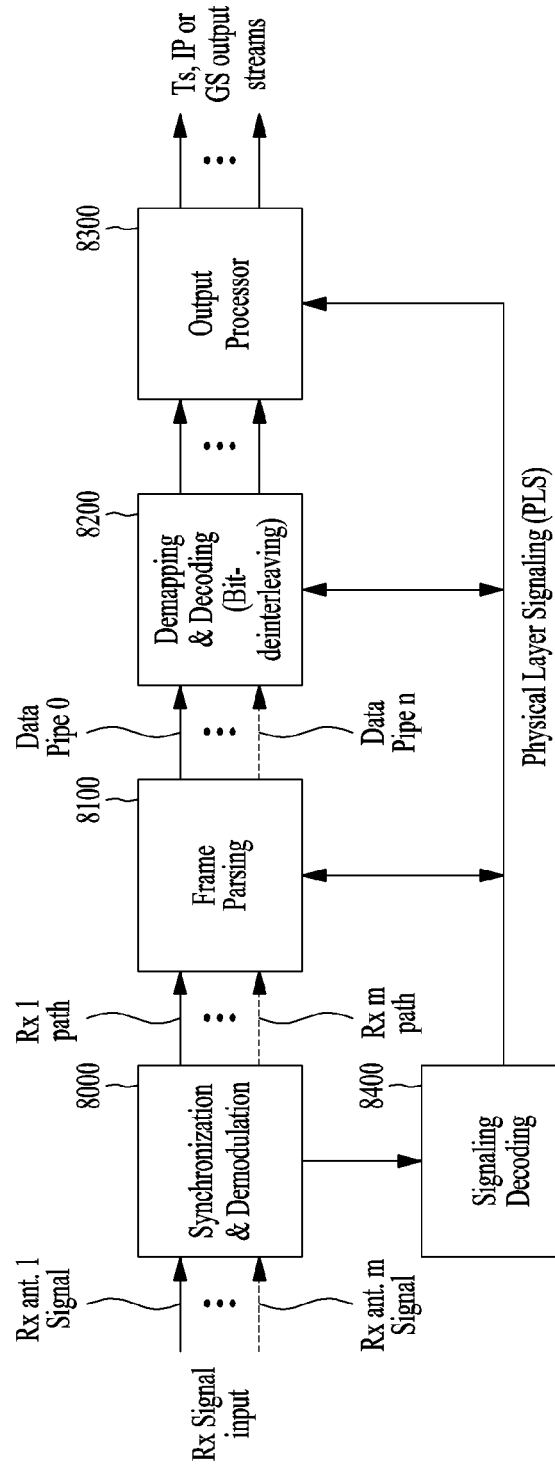
FIG. 8 illustrates a structure of an apparatus for receiving broadcast signals for future broadcast services according to an embodiment of the present invention.

FIG. 8 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1. The apparatus for receiving broadcast signals for future broadcast services according to an embodiment of the present invention can include a synchronization & demodulation module 8000, a frame parsing module 8100, a demapping & decoding module 8200, an output processor 8300 and a signaling decoding module 8400. A description will be given of operation of each module of the apparatus for receiving broadcast signals.

The synchronization & demodulation module 8000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 8100 can parse input signal frames and extract data through which a service selected by a user is transmitted. If the apparatus for transmitting broadcast signals performs interleaving, the frame parsing module 8100 can carry out deinterleaving corresponding to a reverse procedure of interleaving. In this case, the positions of a signal and data that need to be extracted can be obtained by decoding data output from the signaling decoding module 8400 to restore scheduling information generated by the apparatus for transmitting broadcast signals.

The demapping & decoding module 8200 can convert the input signals into bit domain data and then deinterleave the same as necessary. The demapping & decoding module 8200 can perform demapping for mapping applied for transmission efficiency and correct an error generated on a transmission channel through decoding. In this case, the demapping & decoding module 8200 can obtain transmission parameters necessary for demapping and decoding by decoding the data output from the signaling decoding module 8400.

The output processor 8300 can perform reverse procedures of various compression/signal processing procedures which are applied by the apparatus for transmitting broadcast signals to improve transmission efficiency. In this case, the output processor 8300 can acquire necessary control information from data output from the signaling decoding module 8400. The output of the output processor 8300 corresponds to a signal input to the apparatus for transmitting broadcast signals and may be MPEG-TSs, IP streams (v4 or v6) and generic streams.

The signaling decoding module 8400 can obtain PLS information from the signal demodulated by the synchronization & demodulation module 8000. As described above, the frame parsing module 8100, demapping & decoding module 8200 and output processor 8300 can execute functions thereof using the data output from the signaling decoding module 8400.

Figure 9:
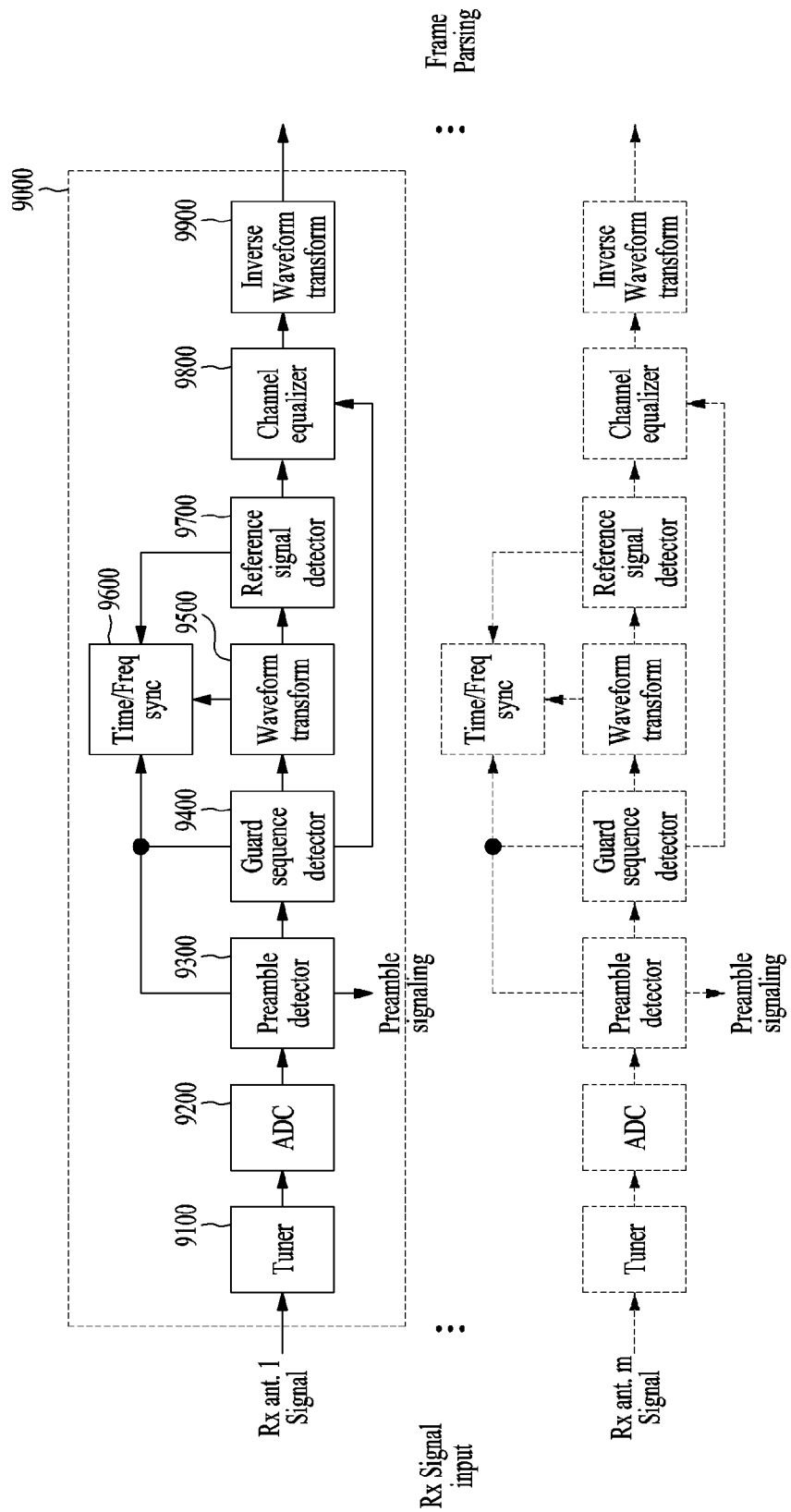
FIG. 9 illustrates a synchronization & demodulation module according to an embodiment of the present invention.

FIG. 9 illustrates a synchronization & demodulation module according to an embodiment of the present invention.

The synchronization & demodulation module shown in FIG. 9 corresponds to an embodiment of the synchronization & demodulation module described with reference to FIG. 8. The synchronization & demodulation module shown in FIG. 9 can perform a reverse operation of the operation of the waveform generation module illustrated in FIG. 7.

As shown in FIG. 9, the synchronization & demodulation module according to an embodiment of the present invention corresponds to a synchronization & demodulation module of an apparatus for receiving broadcast signals using m Rx antennas and can include m processing blocks for demodulating signals respectively input through m paths. The m processing blocks can perform the same processing procedure. A description will be given of operation of the first processing block 9000 from among the m processing blocks.

The first processing block 9000 can include a tuner 9100, an ADC block 9200, a preamble detector 9300, a guard sequence detector 9400, a waveform transform block 9500, a time/frequency synchronization block 9600, a reference signal detector 9700, a channel equalizer 9800 and an inverse waveform transform block 9900.

The tuner 9100 can select a desired frequency band, compensate for the magnitude of a received signal and output the compensated signal to the ADC block 9200.

The ADC block 9200 can convert the signal output from the tuner 9100 into a digital signal.

The preamble detector 9300 can detect a preamble (or preamble signal or preamble symbol) in order to check whether or not the digital signal is a signal of the system corresponding to the apparatus for receiving broadcast signals. In this case, the preamble detector 9300 can decode basic transmission parameters received through the preamble.

The guard sequence detector 9400 can detect a guard sequence in the digital signal. The time/frequency synchronization block 9600 can perform time/frequency synchronization using the detected guard sequence and the channel equalizer 9800 can estimate a channel through a received/restored sequence using the detected guard sequence.

The waveform transform block 9500 can perform a reverse operation of inverse waveform transform when the apparatus for transmitting broadcast signals has performed inverse waveform transform. When the broadcast transmission/reception system according to one embodiment of the present invention is a multi-carrier system, the waveform transform block 9500 can perform FFT. Furthermore, when the broadcast transmission/reception system according to an embodiment of the present invention is a single carrier system, the waveform transform block 9500 may not be used if a received time domain signal is processed in the frequency domain or processed in the time domain.

The time/frequency synchronization block 9600 can receive output data of the preamble detector 9300, guard sequence detector 9400 and reference signal detector 9700 and perform time synchronization and carrier frequency synchronization including guard sequence detection and block window positioning on a detected signal. Here, the time/frequency synchronization block 9600 can feed back the output signal of the waveform transform block 9500 for frequency synchronization.

The reference signal detector 9700 can detect a received reference signal. Accordingly, the apparatus for receiving broadcast signals according to an embodiment of the present invention can perform synchronization or channel estimation.

The channel equalizer 9800 can estimate a transmission channel from each Tx antenna to each Rx antenna from the guard sequence or reference signal and perform channel equalization for received data using the estimated channel.

The inverse waveform transform block 9900 may restore the original received data domain when the waveform transform block 9500 performs waveform transform for efficient synchronization and channel estimation/equalization. If the broadcast transmission/reception system according to an embodiment of the present invention is a single carrier system, the waveform transform block 9500 can perform FFT in order to carry out synchronization/channel estimation/equalization in the frequency domain and the inverse waveform transform block 9900 can perform IFFT on the channel-equalized signal to restore transmitted data symbols. If the broadcast transmission/reception system according to an embodiment of the present invention is a multi-carrier system, the inverse waveform transform block 9900 may not be used.

The above-described blocks may be omitted or replaced by blocks having similar or identical functions according to design.

Figure 10:
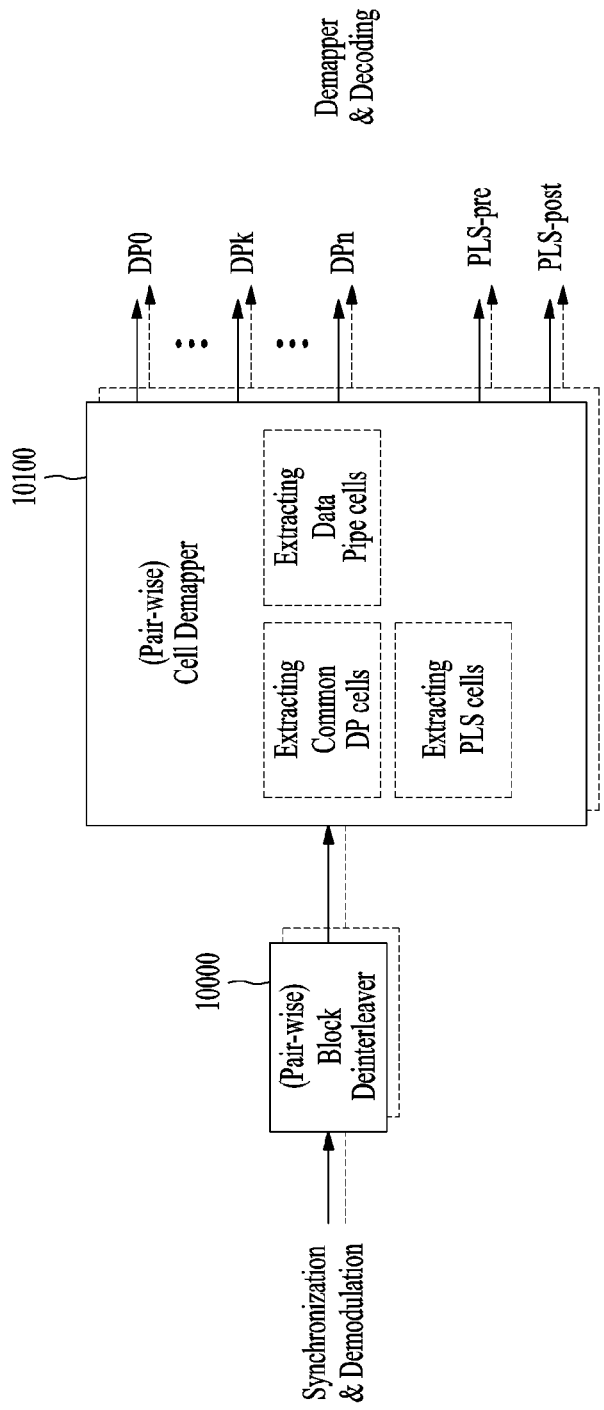
FIG. 10 illustrates a frame parsing module according to an embodiment of the present invention.

FIG. 10 illustrates a frame parsing module according to an embodiment of the present invention.

The frame parsing module illustrated in FIG. 10 corresponds to an embodiment of the frame parsing module described with reference to FIG. 8. The frame parsing module shown in FIG. 10 can perform a reverse operation of the operation of the frame structure module illustrated in FIG. 6.

As illustrated in FIG. 10, the frame parsing module according to an embodiment of the present invention may include at least one block deinterleaver 10000 and at least one cell demapper 10100.

The block deinterleaver 10000 may deinterleave data input through each data path of m Rx antennas and processed by a synchronization & demodulation module, on a signal block basis. In this case, as described above in relation to FIG. 8, if pair-wise interleaving has been performed by the transmitter, the block deinterleaver 10000 may process two contiguous data of each input path, as a pair. Accordingly, the block deinterleaver 10000 may output two contiguous output data even when deinterleaving is performed. In addition, the block deinterleaver 10000 may perform an inverse process of the interleaving process performed by the transmitter, to output data in original order.

The cell demapper 10100 can extract cells corresponding to common data, cells corresponding to data pipes and cells corresponding to PLS data from received signal frames. The cell demapper 10100 can merge data distributed and transmitted and output the same as a stream as necessary. When two consecutive pieces of cell input data are processed as a pair and mapped in the apparatus for transmitting broadcast signals, as shown in FIG. 6, the cell demapper 10100 can perform pair-wise cell demapping for processing two consecutive input cells as one unit as a reverse procedure of the mapping operation of the apparatus for transmitting broadcast signals.

In addition, the cell demapper 10100 can extract PLS signaling data received through the current frame as PLS-pre & PLS-post data and output the PLS-pre & PLS-post data.

The above-described blocks may be omitted or replaced by blocks having similar or identical functions according to design.

Figure 11:
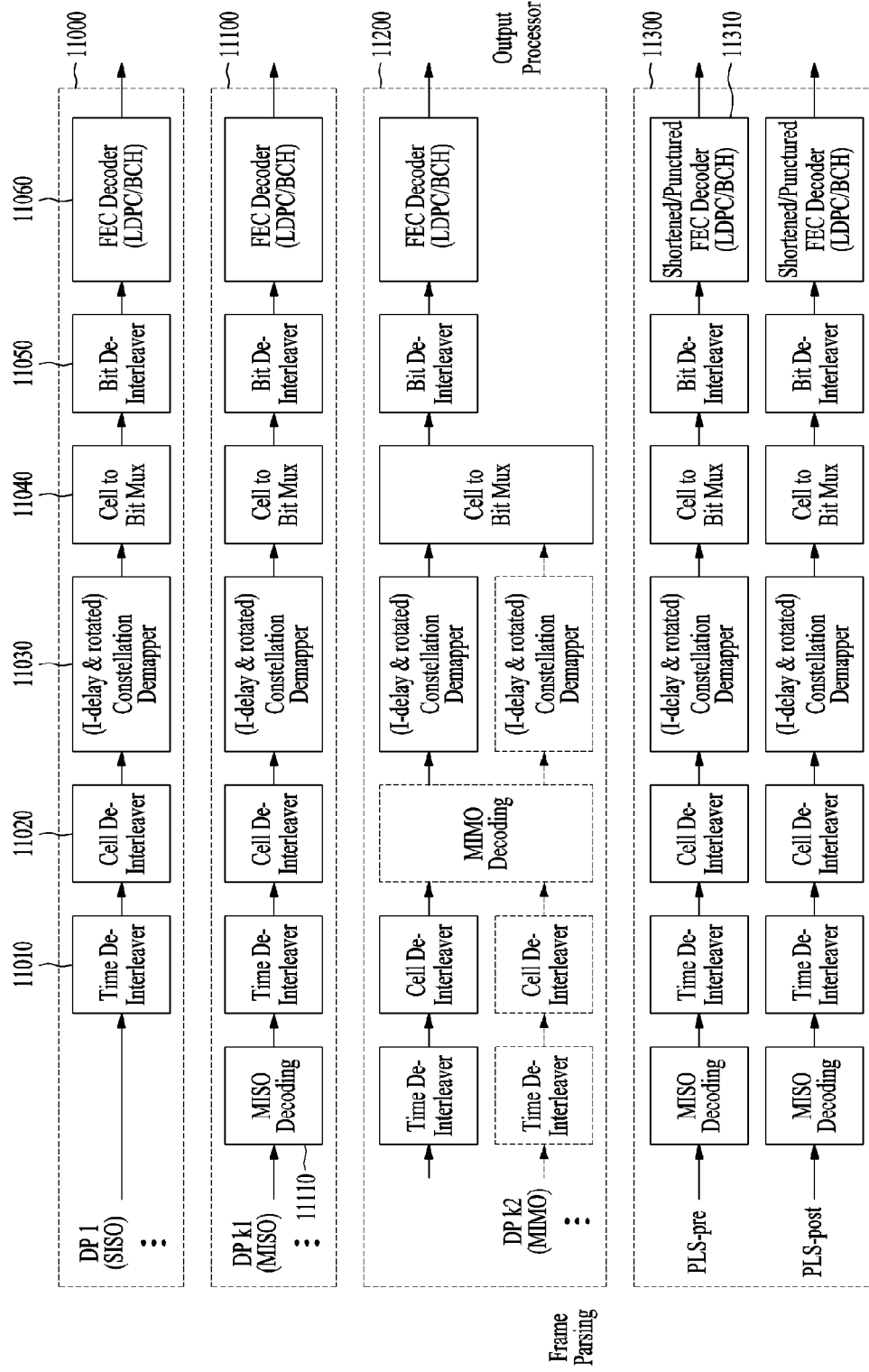
FIG. 11 illustrates a demapping & decoding module according to an embodiment of the present invention.

FIG. 11 illustrates a demapping & decoding module according to an embodiment of the present invention.

The demapping & decoding module shown in FIG. 11 corresponds to an embodiment of the demapping & decoding module illustrated in FIG. 8. The demapping & decoding module shown in FIG. 11 can perform a reverse operation of the operation of the coding & modulation module illustrated in FIG. 5.

The coding & modulation module of the apparatus for transmitting broadcast signals according to an embodiment of the present invention can process input data pipes by independently applying SISO, MISO and MIMO thereto for respective paths, as described above. Accordingly, the demapping & decoding module illustrated in FIG. 11 can include blocks for processing data output from the frame parsing module according to SISO, MISO and MIMO in response to the apparatus for transmitting broadcast signals.

As shown in FIG. 11, the demapping & decoding module according to an embodiment of the present invention can include a first block 11000 for SISO, a second block 11100 for MISO, a third block 11200 for MIMO and a fourth block 11300 for processing the PLS-pre/PLS-post information. The demapping & decoding module shown in FIG. 11 is exemplary and may include only the first block 11000 and the fourth block 11300, only the second block 11100 and the fourth block 11300 or only the third block 11200 and the fourth block 11300 according to design. That is, the demapping & decoding module can include blocks for processing data pipes equally or differently according to design.

A description will be given of each block of the demapping & decoding module.

The first block 11000 processes an input data pipe according to SISO and can include a time deinterleaver block 11010, a cell deinterleaver block 11020, a constellation demapper block 11030, a cell-to-bit mux block 11040, a bit deinterleaver block 11050 and an FEC decoder block 11060.

The time deinterleaver block 11010 can perform a reverse process of the process performed by the time interleaver block 5060 illustrated in FIG. 5. That is, the time deinterleaver block 11010 can deinterleave input symbols interleaved in the time domain into original positions thereof.

The cell deinterleaver block 11020 can perform a reverse process of the process performed by the cell interleaver block 5050 illustrated in FIG. 5. That is, the cell deinterleaver block 11020 can deinterleave positions of cells spread in one FEC block into original positions thereof.

The constellation demapper block 11030 can perform a reverse process of the process performed by the constellation mapper block 5040 illustrated in FIG. 5. That is, the constellation demapper block 11030 can demap a symbol domain input signal to bit domain data. In addition, the constellation demapper block 11030 may perform hard decision and output decided bit data. Furthermore, the constellation demapper block 11030 may output a log-likelihood ratio (LLR) of each bit, which corresponds to a soft decision value or probability value. If the apparatus for transmitting broadcast signals applies a rotated constellation in order to obtain additional diversity gain, the constellation demapper block 11030 can perform 2-dimensional LLR demapping corresponding to the rotated constellation. Here, the constellation demapper block 11030 can calculate the LLR such that a delay applied by the apparatus for transmitting broadcast signals to the I or Q component can be compensated.

The cell-to-bit mux block 11040 can perform a reverse process of the process performed by the bit-to-cell demux block 5030 illustrated in FIG. 5. That is, the cell-to-bit mux block 11040 can restore bit data mapped by the bit-to-cell demux block 5030 to the original bit streams.

The bit deinterleaver block 11050 can perform a reverse process of the process performed by the bit interleaver 5020 illustrated in FIG. 5. That is, the bit deinterleaver block 11050 can deinterleave the bit streams output from the cell-to-bit mux block 11040 in the original order.

The FEC decoder block 11060 can perform a reverse process of the process performed by the FEC encoder block 5010 illustrated in FIG. 5. That is, the FEC decoder block 11060 can correct an error generated on a transmission channel by performing LDPC decoding and BCH decoding.

The second block 11100 processes an input data pipe according to MISO and can include the time deinterleaver block, cell deinterleaver block, constellation demapper block, cell-to-bit mux block, bit deinterleaver block and FEC decoder block in the same manner as the first block 11000, as shown in FIG. 11. However, the second block 11100 is distinguished from the first block 11000 in that the second block 11100 further includes a MISO decoding block 11110. The second block 11100 performs the same procedure including time deinterleaving operation to outputting operation as the first block 11000 and thus description of the corresponding blocks is omitted.

The MISO decoding block 11110 can perform a reverse operation of the operation of the MISO processing block 5110 illustrated in FIG. 5. If the broadcast transmission/reception system according to an embodiment of the present invention uses STBC, the MISO decoding block 11110 can perform Alamouti decoding.

The third block 11200 processes an input data pipe according to MIMO and can include the time deinterleaver block, cell deinterleaver block, constellation demapper block, cell-to-bit mux block, bit deinterleaver block and FEC decoder block in the same manner as the second block 11100, as shown in FIG. 11. However, the third block 11200 is distinguished from the second block 11100 in that the third block 11200 further includes a MIMO decoding block 11210. The basic roles of the time deinterleaver block, cell deinterleaver block, constellation demapper block, cell-to-bit mux block and bit deinterleaver block included in the third block 11200 are identical to those of the corresponding blocks included in the first and second blocks 11000 and 11100 although functions thereof may be different from the first and second blocks 11000 and 11100.

The MIMO decoding block 11210 can receive output data of the cell deinterleaver for input signals of the m Rx antennas and perform MIMO decoding as a reverse operation of the operation of the MIMO processing block 5220 illustrated in FIG. 5. The MIMO decoding block 11210 can perform maximum likelihood decoding to obtain optimal decoding performance or carry out sphere decoding with reduced complexity. Otherwise, the MIMO decoding block 11210 can achieve improved decoding performance by performing MMSE detection or carrying out iterative decoding with MMSE detection.

The fourth block 11300 processes the PLS-pre/PLS-post information and can perform SISO or MISO decoding. The fourth block 11300 can carry out a reverse process of the process performed by the fourth block 5300 described with reference to FIG. 5.

The basic roles of the time deinterleaver block, cell deinterleaver block, constellation demapper block, cell-to-bit mux block and bit deinterleaver block included in the fourth block 11300 are identical to those of the corresponding blocks of the first, second and third blocks 11000, 11100 and 11200 although functions thereof may be different from the first, second and third blocks 11000, 11100 and 11200.

The shortened/punctured FEC decoder 11310 included in the fourth block 11300 can perform a reverse process of the process performed by the shortened/punctured FEC encoder block 5310 described with reference to FIG. 5. That is, the shortened/punctured FEC decoder 11310 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 11.

Figure 12:
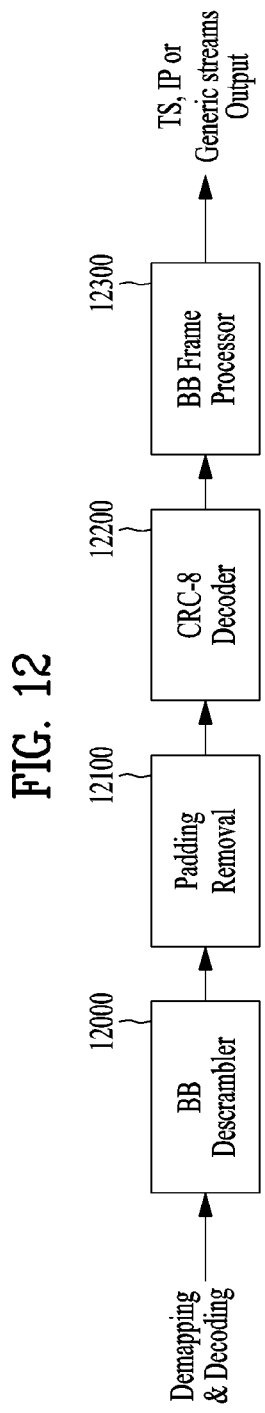
FIG. 12 illustrates an output processor according to an embodiment of the present invention.
Figure 13:
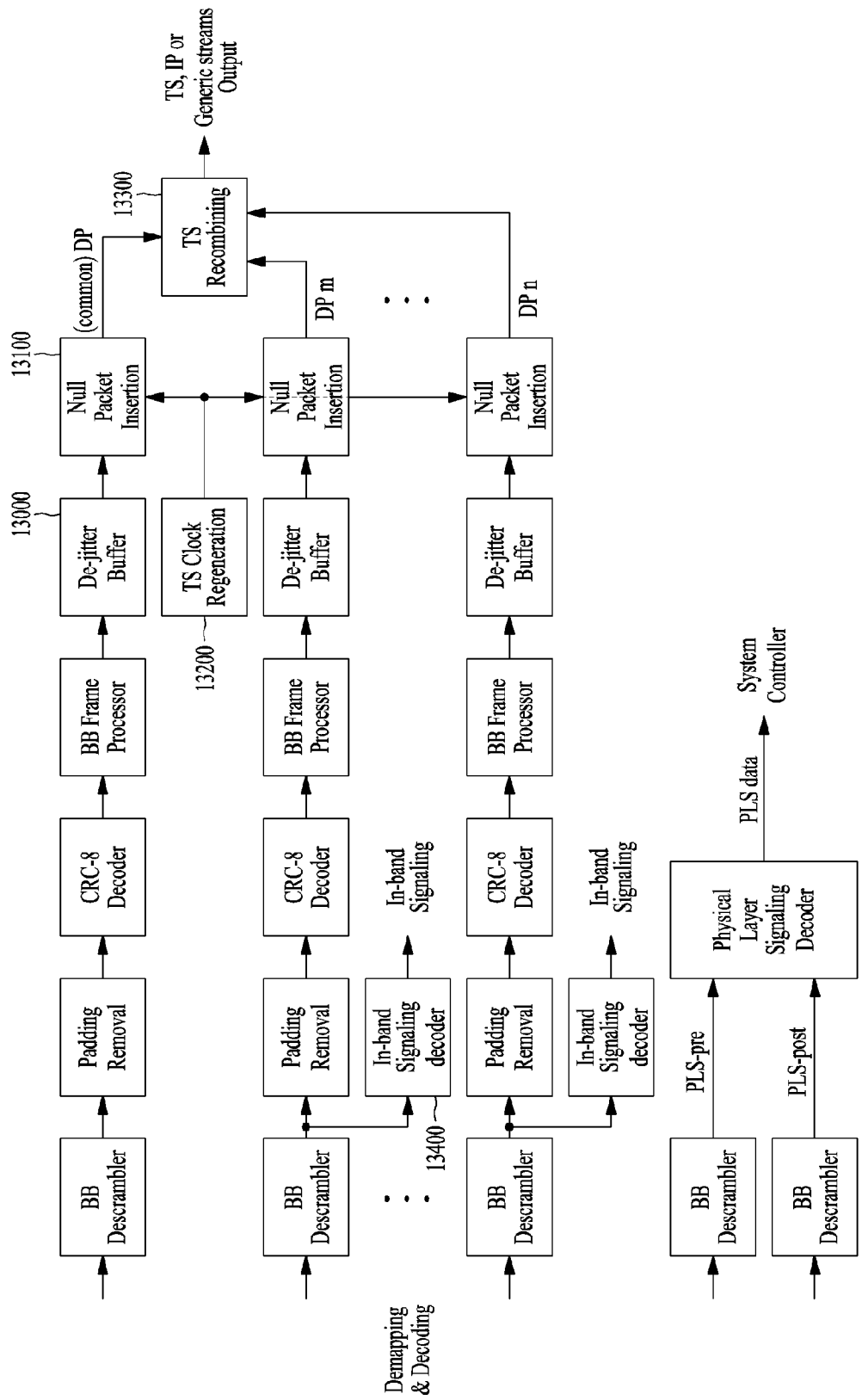
FIG. 13 illustrates an output processor according to another embodiment of the present invention.

FIGS. 12 and 13 illustrate output processors according to embodiments of the present invention.

FIG. 12 illustrates an output processor according to an embodiment of the present invention.

The output processor illustrated in FIG. 12 corresponds to an embodiment of the output processor illustrated in FIG. 8. The output processor illustrated in FIG. 12 receives a single data pipe output from the demapping & decoding module and outputs a single output stream. The output processor can perform a reverse operation of the operation of the input formatting module illustrated in FIG. 2.

The output processor shown in FIG. 12 can include a BB scrambler block 12000, a padding removal block 12100, a CRC-8 decoder block 12200 and a BB frame processor block 12300.

The BB scrambler block 12000 can descramble an input bit stream by generating the same PRBS as that used in the apparatus for transmitting broadcast signals for the input bit stream and carrying out an XOR operation on the PRBS and the bit stream.

The padding removal block 12100 can remove padding bits inserted by the apparatus for transmitting broadcast signals as necessary.

The CRC-8 decoder block 12200 can check a block error by performing CRC decoding on the bit stream received from the padding removal block 12100.

The BB frame processor block 12300 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 13 illustrates an output processor according to another embodiment of the present invention.

The output processor shown in FIG. 13 corresponds to an embodiment of the output processor illustrated in FIG. 8. The output processor shown in FIG. 13 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor shown in FIG. 13 can include a BB descrambler block, a padding removal block, a CRC-8 decoder block and a BB frame processor block as the output processor illustrated in FIG. 12. The basic roles of these blocks correspond to those of the blocks described with reference to FIG. 12 although operations thereof may differ from those of the blocks illustrated in FIG. 12.

A de-jitter buffer block 13000 included in the output processor shown in FIG. 13 can compensate for a delay, inserted by the apparatus for transmitting broadcast signals for synchronization of multiple data pipes, according to a restored TTO (time to output) parameter.

A null packet insertion block 13100 can restore a null packet removed from a stream with reference to a restored DNP (deleted null packet) and output common data.

A TS clock regeneration block 13200 can restore time synchronization of output packets based on ISCR (input stream time reference) information.

A TS recombining block 13300 can recombine the common data and data pipes related thereto, output from the null packet insertion block 13100, to restore the original MPEG-TSs, IP streams (v4 or v6) or generic streams. The TTO, DNT and ISCR information can be obtained through the BB frame header.

An in-band signaling decoding block 13400 can decode and output in-band physical layer signaling information transmitted through a padding bit field in each FEC frame of a data pipe.

The output processor shown in FIG. 13 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

Figure 14:
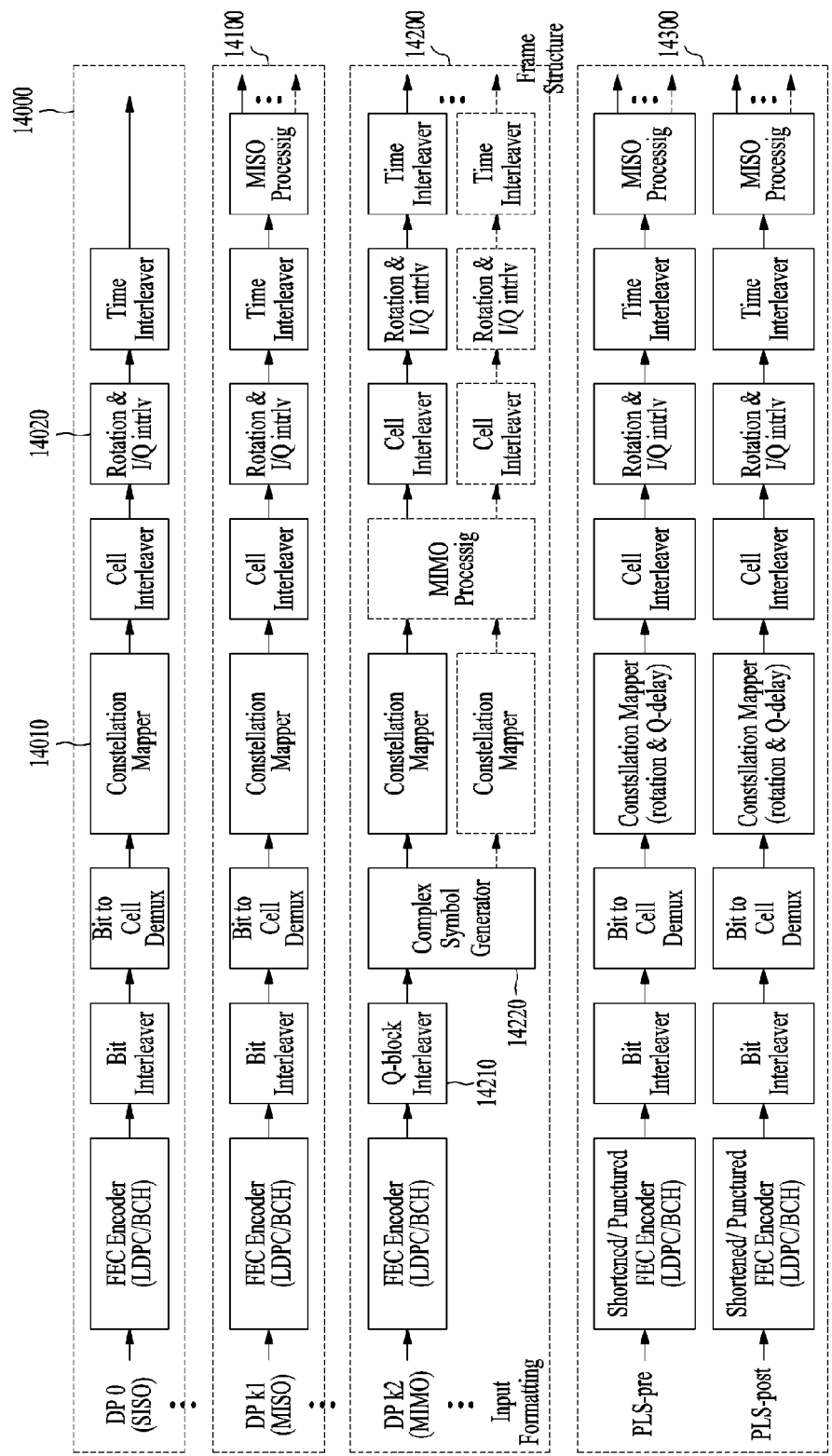
FIG. 14 illustrates a coding & modulation module according to another embodiment of the present invention.

FIG. 14 illustrates a coding & modulation module according to another embodiment of the present invention.

The coding & modulation module shown in FIG. 14 corresponds to another embodiment of the coding & modulation module illustrated in FIGS. 1 to 5.

To control QoS for each service or service component transmitted through each data pipe, as described above with reference to FIG. 5, the coding & modulation module shown in FIG. 14 can include a first block 14000 for SISO, a second block 14100 for MISO, a third block 14200 for MIMO and a fourth block 14300 for processing the PLS-pre/PLS-post information. In addition, the coding & modulation module can include blocks for processing data pipes equally or differently according to the design. The first to fourth blocks 14000 to 14300 shown in FIG. 14 are similar to the first to fourth blocks 5000 to 5300 illustrated in FIG. 5.

However, the first to fourth blocks 14000 to 14300 shown in FIG. 14 are distinguished from the first to fourth blocks 5000 to 5300 illustrated in FIG. 5 in that a constellation mapper 14010 included in the first to fourth blocks 14000 to 14300 has a function different from the first to fourth blocks 5000 to 5300 illustrated in FIG. 5, a rotation & I/Q interleaver block 14020 is present between the cell interleaver and the time interleaver of the first to fourth blocks 14000 to 14300 illustrated in FIG. 14 and the third block 14200 for MIMO has a configuration different from the third block 5200 for MIMO illustrated in FIG. 5. The following description focuses on these differences between the first to fourth blocks 14000 to 14300 shown in FIG. 14 and the first to fourth blocks 5000 to 5300 illustrated in FIG. 5.

The constellation mapper block 14010 shown in FIG. 14 can map an input bit word to a complex symbol. However, the constellation mapper block 14010 may not perform constellation rotation, differently from the constellation mapper block shown in FIG. 5. The constellation mapper block 14010 shown in FIG. 14 is commonly applicable to the first, second and third blocks 14000, 14100 and 14200, as described above.

The rotation & I/Q interleaver block 14020 can independently interleave in-phase and quadrature-phase components of each complex symbol of cell-interleaved data output from the cell interleaver and output the in-phase and quadrature-phase components on a symbol-by-symbol basis. The number of number of input data pieces and output data pieces of the rotation & I/Q interleaver block 14020 is two or more which can be changed by the designer. In addition, the rotation & I/Q interleaver block 14020 may not interleave the in-phase component.

The rotation & I/Q interleaver block 14020 is commonly applicable to the first to fourth blocks 14000 to 14300, as described above. In this case, whether or not the rotation & I/Q interleaver block 14020 is applied to the fourth block 14300 for processing the PLS-pre/post information can be signaled through the above-described preamble.

The third block 14200 for MIMO can include a Q-block interleaver block 14210 and a complex symbol generator block 14220, as illustrated in FIG. 14.

The Q-block interleaver block 14210 can permute a parity part of an FEC-encoded FEC block received from the FEC encoder. Accordingly, a parity part of an LDPC H matrix can be made into a cyclic structure like an information part. The Q-block interleaver block 14210 can permute the order of output bit blocks having Q size of the LDPC H matrix and then perform row-column block interleaving to generate final bit streams.

The complex symbol generator block 14220 receives the bit streams output from the Q-block interleaver block 14210, maps the bit streams to complex symbols and outputs the complex symbols. In this case, the complex symbol generator block 14220 can output the complex symbols through at least two paths. This can be modified by the designer.

The above-described blocks may be omitted or replaced by blocks having similar or identical functions according to design.

The coding & modulation module according to another embodiment of the present invention, illustrated in FIG. 14, can output data pipes, PLS-pre information and PLS-post information processed for respective paths to the frame structure module.

Figure 15:
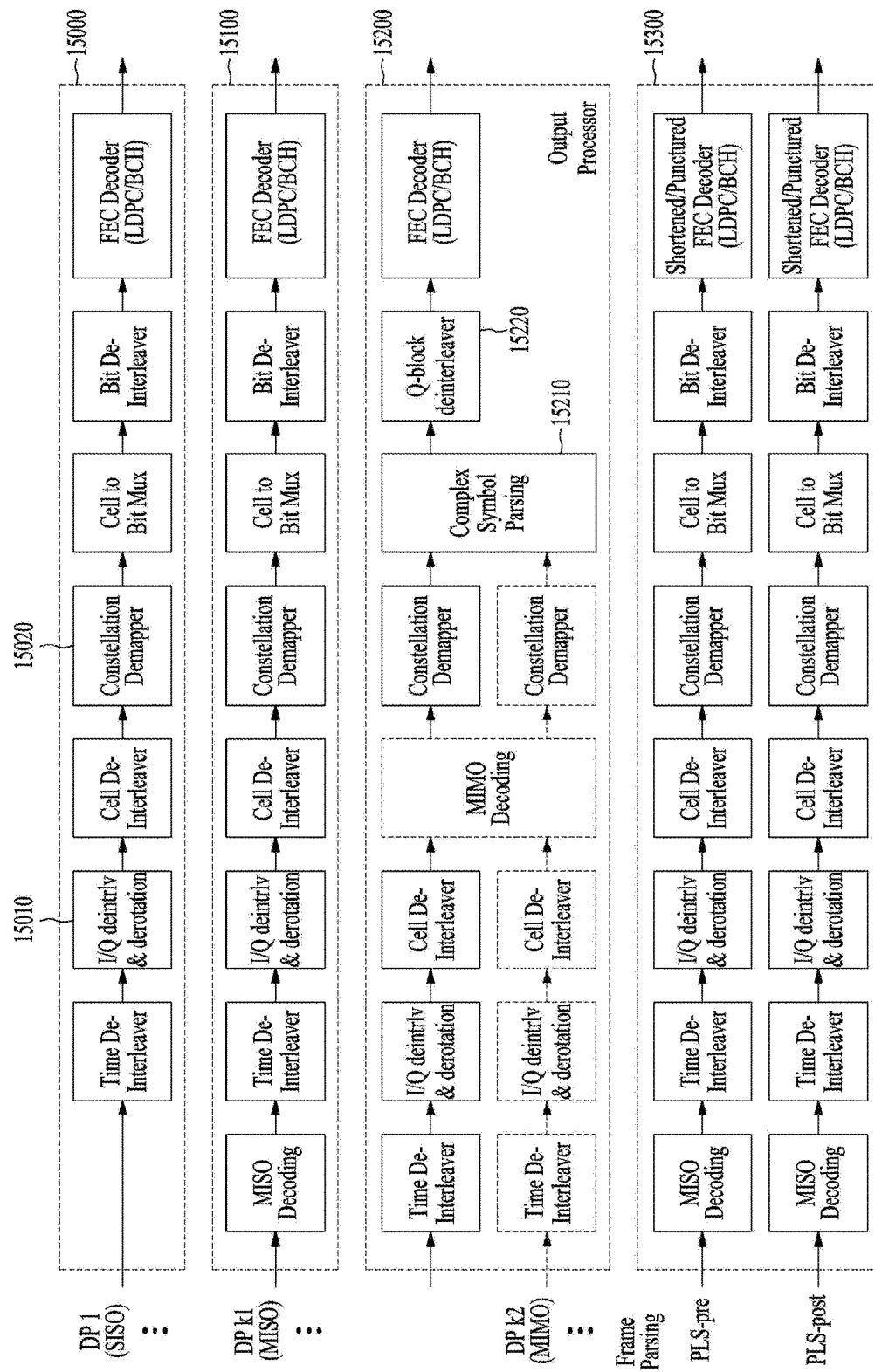
FIG. 15 illustrates a demapping & decoding module according to another embodiment of the present invention.

FIG. 15 illustrates a demapping & decoding module according to another embodiment of the present invention.

The demapping & decoding module shown in FIG. 15 corresponds to another embodiment of the demapping & decoding module illustrated in FIG. 11. The demapping & decoding module shown in FIG. 15 can perform a reverse operation of the operation of the coding & modulation module illustrated in FIG. 14.

As shown in FIG. 15, the demapping & decoding module according to another embodiment of the present invention can include a first block 15000 for SISO, a second block 11100 for MISO, a third block 15200 for MIMO and a fourth block 14300 for processing the PLS-pre/PLS-post information. In addition, the demapping & decoding module can include blocks for processing data pipes equally or differently according to design. The first to fourth blocks 15000 to 15300 shown in FIG. 15 are similar to the first to fourth blocks 11000 to 11300 illustrated in FIG. 11.

However, the first to fourth blocks 15000 to 15300 shown in FIG. 15 are distinguished from the first to fourth blocks 11000 to 11300 illustrated in FIG. 11 in that an I/Q deinterleaver and derotation block 15010 is present between the time interleaver and the cell deinterleaver of the first to fourth blocks 15000 to 15300, a constellation mapper 15010 included in the first to fourth blocks 15000 to 15300 has a function different from the first to fourth blocks 11000 to 11300 illustrated in FIG. 11 and the third block 15200 for MIMO has a configuration different from the third block 11200 for MIMO illustrated in FIG. 11. The following description focuses on these differences between the first to fourth blocks 15000 to 15300 shown in FIG. 15 and the first to fourth blocks 11000 to 11300 illustrated in FIG. 11.

The I/Q deinterleaver & derotation block 15010 can perform a reverse process of the process performed by the rotation & I/Q interleaver block 14020 illustrated in FIG. 14. That is, the I/Q deinterleaver & derotation block 15010 can deinterleave I and Q components I/Q-interleaved and transmitted by the apparatus for transmitting broadcast signals and derotate complex symbols having the restored I and Q components.

The I/Q deinterleaver & derotation block 15010 is commonly applicable to the first to fourth blocks 15000 to 15300, as described above. In this case, whether or not the I/Q deinterleaver & derotation block 15010 is applied to the fourth block 15300 for processing the PLS-pre/post information can be signaled through the above-described preamble.

The constellation demapper block 15020 can perform a reverse process of the process performed by the constellation mapper block 14010 illustrated in FIG. 14. That is, the constellation demapper block 15020 can demap cell-deinterleaved data without performing derotation.

The third block 15200 for MIMO can include a complex symbol parsing block 15210 and a Q-block deinterleaver block 15220, as shown in FIG. 15.

The complex symbol parsing block 15210 can perform a reverse process of the process performed by the complex symbol generator block 14220 illustrated in FIG. 14. That is, the complex symbol parsing block 15210 can parse complex data symbols and demap the same to bit data. In this case, the complex symbol parsing block 15210 can receive complex data symbols through at least two paths.

The Q-block deinterleaver block 15220 can perform a reverse process of the process carried out by the Q-block interleaver block 14210 illustrated in FIG. 14. That is, the Q-block deinterleaver block 15220 can restore Q size blocks according to row-column deinterleaving, restore the order of permuted blocks to the original order and then restore positions of parity bits to original positions according to parity deinterleaving.

The above-described blocks may be omitted or replaced by blocks having similar or identical functions according to design.

As illustrated in FIG. 15, the demapping & decoding module according to another embodiment of the present invention can output data pipes and PLS information processed for respective paths to the output processor.

The above-described cell interleaver and the cell deinterleaver may be omitted according to another embodiment. Blocks corresponding to the cell interleaver and the cell deinterleaver may be omitted or replaced by other blocks performing the same or similar functions. Alternatively, cell interleaving and cell deinterleaving may be performed by another non-independent block. That is, another block may also perform cell interleaving and cell deinterleaving. Furthermore, according to another embodiment, the above-described interleaving method used for cell interleaving/cell deinterleaving may be used for another interleaving target.

In addition, Q delay and I delay may be omitted according to another embodiment. Blocks corresponding to Q delay and I delay may be omitted or replaced by other blocks performing the same or similar operations. Furthermore, Q delay and I delay may be performed by another non-independent block. That is, another block may also perform Q delay and I delay operations.

Figure 16:
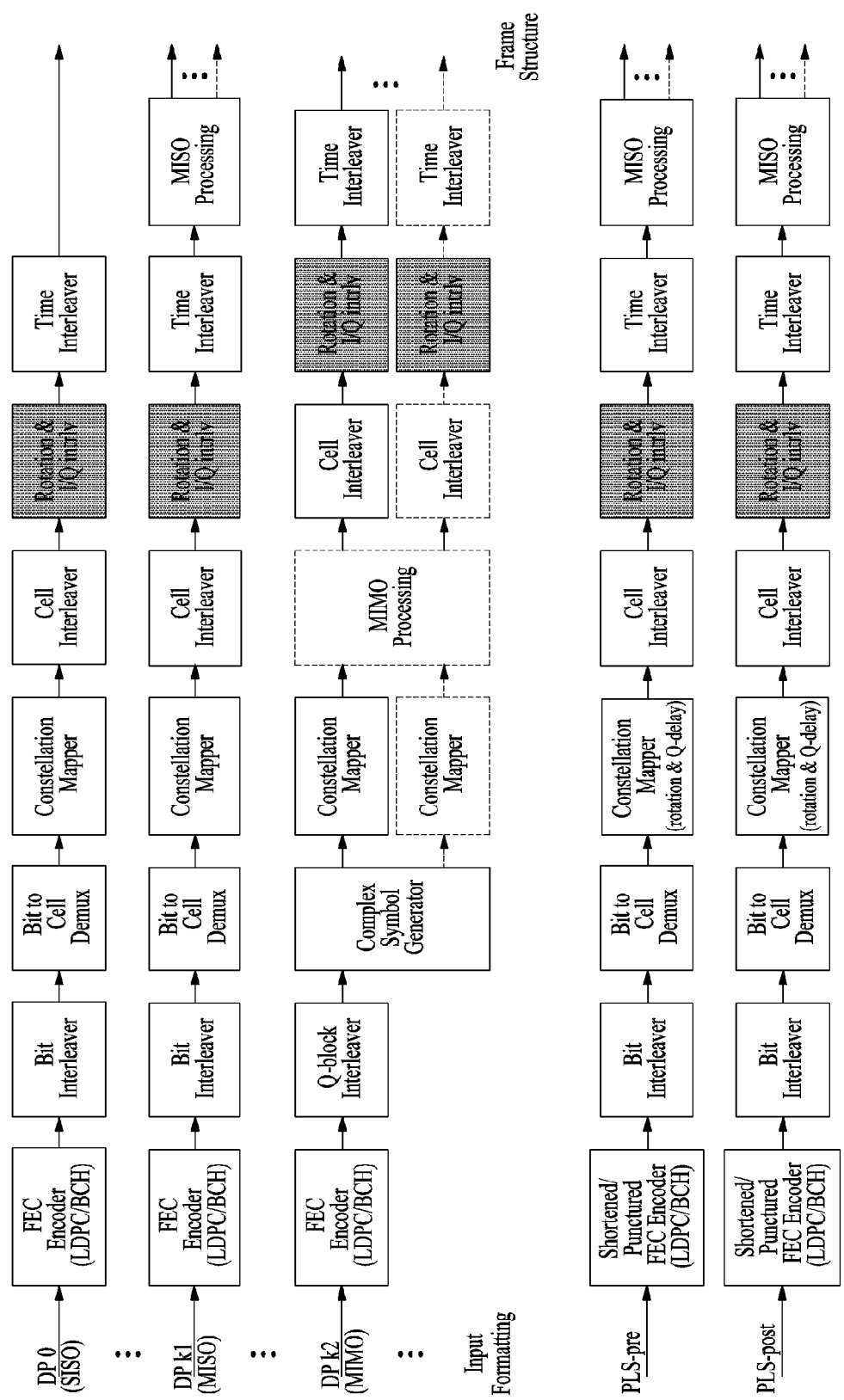
FIG. 16 is a block diagram of a coding & modulation module including a new rotation & I/Q interleaver block according to an embodiment of the present invention.

FIG. 16 is a block diagram of a coding & modulation module including a new rotation & I/Q interleaver block according to an embodiment of the present invention.

The present invention proposes block-by-block I/Q interleaving & deinterleaving. Block-by-block I/Q interleaving & deinterleaving may apply a different interleaving pattern per forward error correction (FEC) block. Here, the different interleaving patterns may have the same properties. Block-by-block I/Q interleaving & deinterleaving may improve the performance of signal space diversity (SSD).

Block-by-block I/Q interleaving & deinterleaving may be performed by the above-described coding & modulation module. Specifically, block-by-block I/Q interleaving & deinterleaving may be performed by a new rotation & I/Q interleaver block and an I/Q deinterleaver & derotation block corresponding to the above-described rotation & I/Q interleaver block 14020 and the I/Q deinterleaver & derotation block 15010.

According to an embodiment, the new rotation & I/Q interleaver block may be located between the above-described cell interleaver and the time interleaver. Although not shown in the figure, according to another embodiment of the present invention in which the cell interleaver is omitted, the new rotation & I/Q interleaver block may be located after the constellation mapper. Alternatively, according to another embodiment of the present invention in which the cell interleaver is omitted, the new rotation & I/Q interleaver block may be located after the MIMO encoding block.

The new rotation & I/Q interleaver block may perform constellation rotation and perform block-by-block I/Q interleaving. Through block-by-block I/Q interleaving, real number components (in-phase (I) components) and imaginary number components (quadrature-phase (Q) components) of complex symbols may be independently interleaved. According to another embodiment, the real number components may not be interleaved. The number of input and output symbols of the new rotation & I/Q interleaver block may be 2, 3, 4 or more.

According to another embodiment, operation of the new rotation & I/Q interleaver block may not be performed by an independent block but may be performed by another block. For example, operation of the new rotation & I/Q interleaver block may be performed by the time interleaver. The new rotation & I/Q interleaver block may be omitted or replaced by another block having the same or similar function. According to another embodiment, block-by-block I/Q interleaving & deinterleaving may be omitted or performed by another block. For example, block-by-block I/Q interleaving may be performed by the time interleaver.

Figure 17:
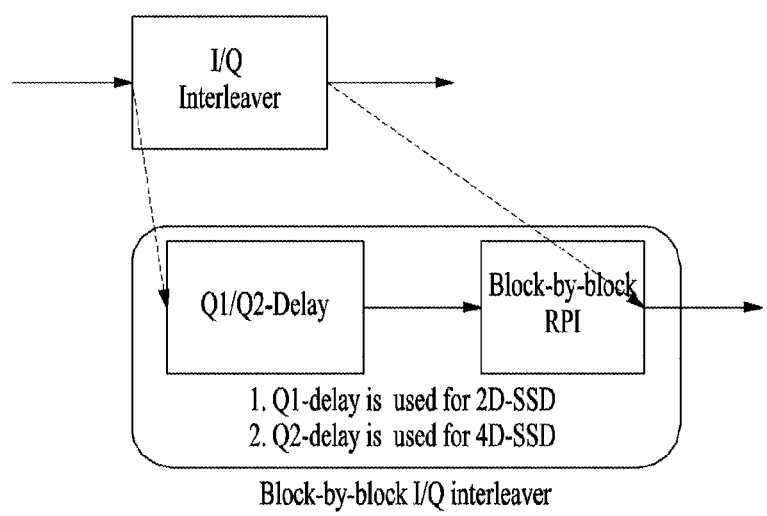
FIG. 17 is a view illustrating a block-by-block I/Q interleaver according to an embodiment of the present invention.

FIG. 17 is a view illustrating a block-by-block I/Q interleaver according to an embodiment of the present invention.

The block-by-block I/Q interleaver may refer to a block for performing block-by-block I/Q interleaving. As described above, block-by-block I/Q interleaving may be performed by the new rotation & I/Q interleaver block.

The block-by-block I/Q interleaver may include a Q1/Q2 delay block and/or a block-by-block relative prime interleaver (RPI). The block-by-block RPI may be abbreviated to RPI.

The Q1/Q2 delay block may split complex symbols into real number components (in-phase components) and imaginary number components (quadrature-phase components), and then delay only the imaginary number components. A delay value may be determined based on whether 2-dimensional signal space diversity (2D SSD) or 4-dimensional signal space diversity (4D SSD) is used. If 2D SSD is used, the delay value may correspond to 1 cell. If 4D SSD is used, the delay value may correspond to 2 cells.

The RPI may interleave the real number components and the imaginary number components. According to another embodiment, the real number components may not be interleaved. The RPI may have periodicity. The RPI may linearly write an output signal of the Q1/Q2 delay in a memory. In addition, the RPI may periodically read the signal written in the memory. An interleaving pattern may differ per FEC block. However, different interleaving patterns may have the same properties. A cycle applied to the read operation may be determined based on whether 2D SSD or 4D SSD is used. If 2D SSD is used, the cycle may be 2. If 4D SSD is used, the cycle may be 4. The writing process may be called an interleaving process in a broader sense.

The interleaving pattern may be called an interleaving seed. Different interleaving seeds may be derived from one mother interleaving seed. Accordingly, the interleaving seeds may be called sub interleaving seeds of the mother interleaving seed.

The present invention proposes an RPI scheme as a method for forming one mother interleaving seed, and then proposes a method for forming sub interleaving seeds. According to the new method for forming the sub interleaving seeds, if the receiver uses a single memory, memory use of the receiver may be reduced.

The RPI may be used as a mother interleaver, and an initial offset value of the RPI may vary per block. Whether to use a single memory may be determined based on an initial offset value generation method of the RPI.

FIG. 18 is a view illustrating operation of the Q1/Q2 delay block according to an embodiment of the present invention.

A description is now given of an operation process of the Q1 delay block when 2D-SSD is considered. Here, the memory size and the number of input cells may be assumed to be N.

When 2D-SSD is considered, the Q1 delay block may delay Q components by one cell. That is, the Q1 delay block may not move real number components (I components) but delay only imaginary number components (Q components) by one cell. Since the Q1 delay block performs cyclic shifting, an $(N-1)^{th}$ Q component may be paired with a $0^{th}$ I component. An output signal of the Q1 delay block may be input to the RPI.

A description is now given of an operation process of the Q2 delay block when 4D-SSD is considered. Here, the memory size and the number of input cells may be assumed to be N.

When 4D-SSD is considered, the Q2 delay block may delay Q components by 2 cells. That is, the Q2 delay block may not move real number components (I components) but delay only imaginary number components (Q components) by 2 cells. Since the Q2 delay block performs cyclic shifting, $(N-2)^{th}$ and $(N-1)^{th}$ Q components may be paired with $0^{th}$ and $1^{st}$ I components. An output signal of the Q2 delay block may be input to the RPI.

New I/Q pairs generated after the Q components are delayed by 1 or 2 cells may serve as new cells. These new cells may be denoted by $x_{0,j}, x_{1,j}, x_{2,j}, \ldots, x_{N-1,j}$. Here, $x_{k,j}$ may refer to a $k^{th}$ cell of a $j^{th}$ FEC block.

FIG. 19 is a view illustrating a writing process of the RPI according to an embodiment of the present invention.

This figure illustrates an embodiment of the writing process of the RPI when 2D SSD technology is used. The writing process of the RPI when 4D SSD technology is used may operate similarly to that when 2D SSD technology is used.

Input FEC blocks may correspond to an output signal of the above-described Q1/Q2 delay block. A total number of FEC blocks may be denoted by $N_{FEC\_NUM}$, and the number of cells included in one FEC block may be denoted by $N_{Cell\_NUM}$. For interleaving, $N_{Cell\_NUM} = N_{FEC\_NUM} = 8$ may be assumed. Even when 4D SSD technology is used, $N_{Cell\_NUM} = N_{FEC\_NUM} = 8$ may be assumed.

$D_{SSD}$ may refer to a relative prime. In addition, $D_{SSD}$ may refer to dimensions of SSD. To maximize spreading performance of the I and Q components in the periodic reading process of the RPI, the $D_{SSD}$ value of the RPI for 2/4D SSD technology may be set to 2 or 4 ($D_{SSD}=2/4$).

$V_{Cell\_NUM}$ may refer to the number of virtual cells included in one FEC block. $V_{Cell\_NUM}$ may be determined in consideration of dimensions of SSD. $V_{Cell\_NUM}$ is a value expressible as $V_{Cell\_NUM} = N_{Cell\_NUM} + (D_{SSD}-1)$. In consideration of characteristics of the RPI and a case in which the length of an FEC block, i.e., $N_{Cell\_NUM}$, is an even number, the relative prime value and $N_{Cell\_NUM}$ may not be relatively prime. If the two are not relatively prime, the RPI may not normally operate. To solve this problem, the RPI may operate using $V_{Cell\_NUM}$ instead of $N_{Cell\_NUM}$. When the RPI operates using $V_{Cell\_NUM}$, the receiver requires additional memory by ($D_{SSD}-1$) but the size of the additional memory is ignorable. If 2D SSD technology is used, $V_{Cell\_NUM}=9$ may be assumed. If 4D SSD technology is used, $V_{Cell\_NUM}=11$ may be assumed.

In this figure, (a) illustrates memory indexes for the writing process. Since $N_{FEC\_NUM}=8$, 8 FEC blocks may be present. #0, #1, . . . , #7 denote FEC block numbers. Since $N_{Cell\_NUM}=8$, each FEC block may include 8 cells. Cells of each FEC block may be indexed 0, 1, . . . , 7. A virtual memory index 8 is marked in (a) of this figure. This virtual memory index is provided to easily describe RPI operation using $V_{Cell\_NUM}$ and is not considered in an actual write operation.

In this figure, (b) illustrates memory values written in a memory. The RPI may sequentially store cells in the memory using the memory indexes (linear write operation). For example, in the case of FEC block #0, cells $x_{0,0}, x_{1,0}, x_{2,0}, \ldots, X_{7,0}$ may be stored in the memory based on the memory indexes. A virtual memory index 8 is marked in (b) of this figure. This virtual memory index is provided to easily describe RPI operation using $V_{Cell\_NUM}$ and is not considered in an actual write operation.

FIG. 20 is a view illustrating a reading process of the RPI according to an embodiment of the present invention.

In this figure, (a) illustrates memory indexes generated using the RPI algorithm to read every FEC block. This memory indexes may be called output memory indexes. A $0^{th}$ initial offset value may be determined as 0. After that, the last output memory index value of the RPI applied to every FEC block may be set as an initial offset value of the RPI applied to a subsequent FEC block. For example, since the last output memory index value of FEC block #0 is 7, the $0^{th}$ output memory index value of FEC block #1 may also be 7. Here, a unit corresponding to each FEC block number may be called a sub RPI.

In this figure, (b) illustrates a result of the reading process using the memory indexes generated in (a) by the RPI. For example, $x_{2,0}$ may correspond to index 2 and $x_{4,0}$ may correspond to index 4 in the case of FEC block #0. If the RPI performs the reading process in this manner, the maximum spreading value may be 4.

Particularly, in the reading process, the RPI may perform skip operation if a corresponding memory index exceeds $N_{Cell\_NUM}-1$. That is, if the index exceeds 7 (i.e., index 8), a corresponding memory value may be ignored (skipped) and not read. This skip operation may be performed on $D_{SSD}-1$ values exceeding $N_{Cell\_NUM}$. Through the skip operation, the length of an input FEC block may be the same as the length of an output FEC block. In addition, the maximum spreading value may be maintained even when the skip operation is performed.

The above-described operation of the RPI may be performed per FEC block (block-by-block). In addition, the operation of the RPI may be performed in consideration of an initial offset of the RPI to enable single-memory deinterleaving of the receiver.

FIG. 21 is a mathematical expression of a memory index generation process for the reading process of the RPI according to an embodiment of the present invention.

In this mathematical expression, $I_j$ may refer to an initial offset of a $j^{th}$ sub RPI, and mod may refer to the modulo operation. In addition, $\pi_j(k)$ may refer to an output memory index of a $k^{th}$ input cell index of a $j^{th}$ FEC block (interleaving output memory index (RPI output value)), and $C_{cnt,j}$ may refer to a counter of an actual output memory index of the $j^{th}$ FEC block.

This mathematical expression may express a memory index generator for performing RPI operation on FEC blocks sequentially output from the Q1/Q2 delay block.

Particularly, a part indicated by a dashed line may mathematically express a conditional part of the above-described skip operation.

FIG. 22 is a flowchart of the memory index generation process of the RPI according to an embodiment of the present invention.

The memory index generation process of the RPI may include determining an initial value (s22010), generating a temporary RPI memory index (s22020), evaluating usability of the generated RPI memory index (s22030), and/or generating a final RPI memory index (s22040).

Figure 23:
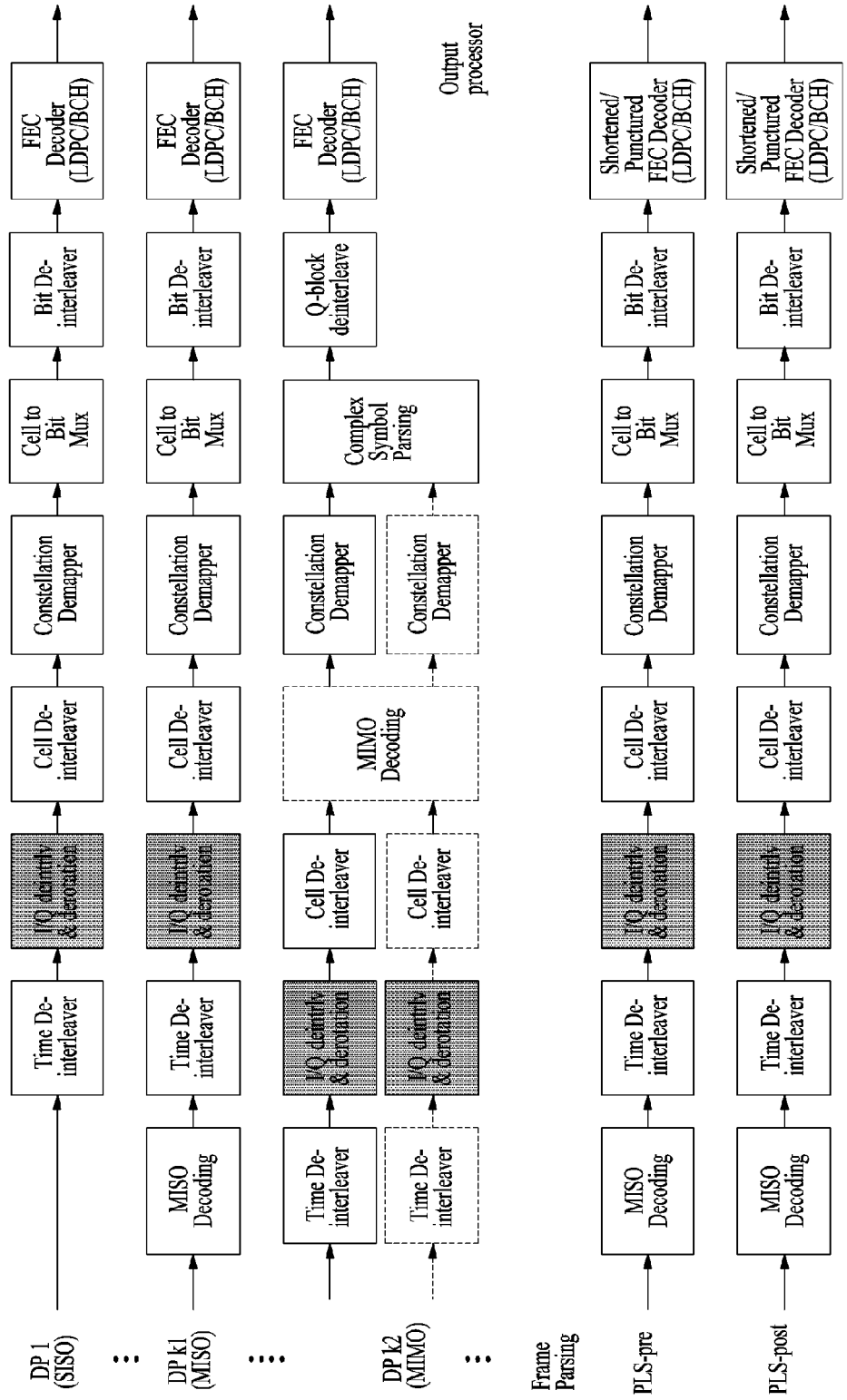
FIG. 23 is a block diagram of a demapping & decoding module including a new I/Q deinterleaver & derotation block according to an embodiment of the present invention.

FIG. 23 is a block diagram of a demapping & decoding module including a new I/Q deinterleaver & derotation block according to an embodiment of the present invention.

Block-by-block I/Q deinterleaving proposed by the present invention is a technology corresponding to the above-described block-by-block I/Q interleaving. Block-by-block I/Q deinterleaving may be performed using a single memory.

Block-by-block I/Q deinterleaving may be performed by the above-described demapping & decoding module. Specifically, block-by-block I/Q deinterleaving may be performed by a new I/Q deinterleaver & derotation block corresponding to the above-described I/Q deinterleaver & derotation block 15010.

According to an embodiment, the new I/Q deinterleaver & derotation block may be located between the above-described time deinterleaver and the cell deinterleaver. Although not shown in the figure, according to another embodiment of the present invention in which the cell deinterleaver is omitted, the new I/Q deinterleaver & derotation block may be followed by the constellation demapper. Alternatively, according to another embodiment of the present invention in which the cell deinterleaver is omitted, the new I/Q deinterleaver & derotation block may be followed by the MIMO decoder.

The new I/Q deinterleaver & derotation block may perform block-by-block I/Q deinterleaving on the I/Q-interleaved I and Q components, and derotate complex symbols having restored I and Q components. The number of input and output symbols of the new I/Q deinterleaver & derotation block may be 2, 3, 4 or more.

According to another embodiment, operation of the new I/Q deinterleaver & derotation block may not be performed by an independent block but may be performed by another block. The new I/Q deinterleaver & derotation block may be omitted or replaced by another block having the same or similar function. According to another embodiment, block-by-block I/Q deinterleaving may be omitted or performed by another block.

Figure 24:
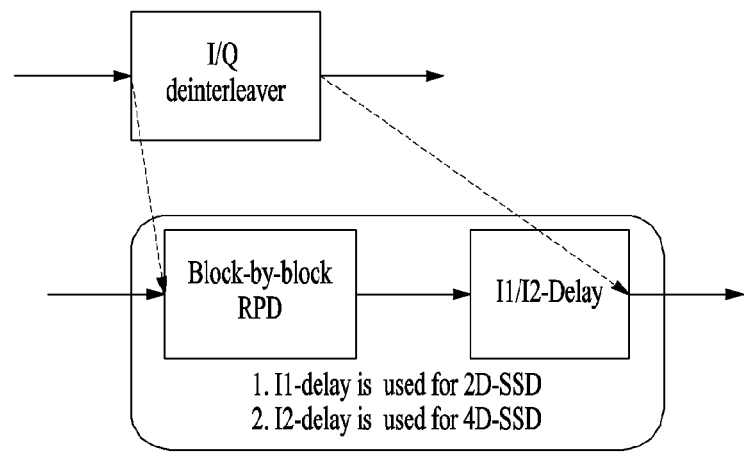
FIG. 24 is a view illustrating a block-by-block I/Q deinterleaver according to an embodiment of the present invention.

FIG. 24 is a view illustrating a block-by-block I/Q deinterleaver according to an embodiment of the present invention.

The block-by-block I/Q deinterleaver may refer to a block for performing block-by-block I/Q deinterleaving. As described above, block-by-block I/Q deinterleaving may be performed by the new I/Q deinterleaver & derotation block. Overall, the block-by-block I/Q deinterleaving process may follow an inverse process of the block-by-block I/Q interleaving process.

The block-by-block I/Q deinterleaver may include a block-by-block relative prime deinterleaver (RPD) and/or an I1/I2 delay block. The block-by-block RPD may be abbreviated to RPD.

The block-by-block RPD may follow an inverse process of the RPI.

Particularly, the RPD may operate using a single memory. Output of the RPD may be input to the I1/I2 delay block.

Operation of the RPD may include inserting 0 to memory index locations on which skip operation is performed, and/or deinterleaving sequentially input FEC blocks using the single memory. The deinterleaving of the FEC blocks may include writing/reading a first input block, and simultaneously writing and reading subsequently input blocks. A detailed description of this operation will be given below. The reading process may be called a deinterleaving process in a broader sense.

The I1/I2 delay block may split input complex symbols into in-phase (I) components and quadrature-phase (Q) components, and then delay only the I components. A delay value may be determined based on whether 2-dimensional signal space diversity (2D SSD) or 4-dimensional signal space diversity (4D SSD) is used. If 2D SSD is used, the delay value may correspond to 1 cell. If 4D SSD is used, the delay value may correspond to 2 cells. Consequently, the influence of the Q1/Q2 delay block operating in the transmitter may be offset by the I1/I2 delay block.

Figure 25:
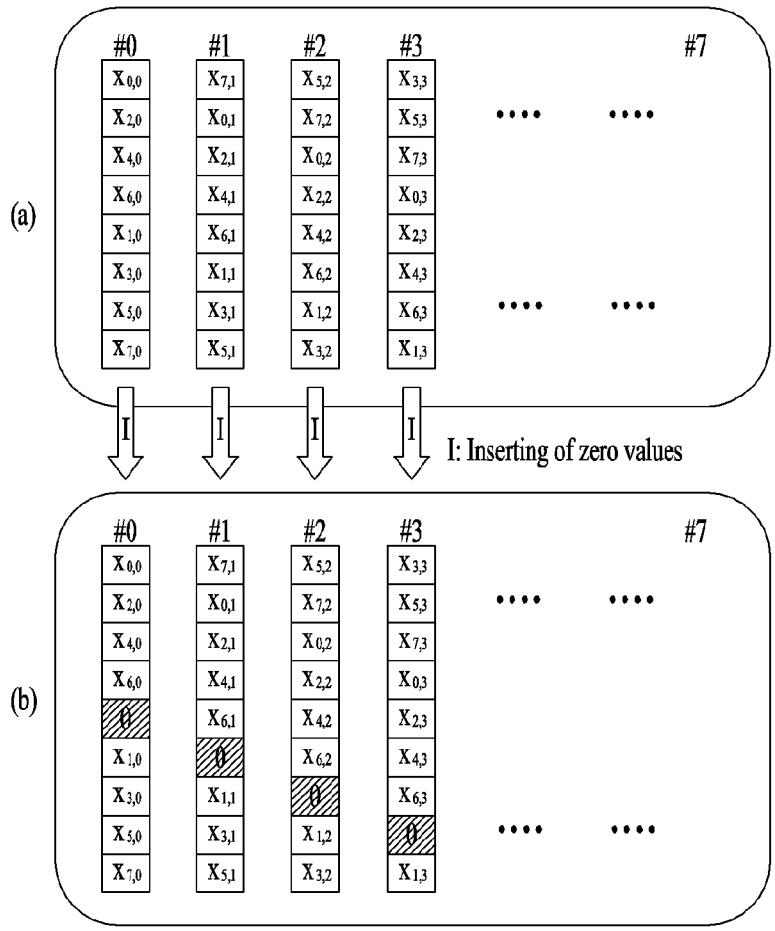
FIG. 25 is a view illustrating a value 0 insertion operation of RPD according to an embodiment of the present invention.

FIG. 25 is a view illustrating a value 0 insertion operation of the RPD according to an embodiment of the present invention.

The RPD may insert 0 to memory index locations ignored due to skip operation of the transmitter. According to another embodiment, an identifiable value may be inserted instead of 0. Virtual FEC blocks may be formed by inserting value 0. Insertion of 0 may be performed based on the RPI rule.

In the value 0 insertion operation illustrated in this figure, $N_{Cell\_NUM}=N_{FEC\_NUM}=8$ is assumed to correspond to the assumption of the interleaving process of the transmitter, and $D_{SSD}$ and $V_{Cell\_NUM}$ are assumed as $D_{SSD}=2$ and $V_{Cell\_NUM}=9$, respectively. In addition, the length of a used virtual memory is $V_{Cell\_NUM}=9$. The current embodiment assumes that 2D SSD is used.

In this figure, (b) shows that 0 is inserted to memory index locations ignored due to skip operation of the transmitter. The length of a memory required by the receiver may be $V_{Cell\_NUM}$ which is increased from the length of an actual FEC block, i.e., $N_{Cell\_NUM}$, by $(D_{SSD}-1)$.

Figure 26:
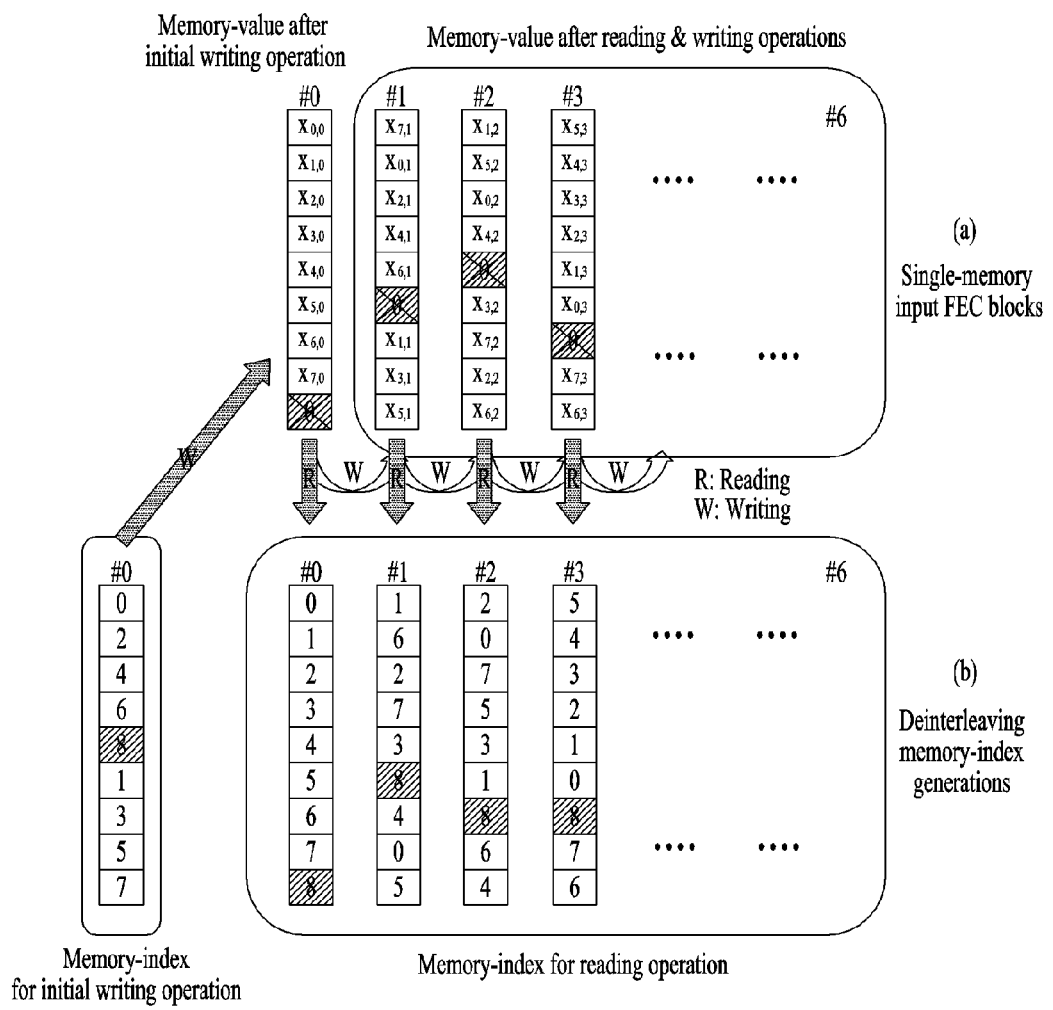
FIG. 26 is a view illustrating a deinterleaving process of the RPD using a single memory according to an embodiment of the present invention.

FIG. 26 is a view illustrating a deinterleaving process of the RPD using a single memory according to an embodiment of the present invention.

In this figure, (a) illustrates values stored in the single memory based on every input FEC block. The values stored in the single memory may be results of simultaneously performing a reading process on a previous FEC block and a writing process on cells of a current input FEC block. The reading process may be performed using memory indexes.

In this figure, (b) illustrates memory indexes required to read the values stored in the single memory. If the RPD performs deinterleaving (e.g., the reading process in this case) based on the memory indexes, a signal may be restored. A description of a memory index generation process will be given below.

The deinterleaving process using the single memory may include writing/reading a first input block, and simultaneously writing and reading subsequently input blocks.

A description is now given of the writing/reading of the first input FEC block.

Here, the input FEC block may be an FEC block into which 0 (or an identifiable value) is inserted. If input FEC block #0 (the first input FEC block) is input, a writing process may be performed on FEC block #0. FEC block #0 may be written in the single memory. In this case, the writing process may be performed based on memory indexes generated by an RPD generator corresponding to the RPI of the transmitter.

After that, sequential memory indexes may be generated for the stored FEC block #0 and thus a reading process (linear reading) may be performed. The sequential memory indexes may refer to memory indexes such as 0, 1, 2, . . . . That is, an inverse operation of the RPI of the transmitter may be performed on the first input FEC block. If a memory value of 0 (or an identifiable value) is read in the reading process, skip operation for ignoring the memory value may be performed. While the reading process is being performed on FEC block #0, a writing process may be performed on FEC block #1.

A description is now given of the simultaneously writing and reading of the subsequently input blocks.

The RPD may generate memory indexes for the stored FEC block #1 and thus perform a reading process thereon. Since the receiver uses a single memory, the reading process may not be performed using a sub interleaving seed applied to each FEC block by the transmitter. A description of the memory index generation process for the reading process will be given below. As in the first process, if a memory value of 0 (or an identifiable value) is read in the reading process, skip operation for ignoring the memory value may be performed.

While the reading process is being performed on FEC block #1, a writing process may be performed on a subsequent FEC block.

The simultaneously writing and reading of the input blocks may be performed repeatedly on subsequently input blocks.

FIG. 27 is a view illustrating a memory index generation process in the reading process of the RPD according to an embodiment of the present invention.

As described above, since the RPD uses a single memory, the reading process may not be performed using a sub interleaving seed applied to each FEC block by the transmitter. Accordingly, a new interleaving seed is necessary. A description is now given of a memory index generation process based thereon.

Initially, for input FEC block #0, a relative prime value may be 1, and an initial offset value $I_n$ may be 0 (i.e., $I_0$=0). The relative prime value and the initial offset value are variables of the RPD. The initial offset value may refer to a $0^{th}$ memory index of the FEC block, and the relative prime value may refer to the difference between memory indexes. That is, in the case of block #0, since the value $I_0$ is 0, the $0^{th}$ memory index is 0. In addition, since the relative prime value is 1, memory indexes may be determined in such a manner that a $1^{st}$ memory index is 1, a subsequent memory index is 2, . . . .

For input FEC block #1, $p^1$=5 (=$N_{Cell\_NUM}/D_{SSD}$+1) and $I_1$=1 may be used as variables of the RPD. That is, the value p=5 may be a value determined due to $N_{Cell\_NUM}/D_{SSD}$+1. (2D SSD is assumed.) Accordingly, memory indexes may be determined in such a manner that a $0^{th}$ memory index is 1, a $1^{st}$ memory index is 6 (1+5), a $2^{nd}$ memory index is 2, . . . . Although the $2^{nd}$ memory index should be 6+5=11, the memory indexes have values 0 to 8 and thus the $2^{nd}$ memory index is 2.

For input FEC block #2, a relative prime value of $p^2$=5×5 and an initial offset value of $I_2$=2 may be used as variables of the RPD.

For input FEC block #3, a relative prime value of $p^3$=5×5×5 and an initial offset value of $I_3$=5 may be used as variables of the RPD.

By varying the relative prime value and the initial offset value of the RPD per FEC block in this manner, FEC blocks may be efficiently read from the single memory. In addition, the relative prime value used for each FEC block may be easily calculated as an exponential power of p.

The initial offset value may be determined as described below.

An initial offset value used for input FEC block #0 may be $I_0$=0.

An initial offset value used for input FEC block #1 may be $I_1$=1. This value may be the same as the first generated value among memory indexes generated for input FEC block #0. That is, since a $1^{st}$ memory index of input FEC block #0 is 1, a $0^{th}$ memory index (initial offset value) of input FEC block #1 may be the same value, i.e., 1. Consequently, the RPD may store the first generated value among the memory indexes generated for input FEC block #0, and then use the same to generate memory indexes for input FEC block #1.

Likewise, an initial offset value used for input FEC block #2 may be $I_2$=2, and this value may be the same as the second generated value among memory indexes generated for input FEC symbol #1.

An initial offset value used for input FEC block #3 may be $I_3$=5, and this value may be the same as the third generated value among memory indexes generated for input FEC symbol #2.

That is, an initial offset value to be used for a currently input FEC block may use a value stored when memory indexes for a previously input FEC block are generated. An algorithm for designating the location to be stored in this case may be expressed as given below and as illustrated in the figure.

$$I_1 = j \bmod V_{Cell\_NUM} \text{ with } I_0=0 \qquad \text{Expression 1}$$

Consequently, the above-described memory index generation process in the reading process of the RPD may be mathematically modeled as given below.

$$\theta_j^{-1}(k) = \left(I_j + \underbrace{\left(\frac{N_{Cell\_NUM}}{D_{SSD}}+1\right)^j}_{p} k\right) \bmod V_{Cell\_NUM} \qquad \text{Expression 2}$$

Here, $\theta_j^{-1}(k)$ denotes a $k^{th}$ memory index of FEC block #j (k=0, 1, 2, . . . , 8). For example, in the case of FEC block #1, the above expression may be given as $\theta_j^{-1}(k)=(1+5^1 k)$ mod 9. Using this expression, a $2^{nd}$ (i.e., k=2) memory index of FEC block #1 is 2.

FIG. 28 is a mathematical expression of the memory index generation process for the reading process of the RPD according to an embodiment of the present invention.

In this mathematical expression, $M(\theta_j^{-1}(k))$ may refer to a memory value at $\theta_j^{-1}(k)$, $I_j^{-1}$ may refer to an initial offset value at a $j^{th}$ FEC block, $\pi_j^{-1}(k)$ may refer to a $k^{th}$ memory index of the $j^{th}$ FEC block, $\pi_j^{-1}(g_j)$ may refer to a $g_j^{th}$ memory index of the $j^{th}$ FEC block, and $C_{cnt,j}$ may refer to a counter of an actual output memory index of the $j^{th}$ FEC block.

This mathematical expression may express a memory index generator capable of performing single-memory operation. Particularly, a part indicated by a dashed line may mathematically express a conditional part of the above-described skip operation.

Figure 29:
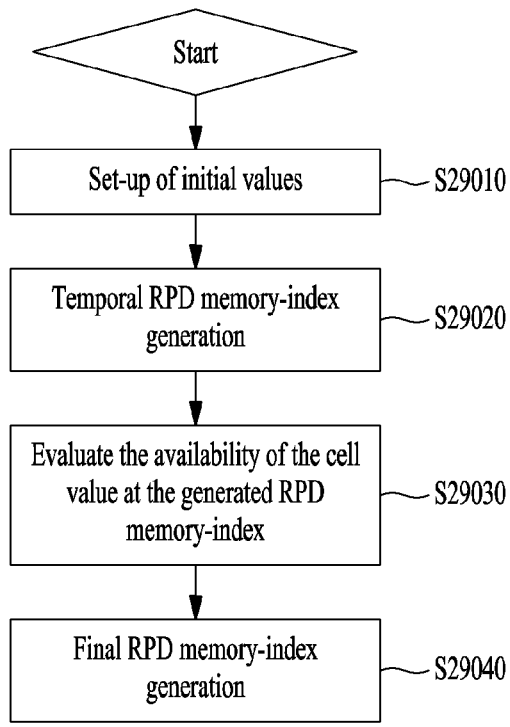
FIG. 29 is a flowchart of the memory index generation process of the RPD according to an embodiment of the present invention.

FIG. 29 is a flowchart of the memory index generation process of the RPD according to an embodiment of the present invention.

The memory index generation process of the RPD may include determining an initial value (s29010), generating a temporary RPD memory index (s29020), evaluating usability of a cell value at the generated RPD memory index (s29030), and/or generating a final RPD memory index (s29040).

Figure 30:
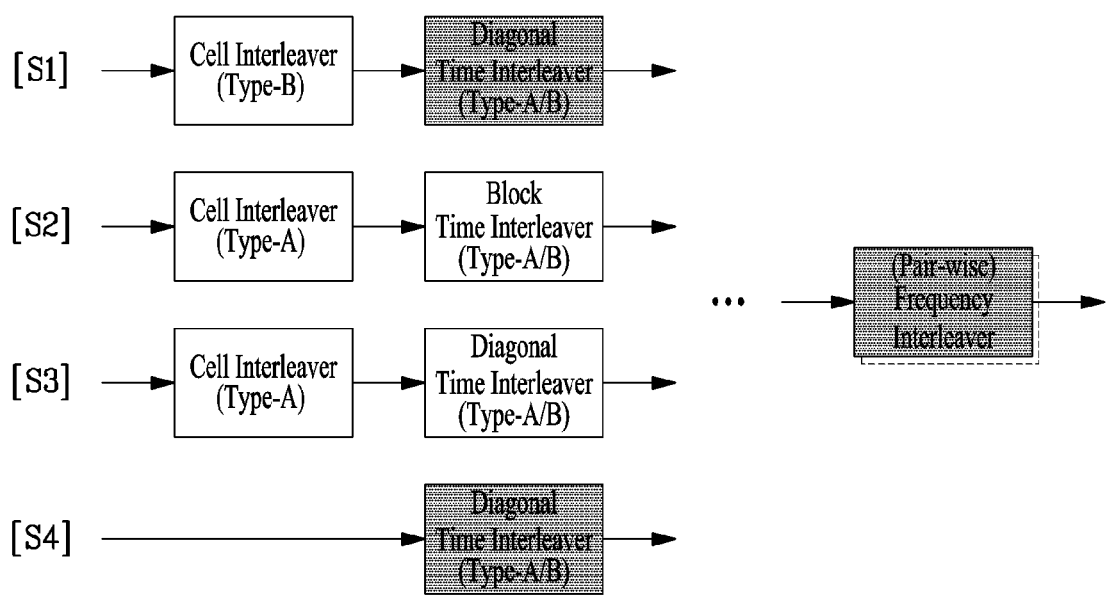
FIG. 30 is a view illustrating combinations of interleavers according to an embodiment of the present invention, when SSD is not considered.

FIG. 30 is a conceptual diagram illustrating combinations of interleavers on the condition that Signal Space Diversity (SSD) is not considered.

When SSD is not considered, combinations of the interleavers may be denoted by four scenarios S1 to S4. Each scenario may include a cell interleaver, a time interleaver, and/or a block interleaver.

The scope or spirit of the present invention is not limited to combinations of the above interleavers, and the present invention can provide a variety of additional combinations achieved by substitution, deletion, and/or addition of the interleavers. Combinations of the additional interleavers may be determined in consideration of system throughput, receiver operation, memory complexity, robustness, etc. For example, a new scenario achieved by omitting the cell interleaver from each of four scenarios may be additionally proposed. Although the additional scenario is not shown in the drawing, the additional scenario is within the scope or spirit of the present invention, and the operations of this additional scenario may be identical to the sum of operation of the individual constituent interleavers.

In FIG. 30, a diagonal time interleaver and a block time interleaver may correspond to the above-mentioned time interleavers. In addition, a pair-wise frequency interleaver may correspond to an interleaver corresponding to the above-mentioned block interleaver. The individual interleavers may be a legacy cell interleaver, a legacy time interleaver and/or a legacy block interleaver for use in the conventional art, or may be a new cell interleaver, a new time interleaver and/or a new block interleaver for use in the present invention. The four scenarios mentioned above may include a combination of the legacy interleavers and the new interleavers. The shaded interleavers shown in FIG. 30 may denote the new interleavers or may denote the legacy interleavers having other roles or functions.

TABLE 1

| Blocks | Types | Development Status | Interleaving Seed Variation | Single-memory Deinterleaving |
|---|---|---|---|---|
| Cell Interleaver | Type-A | New | YES | YES |
|  | Type-B | Conventional | NO (2-period) | YES |
| Block Time Interleaver | Type-A | Conventional | — | YES |
|  | Type-B | Conventional | — | YES |
| Diagonal Time Interleaver | Type-A | New | — | YES |
|  | Type-B | New | — | YES |
| (pair-wise) Frequency Interleaver | — | New | YES | YES |

Table 4 shows various interleavers for use in the four scenarios. "Types" item define various types of the respective interleavers. For example, the cell interleavers may include a Type-A interleaver and/or a Type-B interleaver. The block time interleavers may include a Type-A interleaver and/or a Type-B interleaver. "Development Status" item may denote development states of types of the respective interleavers. For example, the Type-A cell interleaver may be a new cell interleaver, and the Type-B cell interleaver may be a conventional cell interleaver. "Interleaving Seed Variation" item may indicate whether the interleaving seed of each interleaver is changeable. "YES" item may indicate that the interleaving seed of each interleaver is changeable (i.e., YES). "Single Memory Deinterleaving" item may indicate whether a deinterleaver corresponding to each interleaver provides single memory deinterleaving. "YES" item may indicate single memory deinterleaving.

A Type-B cell interleaver may correspond to a frequency interleaver for use in the conventional art (T2, NGH). A Type-A block time interleaver may correspond to DVB-T2. A Type-B block time interleaver may correspond to an interleaver for use in DVB-NGH.

TABLE 2

| Blocks | Types | Key Properties |
|---|---|---|
| Cell Interleaver | Type-A | Different interleaving seed is applied for every FEC block Possible to use a single-memory at receiver |
|  | Type-B | even & odd interleaving seeds are applied to FEC blocks, in turn Possible to use a single-memory at receiver |
| (pair-wise) Frequency Interleaver | — | Different interleaving seed is applied for every OFDM symbol Possible to use a single-memory at receiver |

Table 2 shows a Type-A cell interleaver, a Type-B cell interleaver, and a frequency interleaver. As described above, the frequency interleaver may correspond to the above-mentioned block interleaver.

The basic operation of the cell interleaver shown in Table 1 is identical to those of Table 2. The cell interleaver may perform interleaving of a plurality of cells corresponding to one FEC block, and output the interleaving result. In this case, cells corresponding to individual FEC blocks may be output in different orders of the individual FEC blocks. The cell deinterleaver may perform deinterleaving from the locations of cells interleaved in one FEC block to the original locations of the cells. The cell interleaver and the cell deinterleaver may be omitted as described above, or may be replaced with other blocks/modules having the same or similar functions.

The Type-A cell interleaver is newly proposed by the present invention, and may perform interleaving by applying different interleaving seeds to individual FEC blocks. Specifically, cells corresponding to one FEC block may be interleaved at intervals of a predetermined time, and the interleaved resultant cells can be generated. The Type-A cell deinterleaver may perform deinterleaving using a single memory.

The Type-B cell interleaver may be implemented when the interleaver used as a frequency interleaver for use in the conventional art (T2, NGH) is used as the cell interleaver. The Type-B cell interleaver may perform interleaving of cells corresponding to one FEC block, and may output the interleaved cells. The Type-B cell interleaver may apply different interleaving seeds to an even FEC block and an odd FEC block, and then perform interleaving. Accordingly, the Type-B cell interleaver has a disadvantage in that different interleaving seeds are applied to individual FEC blocks as compared to the Type-A cell interleaver. The Type-B cell deinterleaver may perform deinterleaving using a single memory.

A general frequency interleaver may correspond to the above-mentioned block interleaver. The basic operation of the block interleaver (i.e., frequency interleaver) is identical to the above-described operations. The block interleaver may perform interleaving of cells contained in a transmission (Tx) block used as a unit of a transmission (Tx) frame so as to obtain an additional diversity gain. The pair-wise block interleaver may process two contiguous cells into one unit, and perform interleaving of the processed result. Accordingly, output cells of the pair-wise block interleaver may be two contiguous cells to be arranged contiguous to each other. The output cells may operate in the same manner as in two antenna paths, or may operate independently of each other.

The operations of a general block deinterleaver (frequency deinterleaver) may be identical to the basic operations of the above-mentioned block deinterleaver. The block deinterleaver may perform a reverse process of the block interleaver operation so as to recover the original data order. The block deinterleaver may perform deinterleaving of data in units of a transmission block (TB). If the pair-wise block interleaver is used by a transmitter, the block deinterleaver can perform deinterleaving by pairing two contiguous data pieces of each input path. If deinterleaving is performed by pairing the two contiguous data pieces, output data may be two contiguous data pieces. The block interleaver and the block deinterleaver may be omitted as described above, or may be replaced with other blocks/modules having the same or similar functions.

The pair-wise frequency interleaver may be a new frequency interleaver proposed by the present invention. The new frequency interleaver may perform modified operations of the basic operations of the above-mentioned block interleaver. The new frequency interleaver may operate by applying different interleaving seeds to respective OFDM symbols according to an embodiment. In accordance with another embodiment, OFDM symbols are paired so that interleaving may be performed on the paired OFDM symbols. In this case, different interleaving seeds may be applied to one OFDM symbol pair. That is, the same interleaving seeds may be assigned to the paired OFDM symbols. The OFDM symbol pair may be implemented by combining two contiguous OFDM symbols. Two data carriers of the OFDM symbol may be paired and interleaving may be performed on the paired data carriers.

A new frequency interleaver may perform interleaving using two memories. In this case, the even pair may be interleaved using a first memory, and the odd pair may be interleaved using a second memory. The pair-wise frequency deinterleaver may perform deinterleaving using a single memory. In this case, the pair-wise frequency deinterleaver may indicate a new frequency deinterleaver corresponding to a new frequency interleaver.

TABLE 3

| Blocks | Types | Key Properties |
|---|---|---|
| Block Time Interleaver | Type-A | Column-wise writing and row-wise reading operations<br>Actual interleaving depth of a single FEC block is more than 2<br>Possible to use a single-memory at receiver |
| | Type-B | Column-wise writing and row-wise reading operations<br>Actual interleaving depth of a single FEC block is 1<br>Possible to use a single-memory at receiver |
| Diagonal Time Interleaver | Type-A | Column-wise writing and diagonal-wise reading operations<br>Actual interleaving depth of a single FEC block is more than 2<br>Possible to use a single-memory at receiver |

TABLE 3-continued

| Blocks | Types | Key Properties |
|---|---|---|
| | Type-B | Column-wise writing and diagonal-wise reading operations<br>Actual interleaving depth of a single FEC block is 1<br>Possible to use a single-memory at receiver |

Table 3 shows a Type-A block time interleaver, a Type-B block time interleaver, a Type-A diagonal time interleaver, and a Type-B diagonal time interleaver. The diagonal time interleaver and the block time interleaver may correspond to the above-mentioned time interleavers.

A general time interleaver may mix the cells corresponding to a plurality of FEC blocks, and output the mixed cells. Cells contained in each FEC block are scattered by a time interleaving depth through time interleaving, and the scattered cells can be transmitted. A diversity gain can be obtained through time interleaving. A general time deinterleaver may perform a reverse process of the time interleaver operation. The time deinterleaver may perform deinterleaving of cells interleaved in the time domain into the original locations of the cells. The time interleaver and the time deinterleaver may be omitted as described above, or may be replaced with other blocks/modules having the same or similar functions.

The block time interleaver shown in Table 3 may perform the operations similar to those of the time interleaver used in the conventional art (T2, NGH). The Type-A block time interleaver may indicate two or more interleavers, each of which has an interleaving depth with respect to one input FEC block. In addition, the type-B block time interleaver may indicate a specific interleaver which has an interleaving depth of 1 with respect to one input FEC block. In this case, the interleaving depth may indicate a column-wise writing period.

The diagonal time interleaver shown in Table 3 may be a new time interleaver proposed by the present invention. The diagonal time interleaver may perform the reading operation in a diagonal direction in a different way from the above-mentioned block time interleaver. That is, the diagonal time interleaver may store the FEC block in a memory by performing the column-wise writing operation, and may read the cells stored in the memory by performing the diagonal-wise reading operation. The number of memories used in the above-mentioned case may be set to 2 according to the present invention. The diagonal-wise reading operation may indicate the operation for reading the cells diagonally spaced apart from each other by a predetermined distance in the interleaving array stored in the memory. Interleaving may be achieved through the diagonal-wise reading operation. The diagonal time interleaver may be called a twisted row-column block interleaver.

The Type-A diagonal time interleaver may indicate an interleaver having an interleaving depth of 2 or higher with respect to one input FEC block. In addition, the Type-B diagonal time interleaver may indicate an interleaver having an interleaving depth of 1 with respect to one input FEC block. In this case, the interleaving depth may indicate the column-wise writing period.

Figure 31:
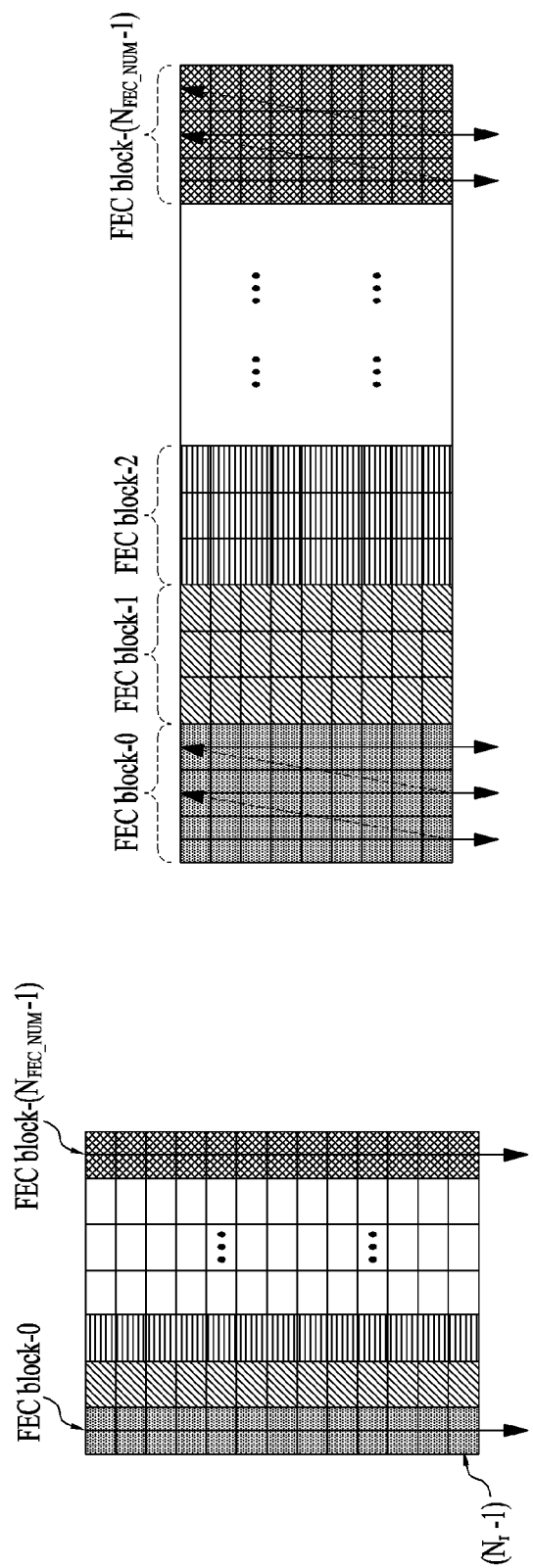
FIG. 31 is a view illustrating column-wise write operations of a block time interleaver and a diagonal time interleaver according to an embodiment of the present invention.

FIG. 31 shows the column-wise writing operations of the block time interleaver and the diagonal time interleaver according to the present invention.

The column-wise writing operation of the Type-A block time interleaver and the Type-A diagonal time interleaver may have the interleaving depth of 2 or higher as shown in FIG. 31.

The column-wise writing operation of the Type-B block time interleaver and the Type-B diagonal time interleaver may have the interleaving depth of 1 as shown in FIG. 31. In this case, the interleaving depth may indicate the column-wise writing period.

Figure 32:
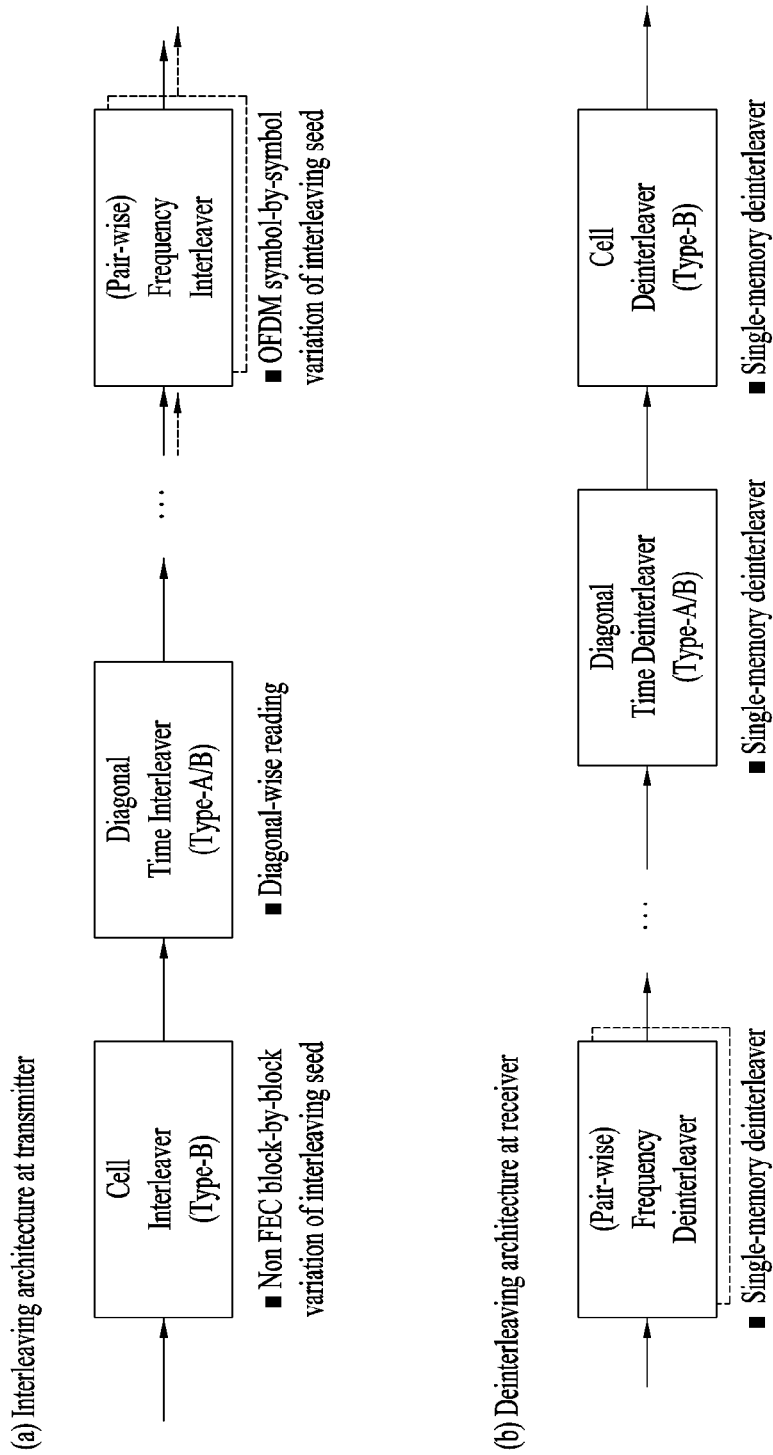
FIG. 32 is a view illustrating a first scenario S1 among the combinations of interleavers according to an embodiment of the present invention, when SSD is not considered.

FIG. 32 is a conceptual diagram illustrating a first scenario S2 from among combinations of the interleavers without consideration of a signal space diversity (SSD).

FIG. 32(a) shows the interleaving structure according to the first scenario. The interleaving structure of the first scenario may include a Type-B cell interleaver, a Type-A or Type-B diagonal time interleaver, and/or a pair-wise frequency interleaver. In this case, the pair-wise frequency interleaver may be the above-mentioned new frequency interleaver.

The Type-B cell interleaver may mix the cells corresponding to one FEC block at random, and output the mixed cells. In this case, the cells corresponding to each FEC block may be output in different orders of individual FEC blocks. The Type-B cell interleaver may perform interleaving by applying different interleaving seeds to odd input FEC blocks and even input FEC blocks as described above. The cell interleaving can be implemented by performing not only the writing operation for writing data in the memory, but also the reading operation for reading data from the memory.

The Type-A and Type-B diagonal time interleavers may perform the column-wise writing operation and the diagonal-wise reading operation for the cells belonging to a plurality of FEC blocks. Cells located at other locations within each FEC block through the diagonal time interleaving are scattered and transmitted within an interval as long as a diagonal interleaving depth, such that a diversity gain can be obtained.

Thereafter, the output of the diagonal time interleaver may be input to the pair-wise frequency interleaver after passing through other blocks/modules such as the above-mentioned cell mapper or the like. In this case, the pair-wise frequency interleaver may be a new frequency interleaver. Accordingly, the pair-wise frequency interleaver (new frequency interleaver) may provide an additional diversity gain by interleaving the cells contained in the OFDM symbol.

FIG. 32(b) shows the deinterleaving structure according to the first scenario. The deinterleaving structure of the first scenario may include a (pair-wise) frequency deinterleaver, a Type-A or Type-B diagonal time deinterleaver, and/or a Type-B cell deinterleaver. In this case, the pair-wise frequency deinterleaver may correspond to the above-mentioned new frequency deinterleaver. The pair-wise frequency deinterleaver may perform deinterleaving of data through a reverse process of the new frequency interleaver operation.

Thereafter, the output of the pair-wise frequency deinterleaver may be input to the Type-A and Type-B diagonal time deinterleavers after passing through other blocks/modules such as the above-mentioned cell demapper. The Type-A diagonal time deinterleaver may perform a reverse process of the Type-A diagonal time interleaver. The Type-B diagonal time deinterleaver may perform a reverse process of the Type-B diagonal time interleaver. In this case, the Type-A and Type-B diagonal time deinterleaver may perform time deinterleaving using a single memory.

The Type-B cell deinterleaver may perform deinterleaving from the locations of the cells interleaved in one FEC block to the original locations of the cells.

Figure 33:
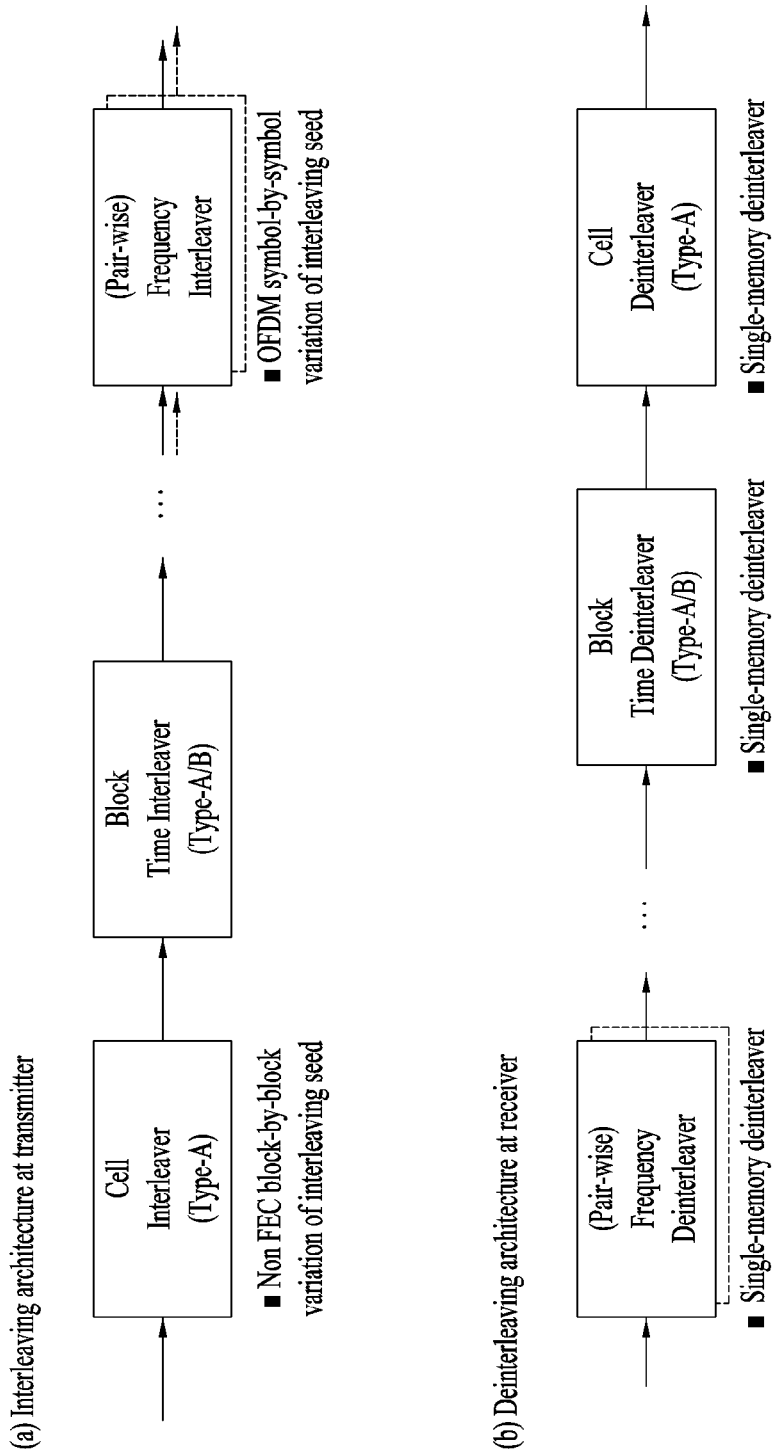
FIG. 33 is a view illustrating a second scenario S2 among the combinations of interleavers according to an embodiment of the present invention, when SSD is not considered.

FIG. 33 is a conceptual diagram of a second scenario S2 from among combinations of the interleavers without consideration of a signal space diversity (SSD).

FIG. 33(a) shows the interleaving structure according to the second scenario. The interleaving structure of the second scenario may include a Type-A cell interleaver, a Type-A or Type-B block time interleaver, and/or a pair-wise frequency interleaver. In this case, the pair-wise frequency interleaver may be the above-mentioned new frequency interleaver.

The Type-A cell interleaver may perform interleaving by applying different interleaving seeds to respective input FEC blocks as described above.

The Type-A and Type-B block timer interleavers may perform interleaving of the cells belonging to a plurality of FEC blocks through the column-wise writing operation and the row-wise reading operation, as described above. Cells located at other locations within are scattered and transmitted within an interval as long as an interleaving depth, such that a diversity gain can be obtained.

Thereafter, the output of the block time interleaver may be input to the pair-wise frequency interleaver after passing through other blocks/modules such as the above-mentioned cell mapper or the like. In this case, the pair-wise frequency interleaver may be the above-mentioned new frequency interleaver. Accordingly, the pair-wise frequency interleaver (new frequency interleaver) may provide an additional diversity gain by interleaving the cells contained in the OFDM symbol.

FIG. 33(b) shows the deinterleaving structure according to the second scenario. The deinterleaving structure of the second scenario may include a (pair-wise) frequency deinterleaver, a Type-A or Type-B diagonal time deinterleaver, and/or a Type-A cell deinterleaver. In this case, the pair-wise frequency deinterleaver may correspond to the above-mentioned new frequency deinterleaver.

The pair-wise frequency deinterleaver may perform deinterleaving of data through a reverse process of the new frequency interleaver operation.

Thereafter, the output of the pair-wise frequency deinterleaver may be input to the Type-A and Type-B diagonal time deinterleavers after passing through other blocks/modules such as the above-mentioned cell demapper. The Type-A block time deinterleaver may perform a reverse process of the Type-A block time interleaver. The Type-B block time deinterleaver may perform a reverse process of the Type-B block time interleaver. In this case, the Type-A or Type-B block time deinterleaver may perform time deinterleaving using a single memory.

The Type-A cell deinterleaver may perform deinterleaving from the locations of the cells interleaved in one FEC block to the original locations of the cells.

Figure 34:
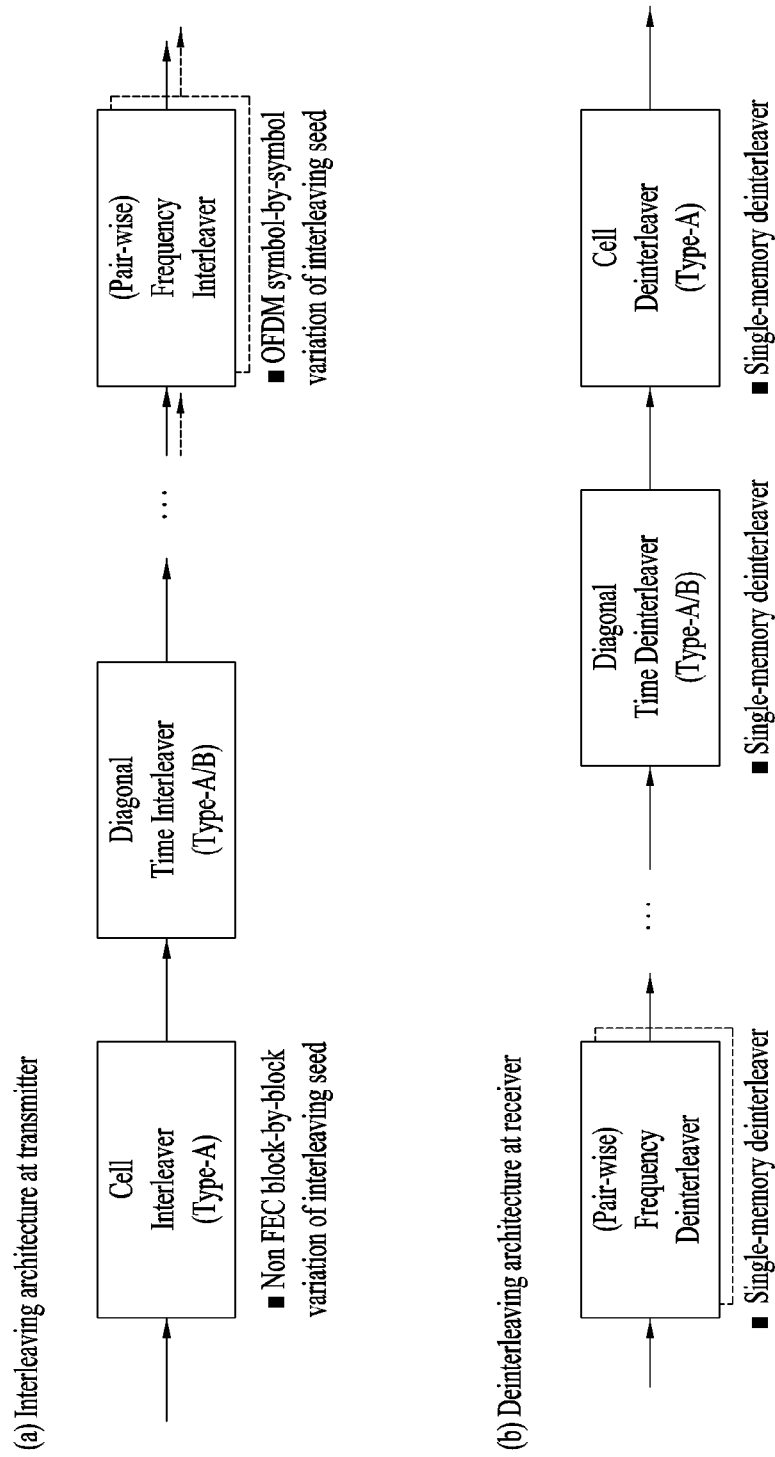
FIG. 34 is a view illustrating a third scenario S3 among the combinations of interleavers according to an embodiment of the present invention, when SSD is not considered.

FIG. 34 is a conceptual diagram of a third scenario S3 from among combinations of the interleavers without consideration of signal space diversity (SSD).

FIG. 34(a) shows the interleaving structure according to the third scenario. The interleaving structure of the third scenario may include a Type-A cell interleaver, a Type-A or Type-B diagonal time interleaver, and/or a pair-wise frequency interleaver. In this case, the pair-wise frequency interleaver may be the above-mentioned new frequency interleaver.

The operations of the Type-A cell interleaver, the Type-A and Type-B diagonal time interleaver, and the pair-wise frequency interleaver may be identical to those of the above-mentioned figures.

FIG. 34(b) shows the deinterleaving structure according to the third scenario. The deinterleaving structure of the third scenario may include a (pair-wise) frequency deinterleaver, a Type-A or Type-B diagonal time deinterleaver, and/or a Type-A cell deinterleaver. In this case, the pair-wise frequency deinterleaver may correspond to the above-mentioned new frequency deinterleaver.

The operations of the pair-wise frequency deinterleaver, the Type-A and Type-B diagonal time interleavers, and the Type-A cell deinterleaver may be identical to those of the above-mentioned figures.

FIG. 35 is a conceptual diagram of a fourth scenario S4 from among combinations of the interleavers without consideration of a signal space diversity (SSD).

FIG. 35(a) shows the interleaving structure according to the fourth scenario. The interleaving structure of the fourth scenario may include a Type-A or Type-B diagonal time interleaver and/or a pair-wise frequency interleaver. In this case, the pair-wise frequency interleaver may be the above-mentioned new frequency interleaver.

The operations of the Type-A and Type-B diagonal time interleavers and the pair-wise frequency deinterleaver may be identical to those of the above-mentioned figures.

FIG. 35(b) shows the deinterleaving structure according to the fourth scenario. The deinterleaving structure of the fourth scenario may include a (pair-wise) frequency deinterleaver and/or a Type-A or Type-B diagonal time deinterleaver. In this case, the pair-wise frequency deinterleaver may correspond to the above-mentioned new frequency deinterleaver.

The operations of the pair-wise frequency deinterleaver and the Type-A or Type-B diagonal time interleaver may be identical to those of the above-mentioned figures.

Figure 36:
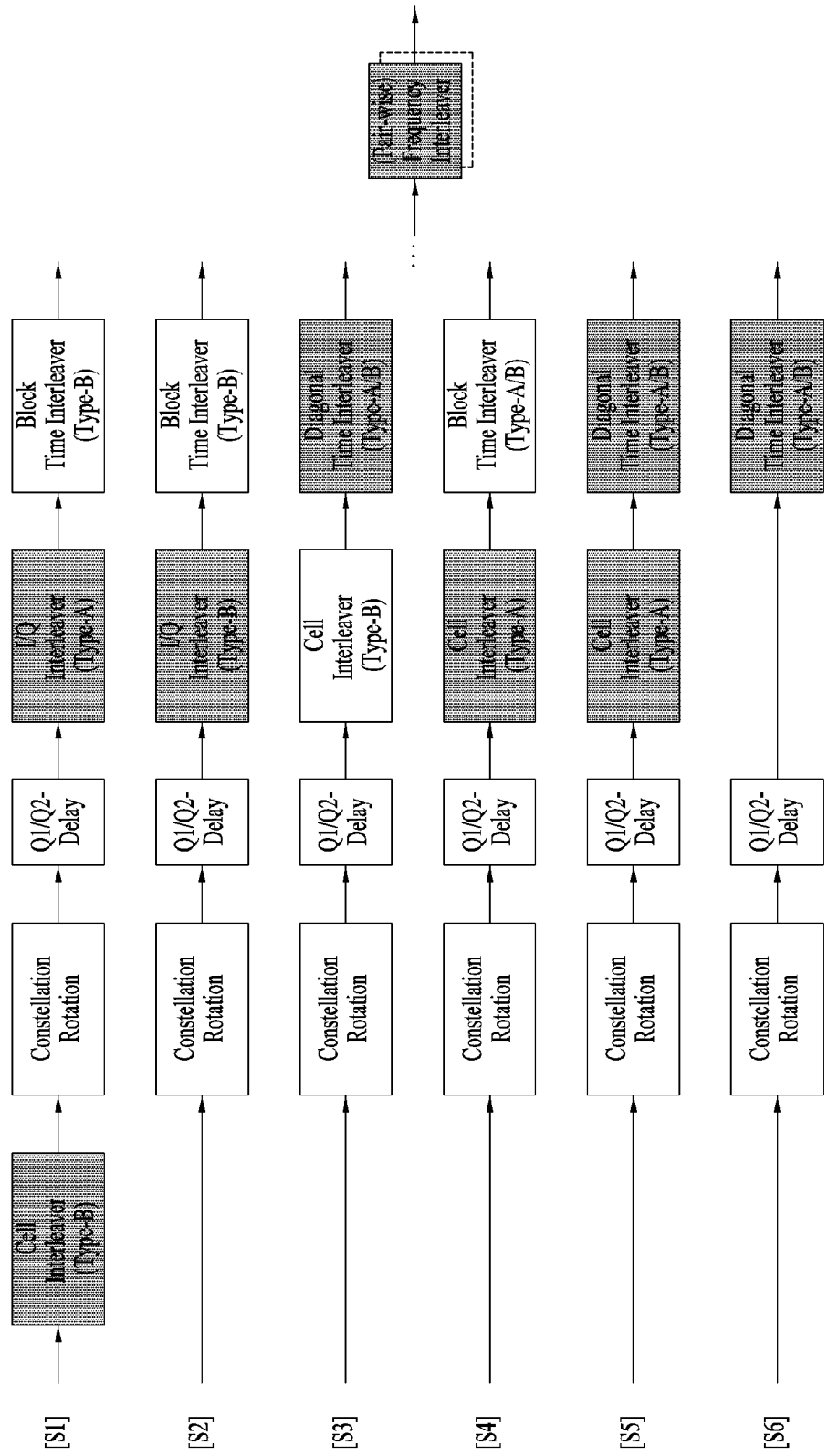
FIG. 36 is a view illustrating combinations of interleavers according to an embodiment of the present invention, when SSD is considered.

FIG. 36 is a view illustrating combinations of interleavers according to an embodiment of the present invention, when SSD is considered.

When SSD is considered, combinations of interleavers may be expressed as 6 scenarios S1 to S6 as illustrated in this figure. Each scenario may include a combination of the above-described cell interleaver, the rotation & I/Q interleaver, the time interleaver, and/or the block interleaver.

The present invention is not limited to the illustrated combinations of interleavers, and may propose a variety of additional combinations in which interleavers are replaced, eliminated, or added. These additional combinations of interleavers may be determined in overall consideration of system performance, receiver operation, memory complexity, robustness, etc. For example, new scenarios may be additionally proposed by omitting the cell interleaver from each of the currently proposed 6 scenarios. Although not described, these additional scenarios are within the scope of the present invention and operation of each scenario may correspond to operations of interleavers included in the scenario. In addition, the current 6 scenarios may also be proposed even when SSD is omitted.

Each interleaver may be a conventionally used cell interleaver, a rotation & I/Q interleaver, a time interleaver, and/or a block interleaver, or a cell interleaver, a rotation & I/Q interleaver, a time interleaver, and/or a block interleaver newly proposed by the present invention. The above 6 scenarios may include a combination of the conventional interleavers and the newly proposed interleavers. Shaded interleavers may refer to newly proposed interleavers, or conventional interleavers performing new functions as well as conventional functions.

TABLE 4

| Blocks | Types | Development Status | Interleaving Seed Variation | Single-memory Deinterleaving |
|---|---|---|---|---|
| Q1/Q2-Delay | — | Q1: conventional Q2: New | — | — |
| I/Q Interleaver | Type-A | New | YES | YES |
| | Type-B | New | YES | NO |

The above table shows a Q1/Q2 delay block and an I/Q interleaver usable in the above 6 scenarios. As shown in the table, interleaving using Q1 delay may be a conventional technology, and interleaving using Q2 delay may be a technology newly proposed by the present invention. Furthermore, the I/Q interleaver may be divided into type A and type B, both of which are newly proposed by the present invention and capable of interleaving seed variation. However, the type-A I/Q interleaver may support single-memory deinterleaving, but the type-B I/Q interleaver may not support single-memory deinterleaving.

In addition, when SSD is considered, a (type-A or type-B) cell interleaver, a (type-A or type-B) block time interleaver, a (type-A or type-B) diagonal time interleaver, and/or a new frequency interleaver may also be used in the above 6 scenarios. Descriptions of the (type-A or type-B) cell interleaver, the (type-A or type-B) block time interleaver, the (type-A or type-B) diagonal time interleaver, and/or the new frequency interleaver have been given above.

TABLE 5

| Blocks | Types | Key Properties |
|---|---|---|
| Q1/Q2-Delay | — | Q1-delay: delay Q components by one cell<br>Q2-delay: delay Q components by two cels |
| I/Q Interleaver | Type-A | Different interleaving seed is applied for every FEC block<br>Possible to use a single-memory at receiver |
| | Type-B | It plays the both roles of I/Q interleaver & cell interleaver<br>Different interleaving seed is applied for every FEC block<br>Require a double-memory at receiver |

The above table shows descriptions of the Q1/Q2 delay block and the I/Q interleaver.

The Q1/Q2 delay block may be a preceding block/module for independently interleaving I components and Q components of complex symbols. As described above, the Q1/Q2 delay block may split complex symbols into I components and Q components, and then delay only the Q components. A delay value may be determined as 1 cell for 2D SSD, or as 2 cells for 4D SSD. After the delay operation, a subsequent process may be performed on the newly paired I and Q components.

The I/Q interleaver shown in the table may correspond to the above-described rotation & I/Q interleaver excluding rotation function. A general I/Q interleaver may independently interleave the I components and the Q components. The number of input and output symbols of the general I/Q interleaver may be 2, 3, 4 or more. According to another embodiment, the I components may not be interleaved. A general I/Q deinterleaver may separately deinterleave the transmitted I components and the Q components.

The type-A and type-B I/Q interleavers are interleavers newly proposed by the present invention. The type-A and type-B I/Q interleavers are similar to but different from the general I/Q interleaver. The type-A and type-B I/Q interleavers may use an output signal of the Q1/Q2 delay block, as input thereof.

The type-A I/Q interleaver may perform interleaving by applying different interleaving seeds to the output signal of the Q1/Q2 delay block. The type-A I/Q interleaver may linearly write the output signal of the Q1/Q2 delay block in a memory, and periodically read data stored in the memory. The type-A I/Q interleaver may perform interleaving by applying different interleaving patterns having the same properties to blocks. A cycle applied in the read operation may vary based on dimensions of SSD. If the output signal of the Q1/Q2 delay block has a block length of N, the cycle of the read operation may be set to N/2 if 2D SSD is used, or set to N/4 if 4D SSD is used. A type-A I/Q deinterleaver of the receiver may perform deinterleaving using a single memory.

The type-B I/Q interleaver may perform interleaving by applying different interleaving seeds to the output signal of the Q1/Q2 delay block. The type-B I/Q interleaver may periodically write the output signal of the Q1/Q2 delay block in a memory, and randomly read data stored in the memory. A cycle applied in the read operation may vary based on dimensions of SSD. If the output signal of the Q1/Q2 delay block has a block length of N, the cycle of the read operation may be set to N/2 if 2D SSD is used, or set to N/4 if 4D SSD is used. A type-B I/Q deinterleaver of the receiver may perform deinterleaving using two memories.

The above-described I/Q interleaver may be omitted or replaced by another block having the same or similar function.

Figure 37:
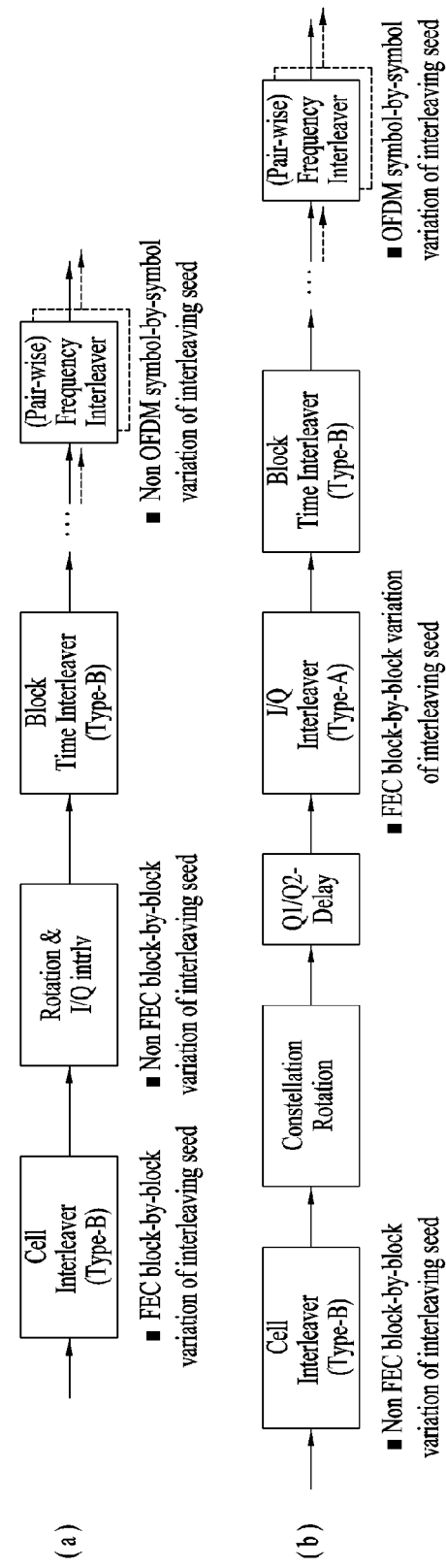
FIG. 37 is a view illustrating a first scenario S1 among the combinations of interleavers according to an embodiment of the present invention, when SSD is considered.

FIG. 37 is a view illustrating the first scenario S1 among the combinations of interleavers according to an embodiment of the present invention, when SSD is considered.

In this figure, (a) illustrates a combination of interleavers according to the conventional technology. This structure includes a cell interleaver, a rotation & I/Q interleaver, a type-B block time interleaver, and a frequency interleaver. Each interleaver is an interleaver according to the conventional technology.

In this figure, (b) illustrates an interleaving structure according to the first scenario.

The interleaving structure of the first scenario may include a type-B cell interleaver, a constellation rotation block, a Q1/Q2 delay block, a type-A I/Q interleaver, a type-B block time interleaver, and/or a pair-wise frequency interleaver. Here, the pair-wise frequency interleaver may be the above-described new frequency interleaver.

A description of operation of the type-B cell interleaver has been given above.

The constellation rotation block may rotate constellations by a rotation angle.

A description of operation of the Q1/Q2 delay block has been given above.

The type-A I/Q interleaver operates as described above, and may maximize the distance between I components and Q components, i.e., spreading properties. The type-A I/Q interleaver may perform interleaving using different interleaving seeds while maintaining spreading properties for every FEC block as described above.

Descriptions of operations of the type-B block time interleaver and the pair-wise frequency interleaver have been given above. Here, the pair-wise frequency interleaver may be the above-described new frequency interleaver.

The interleaving structure according to the conventional technology is now compared to the interleaving structure according to the first scenario.

In the interleaving structure according to the conventional technology, the cell interleaver operates using different random interleaving seeds for FEC blocks, and 2 memories each corresponding to the length of an input FEC block are required to perform deinterleaving corresponding thereto. In addition, the rotation & I/Q interleaver block operates using one interleaving seed, and 1 memory corresponding to the length of the input FEC block is required to perform deinterleaving corresponding thereto. Consequently, 3 memories each corresponding to the length of the input FEC block are required to perform cell deinterleaving and I/Q deinterleaving & derotation.

Furthermore, in the interleaving structure according to the conventional technology, the pair-wise frequency interleaver may perform random interleaving by simultaneously writing and reading input OFDM symbols in and from a memory. The receiver requires 1 memory corresponding to the length of the input FEC block, to perform deinterleaving corresponding thereto. In this case, in a static channel environment, reception performance of physical layer pipes (PLPs) transmitted through a specific frequency bin having poor channel state is always degraded.

However, in the first scenario, since the type-B cell interleaver performs random interleaving by simultaneously performing the write operation and the read operation, the receiver may require 1 memory corresponding to the length of an input FEC block, to perform deinterleaving corresponding thereto. In addition, the Q1/Q2 delay block and the type-A I/Q interleaver operate using a different interleaving seed for each FEC block, and the receiver may require 1 memory corresponding to the length of the input FEC block, to perform deinterleaving corresponding thereto. Consequently, the receiver may require 2 memories each corresponding to the length of the input FEC block. Accordingly, memory may be used more efficiently compared to the interleaving structure according to the conventional technology.

Furthermore, in the first scenario, the pair-wise frequency interleaver corresponds to the above-described new frequency interleaver, and this new frequency interleaver may operate using a different interleaving seed for each input OFDM symbol. The receiver may require 1 memory corresponding to the length of an input OFDM symbol, to perform deinterleaving corresponding thereto. Consequently, since a different interleaving seed is applied to each OFDM symbol, the above-described problem of the interleaving structure according to the conventional technology in a static channel environment may be solved.

Figure 38:
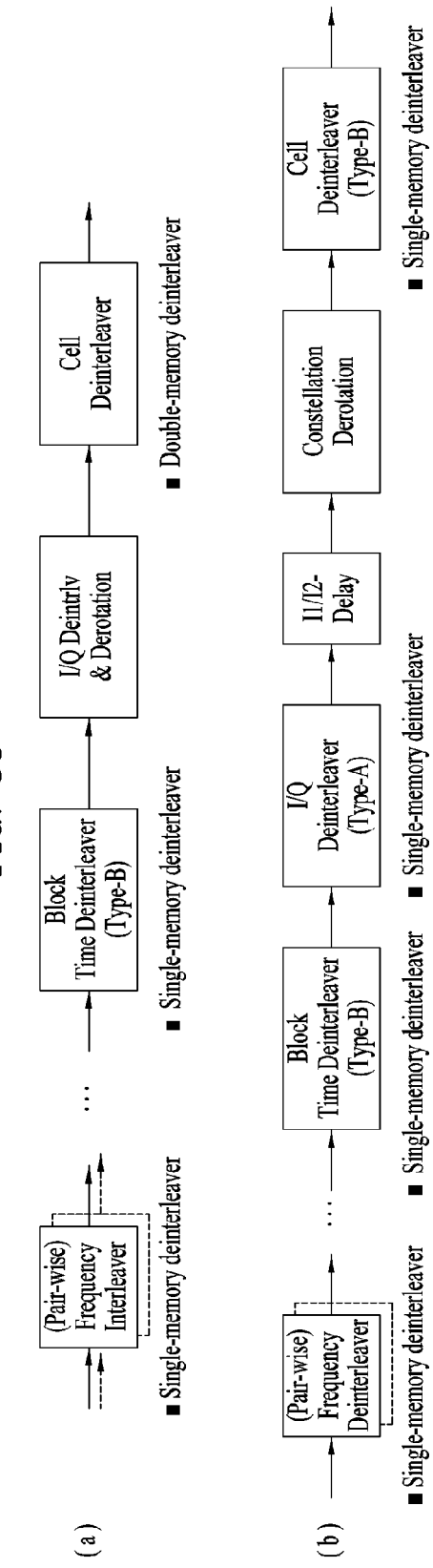
FIG. 38 is a view illustrating the first scenario S1 among the combinations of interleavers according to an embodiment of the present invention, when SSD is considered.

FIG. 38 is a view illustrating the first scenario S1 among the combinations of interleavers according to an embodiment of the present invention, when SSD is considered.

In this figure, (a) illustrates a combination of deinterleavers according to the conventional technology. This structure includes a frequency deinterleaver, a type-B block time deinterleaver, an I/Q deinterleaver & derotation block, and a cell deinterleaver. Each deinterleaver is a deinterleaver according to the conventional technology.

In this figure, (b) illustrates a deinterleaving structure according to the first scenario.

Descriptions of operations of a pair-wise frequency deinterleaver and a type-B block time deinterleaver have been given above. Here, the pair-wise frequency deinterleaver may perform an inverse operation of the above-described new frequency interleaver.

After that, a type-A I/Q deinterleaver may perform an inverse operation of the type-A I/Q interleaver.

An I1/I2 delay block splits complex symbols into I components and Q components, and delays only the I components. A delay value may vary based on dimensions of SSD. The I components may be delayed by 1 cell for 2D SSD, or delayed by 2 cells for 4D SSD.

A constellation derotation block may derotate constellations rotated by the transmitter, to original positions thereof.

A description of operation of a type-B cell deinterleaver has been given above.

Figure 39:
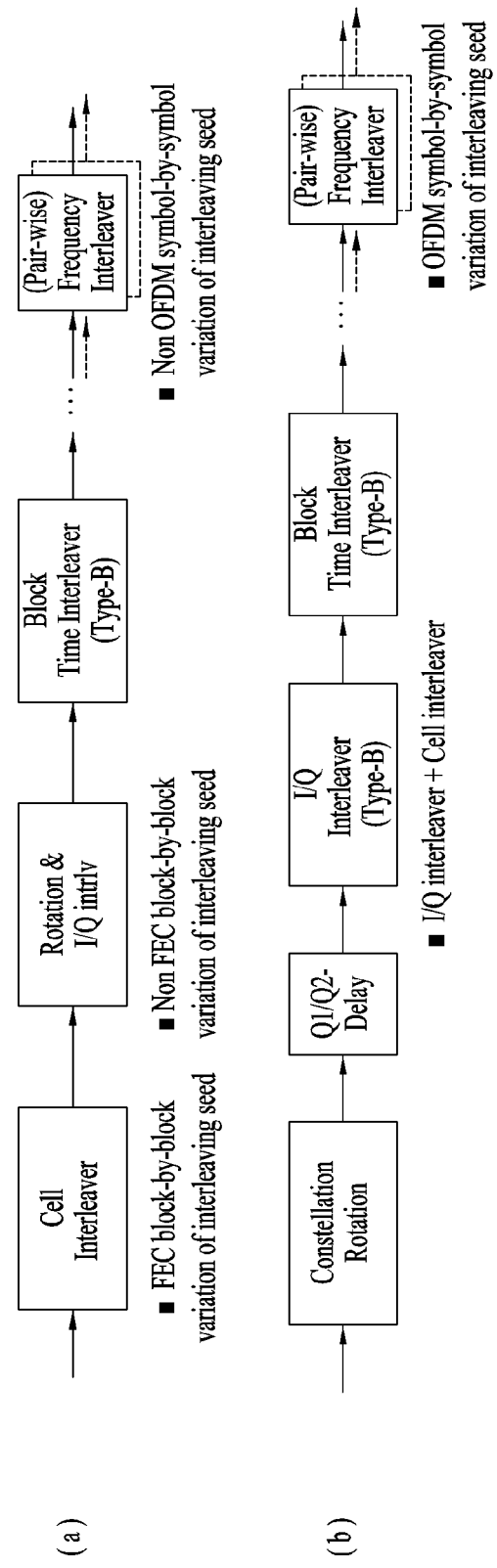
FIG. 39 is a view illustrating a second scenario S2 among the combinations of interleavers according to an embodiment of the present invention, when SSD is considered.

FIG. 39 is a view illustrating the second scenario S2 among the combinations of interleavers according to an embodiment of the present invention, when SSD is considered.

In this figure, (a) illustrates a combination of interleavers according to the conventional technology. This structure includes a cell interleaver, a rotation & I/Q interleaver, a type-B block time interleaver, and a frequency interleaver. Each interleaver is an interleaver according to the conventional technology.

In this figure, (b) illustrates an interleaving structure according to the second scenario. Unlike the interleaving structure according to the first scenario, the interleaving structure according to the second scenario may not use a cell interleaver.

Descriptions of operations of a constellation rotation block and a Q1/Q2 delay block have been given above.

A type-B I/Q interleaver operates as described above, and may maximize the distance between I components and Q components, i.e., spreading properties. The type-B I/Q interleaver may perform interleaving using different interleaving seeds while maintaining spreading properties for every FEC block as described above. The type-B I/Q interleaver may also serve as a cell interleaver for randomly permuting cells. That is, the type-B I/Q interleaver may serve simultaneously as a cell interleaver and an I/Q interleaver.

Descriptions of operations of a type-B block time interleaver and a pair-wise frequency interleaver have been given above. Here, the pair-wise frequency interleaver may be the above-described new frequency interleaver.

The interleaving structure according to the conventional technology is now compared to the interleaving structure according to the second scenario.

As described above, in the interleaving structure according to the conventional technology, the receiver requires 3 memories each corresponding to the length of an input FEC block, to perform cell deinterleaving and I/Q deinterleaving & derotation. Furthermore, in the interleaving structure according to the conventional technology, in a static channel environment, reception performance of PLPs transmitted through a specific frequency bin having poor channel state is always degraded.

However, in the second scenario, a cell interleaver is not used. In addition, the Q1/Q2 delay block and the type-B I/Q interleaver operate using a different random interleaving seed for each FEC block, and 2 memories each corresponding to the length of an input FEC block may be required to perform deinterleaving corresponding thereto. Consequently, the receiver may require 2 memories each corresponding to the length of the input FEC block. Accordingly, memory may be used more efficiently compared to the interleaving structure according to the conventional technology.

Furthermore, like the interleaving structure according to the first scenario, in the interleaving structure according to the second scenario, the above-described new frequency interleaver may be used as the pair-wise frequency interleaver. Accordingly, since a different interleaving seed is applied to each OFDM symbol, the above-described problem of the interleaving structure according to the conventional technology in a static channel environment may be solved.

Figure 40:
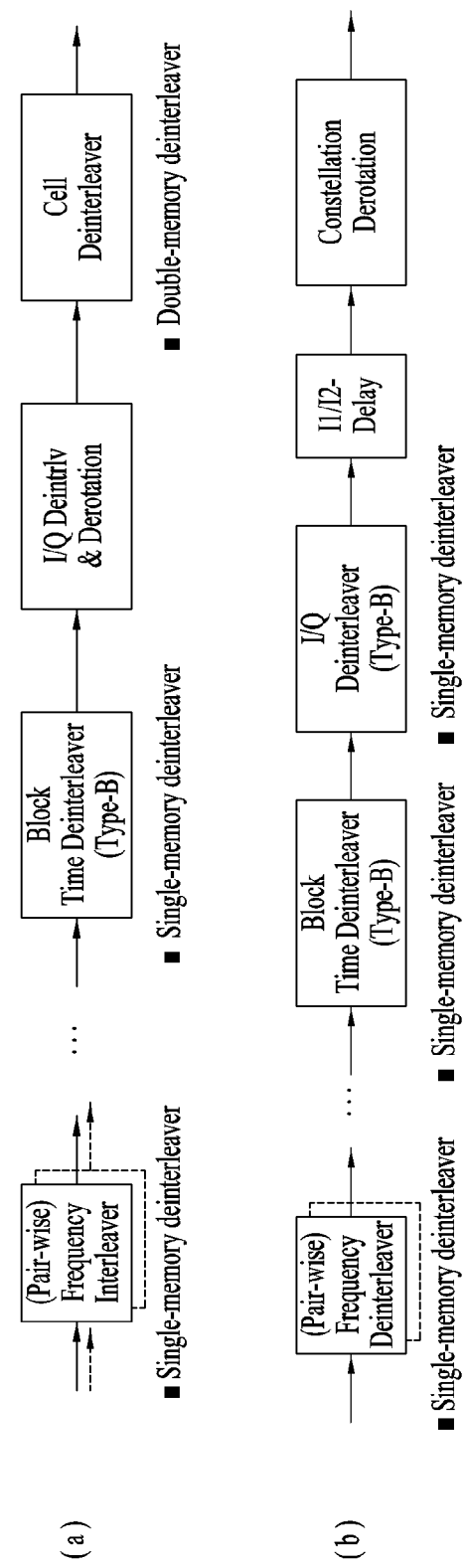
FIG. 40 is a view illustrating the second scenario S2 among the combinations of interleavers according to an embodiment of the present invention, when SSD is considered.

FIG. 40 is a view illustrating the second scenario S2 among the combinations of interleavers according to an embodiment of the present invention, when SSD is considered.

In this figure, (a) illustrates a combination of deinterleavers according to the conventional technology. This structure includes a frequency deinterleaver, a type-B block time deinterleaver, an I/Q deinterleaver & derotation block, and a cell deinterleaver. Each deinterleaver is a deinterleaver according to the conventional technology.

In this figure, (b) illustrates a deinterleaving structure according to the second scenario.

Descriptions of operations of a pair-wise frequency deinterleaver and a type-B block time deinterleaver have been given above. Here, the pair-wise frequency deinterleaver may perform an inverse operation of the above-described new frequency interleaver.

After that, a type-B I/Q deinterleaver may perform an inverse operation of the type-B I/Q interleaver. The type-B I/Q deinterleaver may randomly generate an interleaving seed and thus perform deinterleaving using a double memory.

Descriptions of operations of an I1/I2 delay block and a constellation derotation block have been given above.

Figure 41:
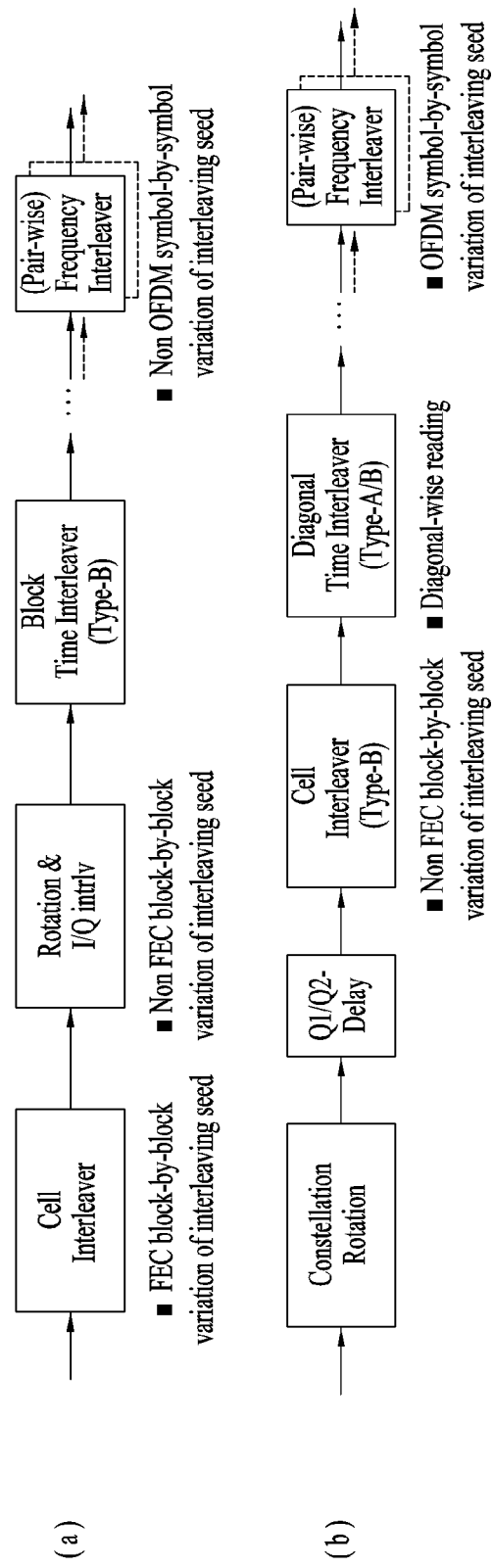
FIG. 41 is a view illustrating a third scenario S3 among the combinations of interleavers according to an embodiment of the present invention, when SSD is considered.

FIG. 41 is a view illustrating the third scenario S3 among the combinations of interleavers according to an embodiment of the present invention, when SSD is considered.

In this figure, (a) illustrates a combination of interleavers according to the conventional technology. This structure includes a cell interleaver, a rotation & I/Q interleaver, a type-B block time interleaver, and a frequency interleaver. Each interleaver is an interleaver according to the conventional technology.

In this figure, (b) illustrates an interleaving structure according to the third scenario. The interleaving structure according to the third scenario may not use an I/Q interleaver.

Descriptions of operations of a constellation rotation block, a Q1/Q2 delay block, a type-B cell interleaver, a type-A or type-B diagonal time interleaver, and a pair-wise frequency interleaver have been given above. Here, the pair-wise frequency interleaver may be the above-described new frequency interleaver.

As described above, the type-A or type-B diagonal time interleaver may perform column-wise write operation and diagonal-wise read operation. Here, the type-A or type-B diagonal time interleaver may partially serve as a cell interleaver for permuting cells located at different positions of each FEC block, and partially serve as an I/Q interleaver for increasing the distance between I components and Q components, using a diagonal-wise reading scheme.

The interleaving structure according to the conventional technology is now compared to the interleaving structure according to the third scenario.

As described above, in the interleaving structure according to the conventional technology, the receiver requires 3 memories each corresponding to the length of an input FEC block and reception performance of PLPs is degraded in a static channel environment.

However, in the third scenario, since the type-B cell interleaver performs random interleaving by simultaneously performing write operation and read operation, the receiver may require 1 memory corresponding to the length of an input FEC block, to perform deinterleaving corresponding thereto. Consequently, memory may be used much more efficiently compared to the interleaving structure according to the conventional technology.

Furthermore, like the interleaving structure according to the first scenario, in the interleaving structure according to the third scenario, the above-described new frequency interleaver may be used as the pair-wise frequency interleaver. Accordingly, since a different interleaving seed is applied to each OFDM symbol, the above-described problem of the interleaving structure according to the conventional technology in a static channel environment may be solved.

In addition, since the diagonal time interleaver may partially serve as a cell interleaver and partially serve as an I/Q interleaver by performing diagonal-wise read operation, distance adjustment due to a restricted function of the type-B cell interleaver and the absence of an I/Q interleaver may be supplemented.

Figure 42:
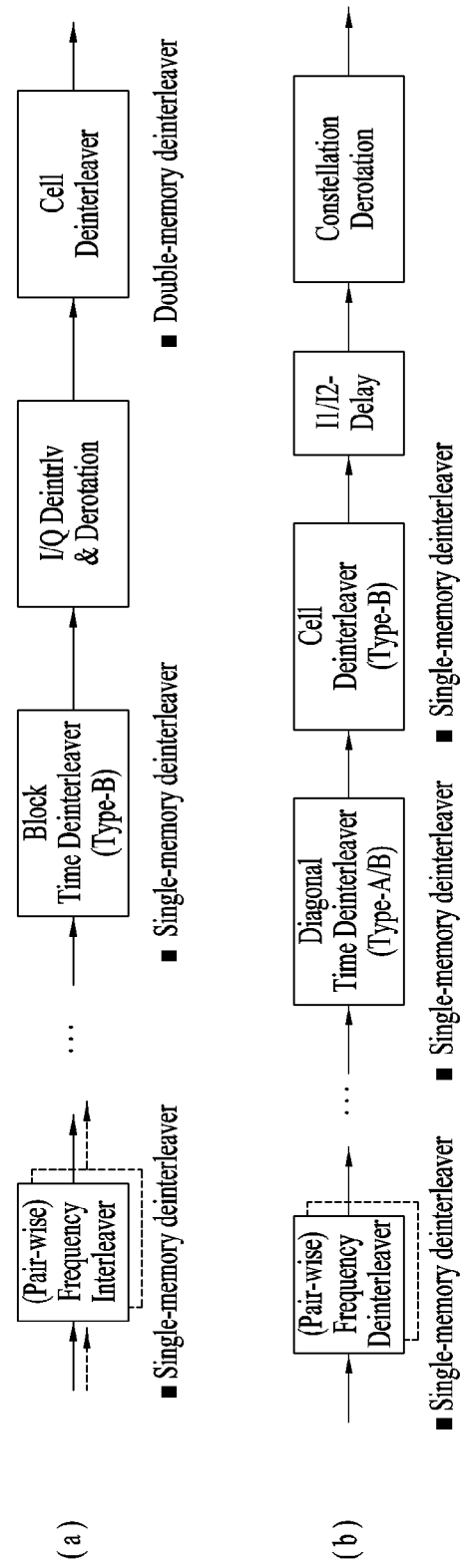
FIG. 42 is a view illustrating the third scenario S3 among the combinations of interleavers according to an embodiment of the present invention, when SSD is considered.

FIG. 42 is a view illustrating the third scenario S3 among the combinations of interleavers according to an embodiment of the present invention, when SSD is considered.

In this figure, (a) illustrates a combination of deinterleavers according to the conventional technology. This structure includes a frequency deinterleaver, a type-B block time deinterleaver, an I/Q deinterleaver & derotation block, and a cell deinterleaver. Each deinterleaver is a deinterleaver according to the conventional technology.

In this figure, (b) illustrates a deinterleaving structure according to the third scenario.

Descriptions of operations of a pair-wise frequency deinterleaver, a type-B cell deinterleaver, an I1/I2 delay block, and a constellation derotation block have been given above. Here, the pair-wise frequency deinterleaver may perform an inverse operation of the above-described new frequency interleaver.

A type-A or type-B diagonal time deinterleaver may perform an inverse operation of the type-A or type-B diagonal time interleaver. The type-A or type-B diagonal time deinterleaver may deinterleave input symbols interleaved in the time domain, to original positions thereof. In this case, time deinterleaving may be performed using a single memory.

Figure 43:
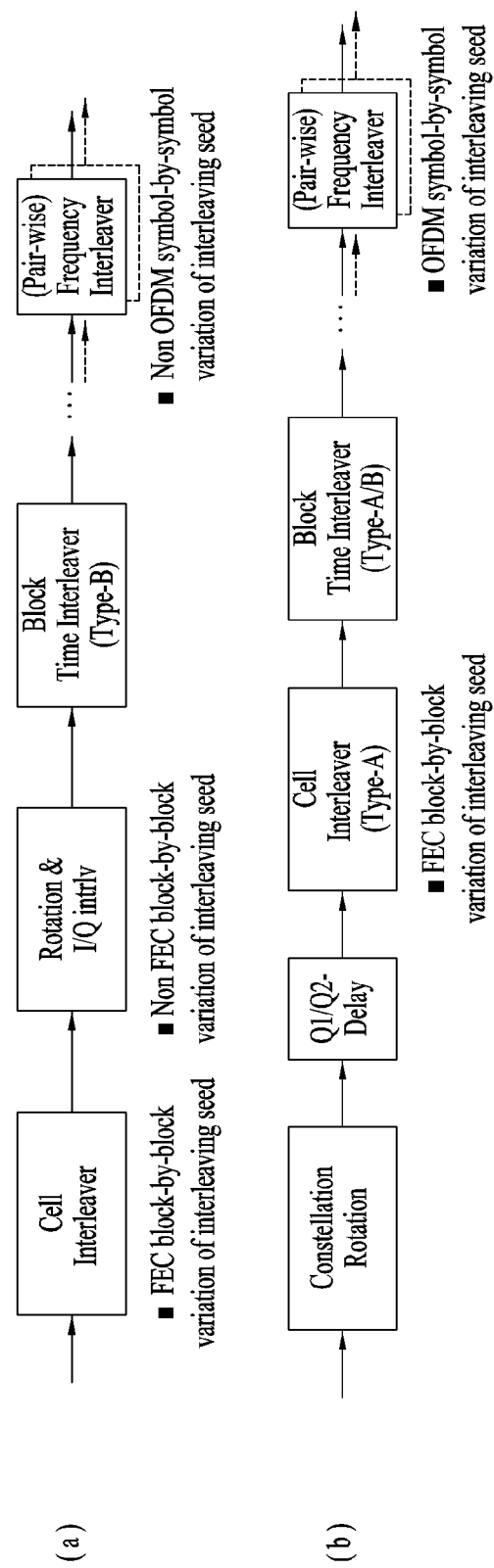
FIG. 43 is a view illustrating a fourth scenario S4 among the combinations of interleavers according to an embodiment of the present invention, when SSD is considered.

FIG. 43 is a view illustrating the fourth scenario S4 among the combinations of interleavers according to an embodiment of the present invention, when SSD is considered.

In this figure, (a) illustrates a combination of interleavers according to the conventional technology. This structure includes a cell interleaver, a rotation & I/Q interleaver, a type-B block time interleaver, and a frequency interleaver. Each interleaver is an interleaver according to the conventional technology.

In this figure, (b) illustrates an interleaving structure according to the fourth scenario. Unlike the interleaving structure according to the first scenario, the interleaving structure according to the fourth scenario may not use an I/Q interleaver.

Descriptions of operations of a constellation rotation block, a Q1/Q2 delay block, a type-A cell interleaver, a type-A or type-B block time interleaver, and a pair-wise frequency interleaver have been given above. Here, the pair-wise frequency interleaver may be the above-described new frequency interleaver.

The interleaving structure according to the conventional technology is now compared to the interleaving structure according to the fourth scenario.

As described above, in the interleaving structure according to the conventional technology, the receiver requires 3 memories each corresponding to the length of an input FEC block and reception performance of PLPs is degraded in a static channel environment.

However, in the fourth scenario, the receiver may require 1 memory corresponding to the length of an input FEC block, to perform deinterleaving corresponding to the type-A cell interleaver. Accordingly, memory may be used much more efficiently compared to the interleaving structure according to the conventional technology.

Furthermore, like the interleaving structure according to the first scenario, in the interleaving structure according to the fourth scenario, the above-described new frequency interleaver may be used as the pair-wise frequency interleaver. Accordingly, since a different interleaving seed is applied to each OFDM symbol, the above-described problem of the interleaving structure according to the conventional technology in a static channel environment may be solved.

Figure 44:
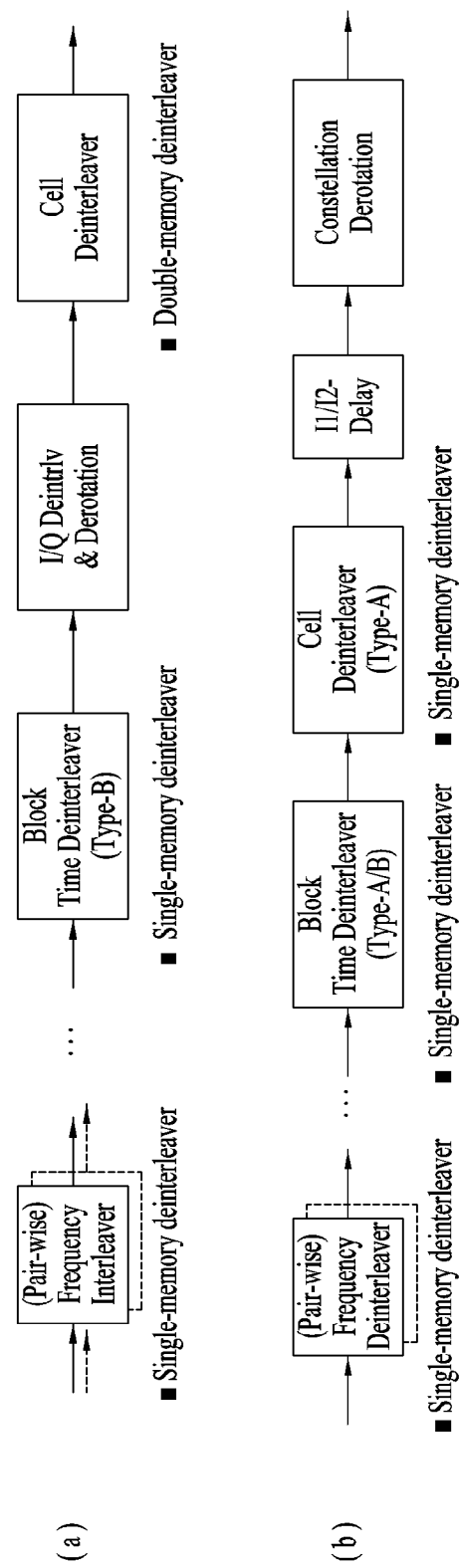
FIG. 44 is a view illustrating the fourth scenario S4 among the combinations of interleavers according to an embodiment of the present invention, when SSD is considered.

FIG. 44 is a view illustrating the fourth scenario S4 among the combinations of interleavers according to an embodiment of the present invention, when SSD is considered.

In this figure, (a) illustrates a combination of deinterleavers according to the conventional technology. This structure includes a frequency deinterleaver, a type-B block time deinterleaver, an I/Q deinterleaver & derotation block, and a cell deinterleaver. Each deinterleaver is a deinterleaver according to the conventional technology.

In this figure, (b) illustrates a deinterleaving structure according to the fourth scenario.

Descriptions of operations of a pair-wise frequency deinterleaver, a type-A or type-B block time deinterleaver, a type-A cell deinterleaver, an I1/I2 delay block, and a constellation derotation block have been given above. Here, the pair-wise frequency deinterleaver may perform an inverse operation of the above-described new frequency interleaver.

Figure 45:
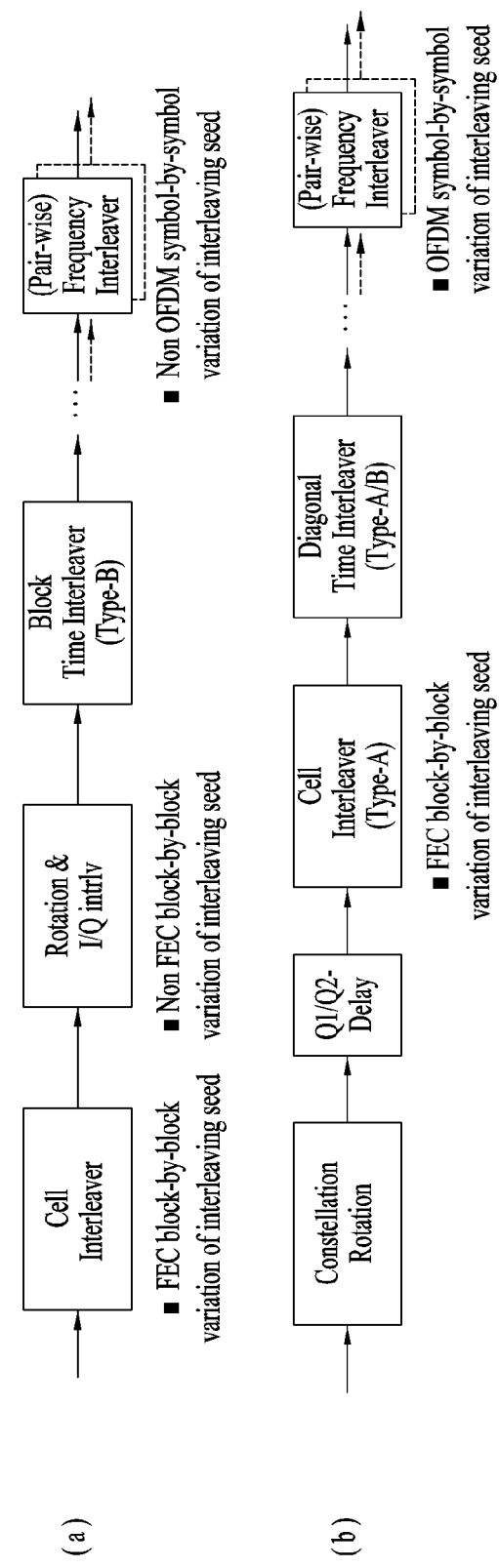
FIG. 45 is a view illustrating a fifth scenario S5 among the combinations of interleavers according to an embodiment of the present invention, when SSD is considered.

FIG. 45 is a view illustrating the fifth scenario S5 among the combinations of interleavers according to an embodiment of the present invention, when SSD is considered.

In this figure, (a) illustrates a combination of interleavers according to the conventional technology. This structure includes a cell interleaver, a rotation & I/Q interleaver, a type-B block time interleaver, and a frequency interleaver. Each interleaver is an interleaver according to the conventional technology.

In this figure, (b) illustrates an interleaving structure according to the fifth scenario. Unlike the interleaving structure according to the first scenario, the interleaving structure according to the fifth scenario may not use an I/Q interleaver.

Descriptions of operations of a constellation rotation block, a Q1/Q2 delay block, a type-A cell interleaver, a type-A or type-B diagonal time interleaver, and a pair-wise frequency interleaver have been given above. Here, the pair-wise frequency interleaver may be the above-described new frequency interleaver.

The interleaving structure according to the conventional technology is now compared to the interleaving structure according to the fifth scenario.

As described above, in the interleaving structure according to the conventional technology, the receiver requires 3 memories each corresponding to the length of an input FEC block and reception performance of PLPs is degraded in a static channel environment.

However, like the fourth scenario, in the fifth scenario, since the type-A cell interleaver is used, the receiver may require only 1 memory corresponding to the length of an input FEC block. Accordingly, memory may be used more efficiently compared to the interleaving structure according to the conventional technology.

Furthermore, like the interleaving structure according to the first scenario, in the interleaving structure according to the fifth scenario, since the above-described new frequency interleaver is used as the pair-wise frequency interleaver, the above-described problem caused in a static channel environment may be solved.

Figure 46:
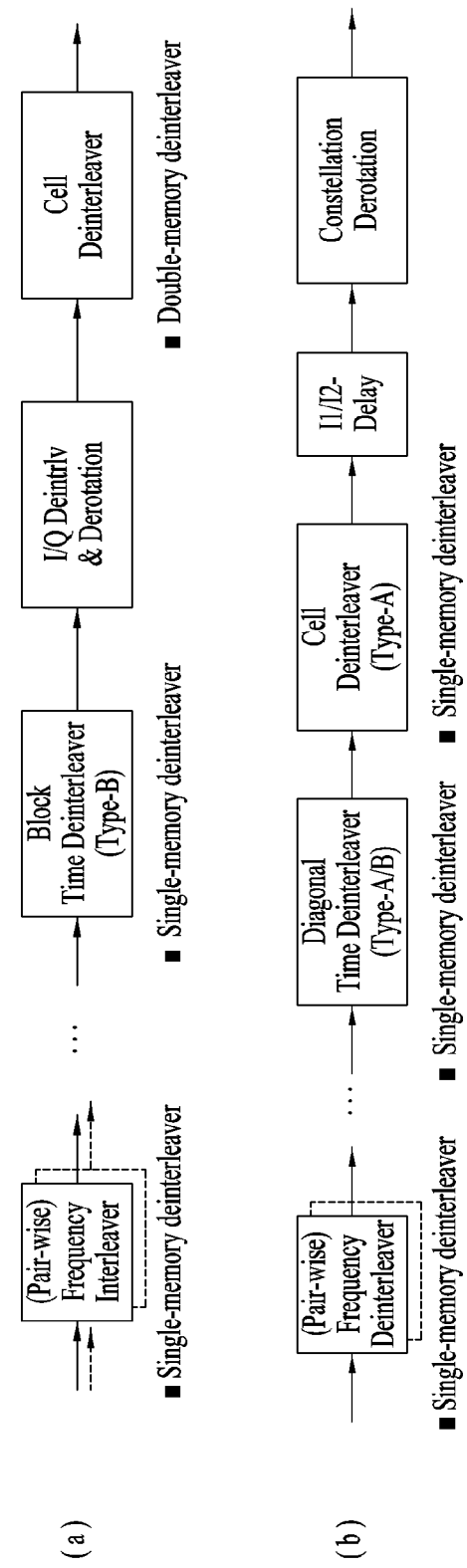
FIG. 46 is a view illustrating the fifth scenario S5 among the combinations of interleavers according to an embodiment of the present invention, when SSD is considered.

FIG. 46 is a view illustrating the fifth scenario S5 among the combinations of interleavers according to an embodiment of the present invention, when SSD is considered.

In this figure, (a) illustrates a combination of deinterleavers according to the conventional technology. This structure includes a frequency deinterleaver, a type-B block time deinterleaver, an I/Q deinterleaver & derotation block, and a cell deinterleaver. Each deinterleaver is a deinterleaver according to the conventional technology.

In this figure, (b) illustrates a deinterleaving structure according to the fifth scenario.

Descriptions of operations of a pair-wise frequency deinterleaver, a type-A or type-B diagonal time deinterleaver, a type-A cell deinterleaver, an I1/I2 delay block, and a constellation derotation block have been given above. Here, the pair-wise frequency deinterleaver may perform an inverse operation of the above-described new frequency interleaver.

Figure 47:
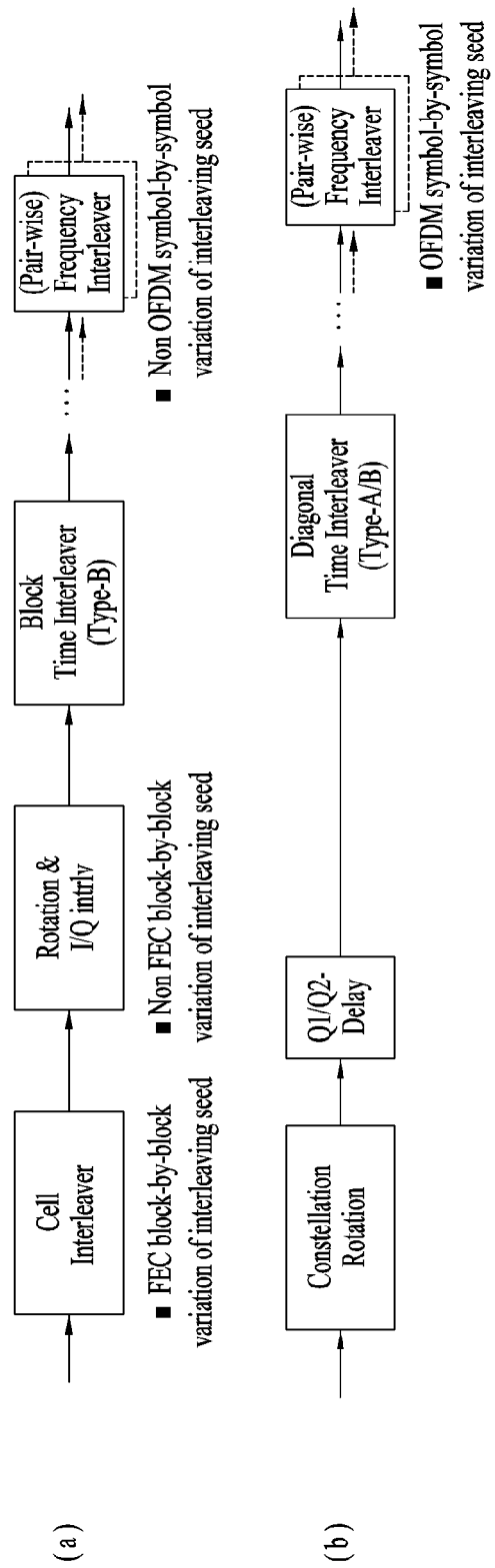
FIG. 47 is a view illustrating a sixth scenario S6 among the combinations of interleavers according to an embodiment of the present invention, when SSD is considered.

FIG. 47 is a view illustrating the sixth scenario S6 among the combinations of interleavers according to an embodiment of the present invention, when SSD is considered.

In this figure, (a) illustrates a combination of interleavers according to the conventional technology. This structure includes a cell interleaver, a rotation & I/Q interleaver, a type-B block time interleaver, and a frequency interleaver. Each interleaver is an interleaver according to the conventional technology.

In this figure, (b) illustrates an interleaving structure according to the sixth scenario. Unlike the interleaving structure according to the first scenario, the interleaving structure according to the sixth scenario may not use a cell interleaver and an I/Q interleaver.

Descriptions of operations of a constellation rotation block, a Q1/Q2 delay block, a type-A or type-B diagonal time interleaver, and a pair-wise frequency interleaver have been given above. Here, the pair-wise frequency interleaver may be the above-described new frequency interleaver.

The interleaving structure according to the conventional technology is now compared to the interleaving structure according to the sixth scenario.

As described above, in the interleaving structure according to the conventional technology, the receiver requires 3 memories each corresponding to the length of an input FEC block and reception performance of PLPs is degraded in a static channel environment.

However, in the sixth scenario, the functions of a cell interleaver and an I/Q interleaver may be performed by the diagonal time interleaver. Accordingly, use of memory by the receiver may be maximized.

Furthermore, in the interleaving structure according to the sixth scenario, since the above-described new frequency interleaver is used as the pair-wise frequency interleaver, the above-described problem caused in a static channel environment may be solved.

Figure 48:
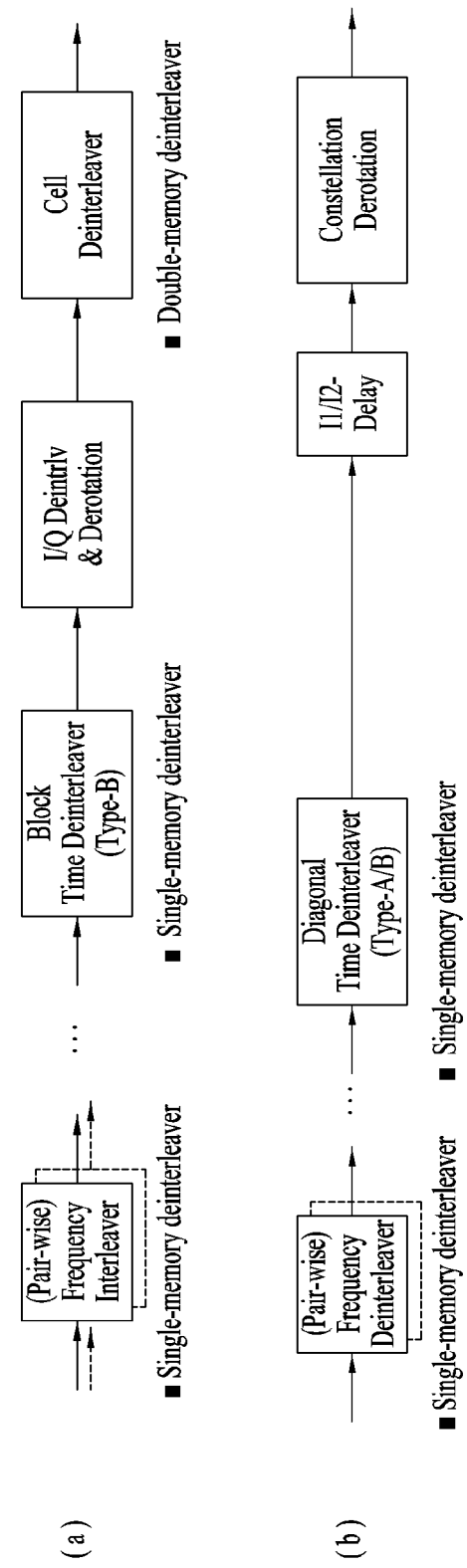
FIG. 48 is a view illustrating the sixth scenario S6 among the combinations of interleavers according to an embodiment of the present invention, when SSD is considered.

FIG. 48 is a view illustrating the sixth scenario S6 among the combinations of interleavers according to an embodiment of the present invention, when SSD is considered.

In this figure, (a) illustrates a combination of deinterleavers according to the conventional technology. This structure includes a frequency deinterleaver, a type-B block time deinterleaver, an I/Q deinterleaver & derotation block, and a cell deinterleaver. Each deinterleaver is a deinterleaver according to the conventional technology.

In this figure, (b) illustrates a deinterleaving structure according to the sixth scenario.

Descriptions of operations of a pair-wise frequency deinterleaver, a type-A or type-B diagonal time deinterleaver, an I1/I2 delay block, and a constellation derotation block have been given above. Here, the pair-wise frequency deinterleaver may perform an inverse operation of the above-described new frequency interleaver.

Figure 49:
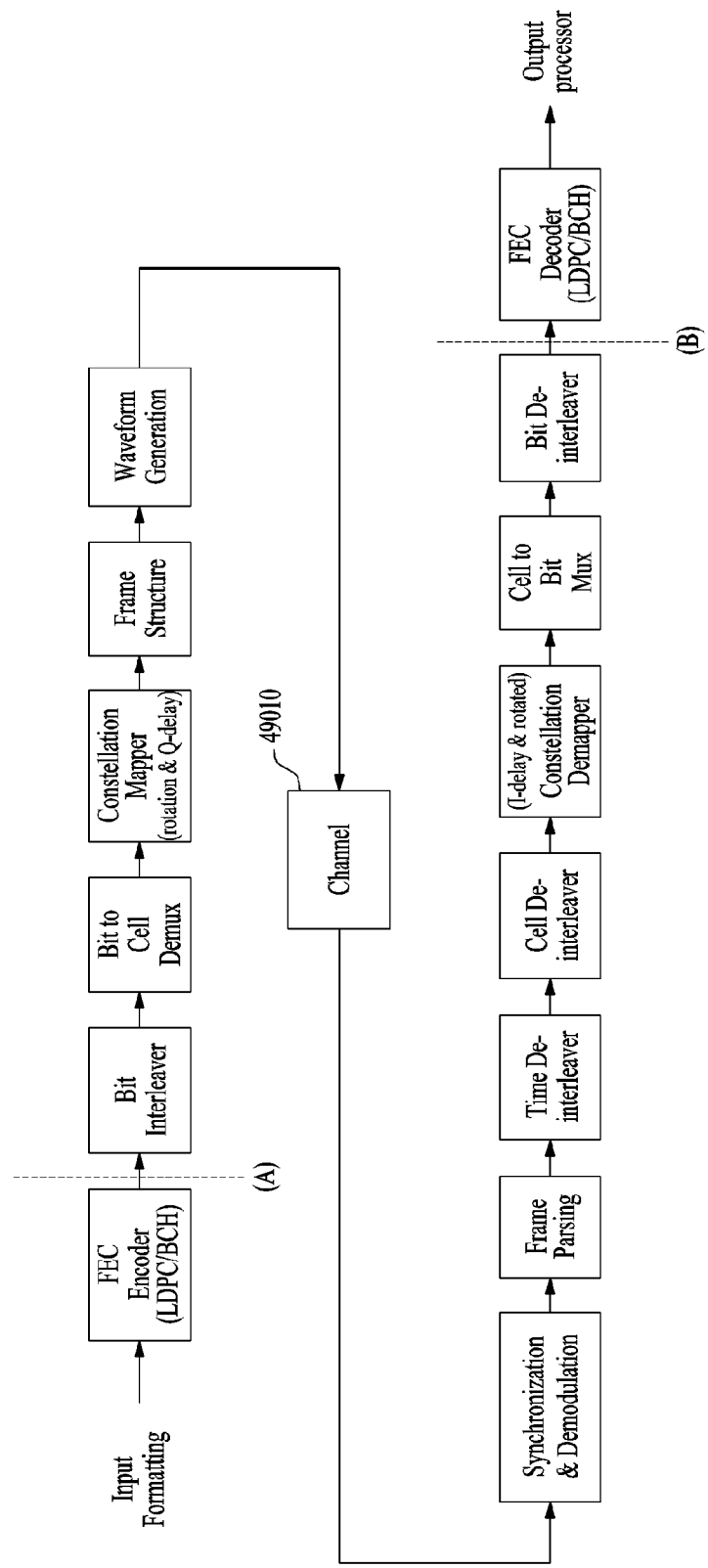
FIG. 49 is a block diagram of a transmitter and a receiver connected to each other, according to an embodiment of the present invention.

FIG. 49 is a block diagram of a transmitter and a receiver connected to each other, according to an embodiment of the present invention.

Descriptions of operations of blocks such as an FEC encoder have been given above. A channel block 49010 may be a block in which a transmitted signal is distorted and noise is added.

In this figure, a signal at point (A) may be a bit signal. A signal at point (B) may be a received bit signal or information related to the bit signal. The information related to the bit signal may include a log likelihood ratio (LLR). The correlation between the signals of points (A) and (B) may be lost as the signals pass through a plurality of blocks between the two points. Specifically, the correlation between the signals of points (A) and (B) may be lost as the signals pass through a bit interleaver and a bit deinterleaver. Since the correlation between the signals is lost, bits may be regarded as being transmitted and received via independent channels. Accordingly, the signals of points (A) and (B) may be independent of each other.

A bit to cell demux block may map a preset group of bits to one cell. In this case, the amount of information transmitted from point (A) to point (B) may vary based on a mapping scheme of a constellation mapper. The amount of transmitted information may be called a capacity, and may indicate the number of bits transmittable per cell. According to another embodiment, the bit to cell demux block may be omitted. If the bit to cell demux block is omitted, another block may map bits to a cell.

Since bits of the signals of points (A) and (B) are independent of each other as described above, if a capacity value of each bit is calculated and then the capacity values of all bits are summed, a total capacity may be determined. This total capacity may be called a parallel decoding capacity.

The present invention proposes a new constellation generation method capable of improving performance in terms of parallel decoding capacity. In addition, the present invention relates to the structure and a method of the bit to cell demux and/or the constellation mapper of the above-described coding & modulation module. As described above, according to another embodiment, if the bit to cell demux block is omitted, the present invention relates to the structure and a method of the other block for mapping bits to a cell, and/or the constellation mapper. Furthermore, the present invention proposes a new constellation mapping method capable of increasing a capacity.

Figure 50:
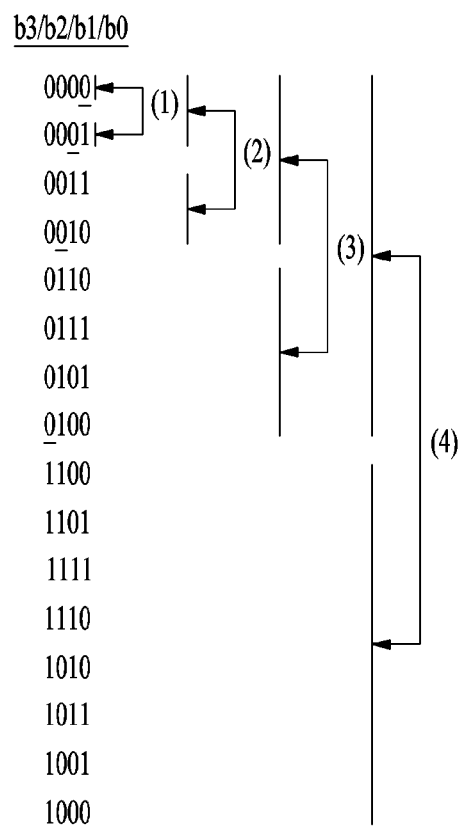
FIG. 50 is a view illustrating binary reflected Gray code (BRGC) and bit package allocation according to an embodiment of the present invention.

FIG. 50 is a view illustrating binary reflected Gray code (BRGC) and bit package allocation according to an embodiment of the present invention.

A description is now given of how to map a group of bits to a constellation. According to the present invention, the order of arranging a group of bits may be determined using BRGC. The current embodiment exemplarily shows the case of 256 QAM.

In this figure, (a) illustrates the order of arranging bits based on BRGC. 256 QAM may be used to transmit a total of 8 bits. Among these 8 bits, 4 bits may be allocated to an I component and the other 4 bits may be allocated to a Q component. The arrangement of the bits allocated to each of the I and Q components may vary based on BRGC.

For example, if locations of 4 bits are denoted by b3/b2/b1/b0, bit b0 may be arranged using a reflection scheme as indicated by (1). For the group of b1/b0, b0 may be arranged using reflection as indicated by (2), and then values 0 and 1 of b1 may be arranged as illustrated in the figure. Likewise, for the group of b2/b1/b0, b1/b0 may be arranged using reflection as indicated by (3) and then the value of b2 may be arranged. Based on the same rule, for the group of b3/b2/b1/b0, b2/b1/b0 may be arranged using reflection as indicated by (4) and then the value of b3 may be arranged.

In this figure, (b) illustrates how a bit package is allocated to 4 bits of each of the I and Q components. If 256 QAM is used, the bit package may have a size of 8 bits. In this figure, bb7/bb6/bb5/bb4/bb3/bb2/bb1/bb0 may be an 8-bit package (a group of original bits) to be allocated to 4 bits of each of the I and Q components. Furthermore, b7/b6/b5/b4/b3/b2/b1/b0 may refer to 4 bits of each of the I and Q components.

For example, the 8-bit package may be allocated to 4 bits of each of the I and Q components using scheme 1), 2), or 3). The 8-bit package may also be allocated using a scheme other than schemes 1), 2), and 3) illustrated in the figure. In scheme 1), bb1 may be connected to b7, bb6 may be connected to b6, bb5 may be connected to b5, bb4 may be connected to b4, bb3 may be connected to b3, bb2 may be connected to b2, bb1 may be connected to b1, and bb0 may be connected to b0. In scheme 2), Bb1 may be connected to b7, bb6 may be connected to b3, bb5 may be connected to b6, bb4 may be connected to b2, bb3 may be connected to b5, bb2 may be connected to b1, bb1 may be connected to b4, and bb0 may be connected to b0.

Figure 51:
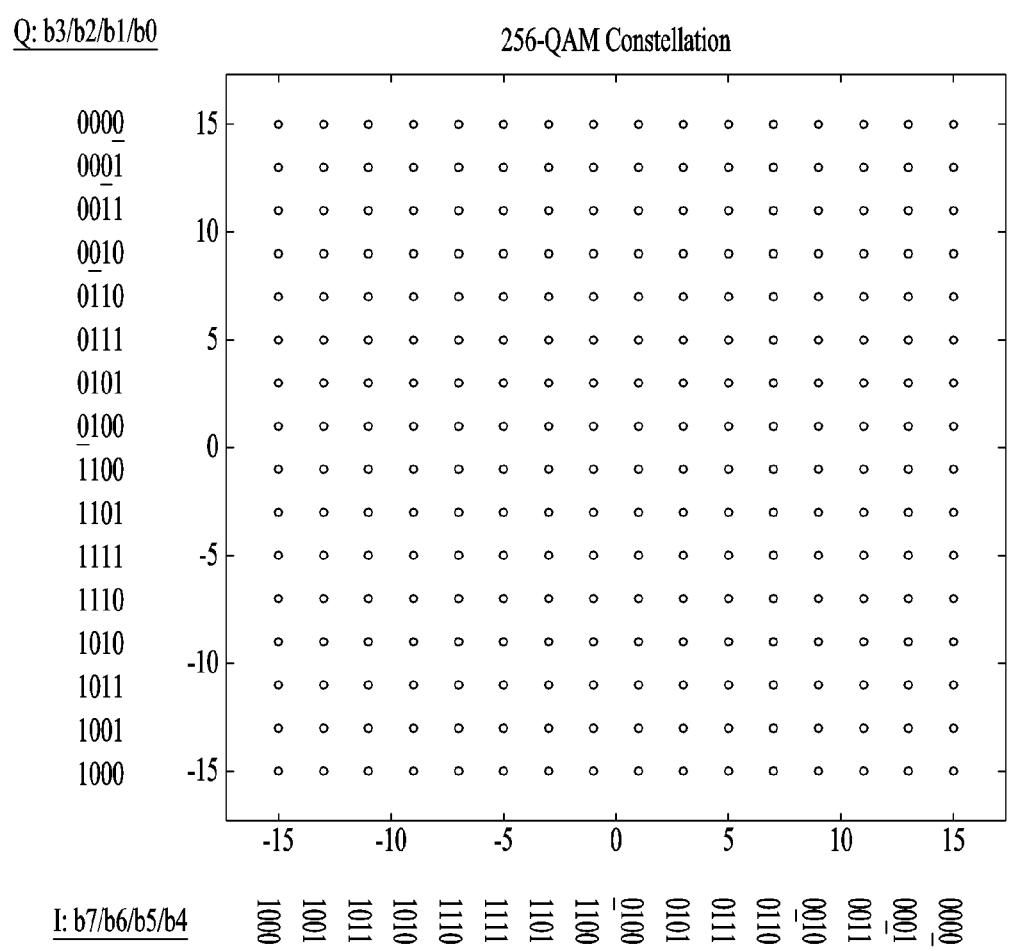
FIG. 51 is a view illustrating a 256 QAM constellation mapping process according to an embodiment of the present invention.

FIG. 51 is a view illustrating a 256 QAM constellation mapping process according to an embodiment of the present invention.

The bits mapped to bits b7 to b0 of the I and Q components may be mapped to a constellation point based on the BRGC rule. Constellation mapping may be performed based on the value of each input bit. Each constellation point of this figure may be a value before average power is normalized to 1. Each of the I and Q components may have values of −15, −13, −11, −9, −7, −5, −3, −1, 1, 3, 5, 7, 9, 11, 13, and 15. A constellation point corresponding to the values of the I and Q components may be determined based on each bit value of b7/b6/b5/b4/b3/b2/b1/b0.

A constellation may refer to a set of constellation points, but a constellation point may be called a constellation in another context.

The present invention proposes a method for improving the above-described constellation mapping process to increase a capacity.

Figure 52:
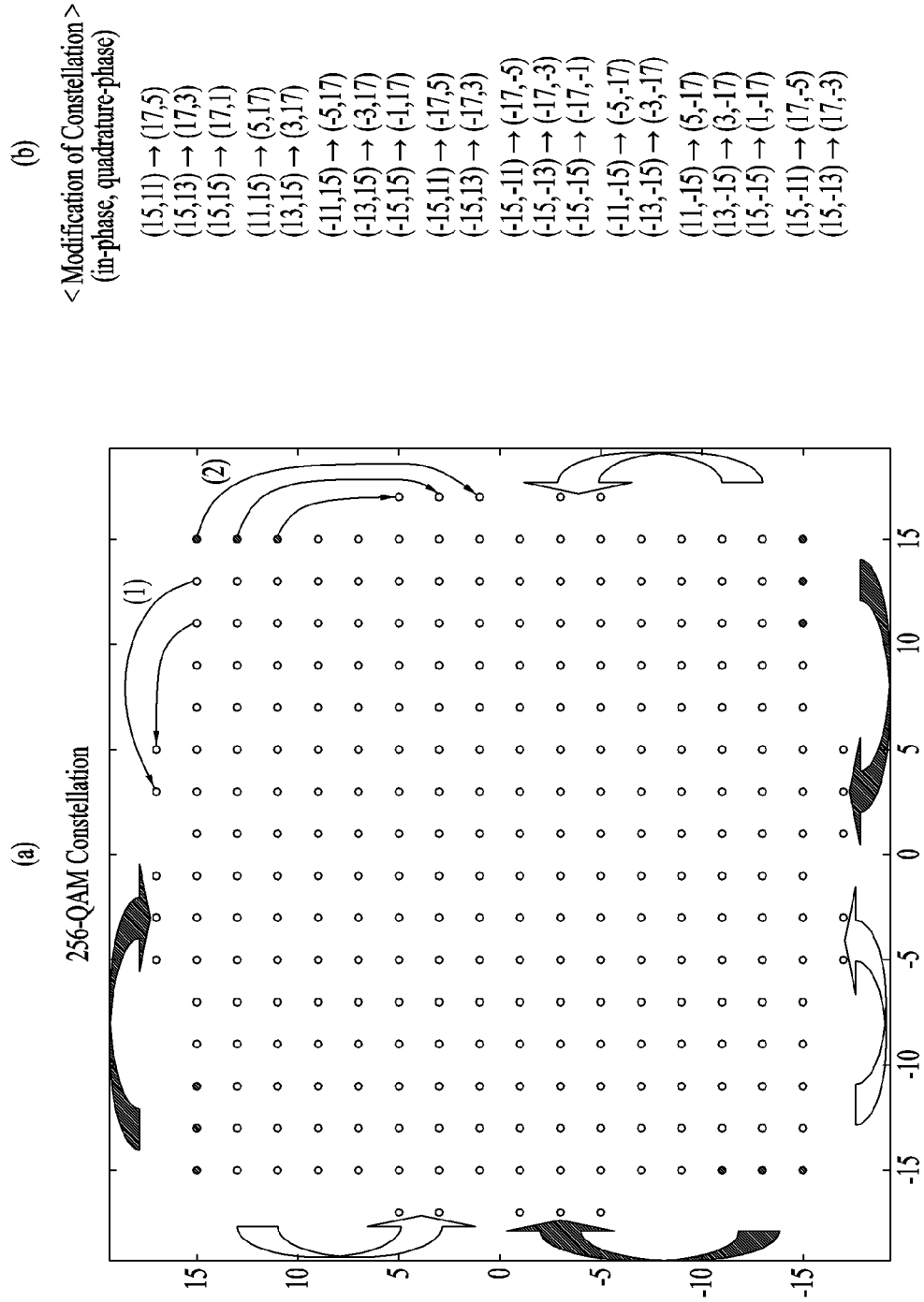
FIG. 52 is a view illustrating a constellation moving method for modified 256 QAM according to an embodiment of the present invention.

FIG. 52 is a view illustrating a constellation moving method for modified 256 QAM according to an embodiment of the present invention.

The constellation moving method may follow rules (1) and (2) of (a) of this figure. Rules (1) and (2) may be equally applied to $2^{nd}/3^{rd}/4^{th}$ quadrants. Here, as indicated by arrows in the figure, the rules of a $1^{st}$ quadrant may be applied by rotating the constellation 90 degrees counterclockwise at a time. As such, square 256 QAM (conventional 256 QAM) may be changed into modified 256 QAM.

In this figure, (b) illustrates the constellation moving method using coordinate values. The coordinate values may be indicated as given by (I component, Q component), and the I component may indicate a horizontal axis while the Q component may indicate a vertical axis. A description of an expression related to this coordinate moving method will be given below.

If the constellation is changed, when average power is normalized to 1, the distance between adjacent constellation points may be increased. Average signal power before normalization may be 170.0 for 256 QAM and 163.5 for modified 256 QAM. Each constellation point may be normalized by dividing the same by the square root of the average signal power. Accordingly, the distance between adjacent constellation points may be the square root of 170.0/163.5, i.e., about 1.019683947. Since the distance between adjacent constellation points is increased, higher robustness to noise may be achieved.

Figure 53:
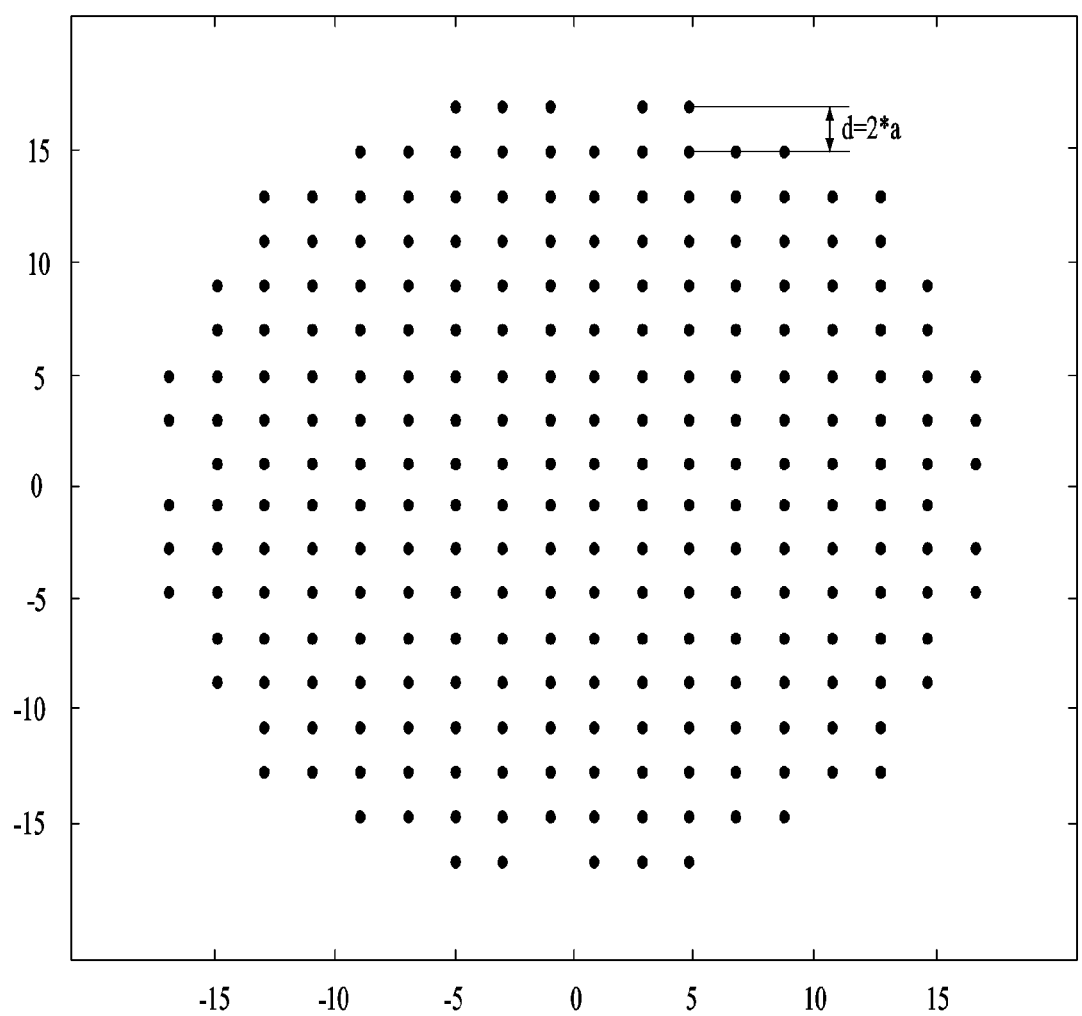
FIG. 53 is a view illustrating a final constellation of modified 256 QAM according to an embodiment of the present invention.

FIG. 53 is a view illustrating a final constellation of modified 256 QAM according to an embodiment of the present invention.

Modified 256 QAM may achieve shaping gain by changing the shape of a constellation.

An expression related to the above-described coordinate moving method may be as given below.

1) $|y|10$ and $((x>14$ and $y>-14)$ or $(x<-14$ and $y<14)):(x,y)\rightarrow(x+(\text{sign of }x)*d, (\text{sign of }y)*16-y)$ 2) $|x|>10$ and $((y<-14$ and $x>-14)$ or $(y>14$ and $x<14)):(x,y)\rightarrow((\text{sign of }x)*16-x, x+(\text{sign of }y)*d)$   Expression 3

In the above expression, d may be 2*a. Here, d may refer to the distance between constellation points as illustrated in the figure. The current embodiment assumes a=1.

Figure 54:
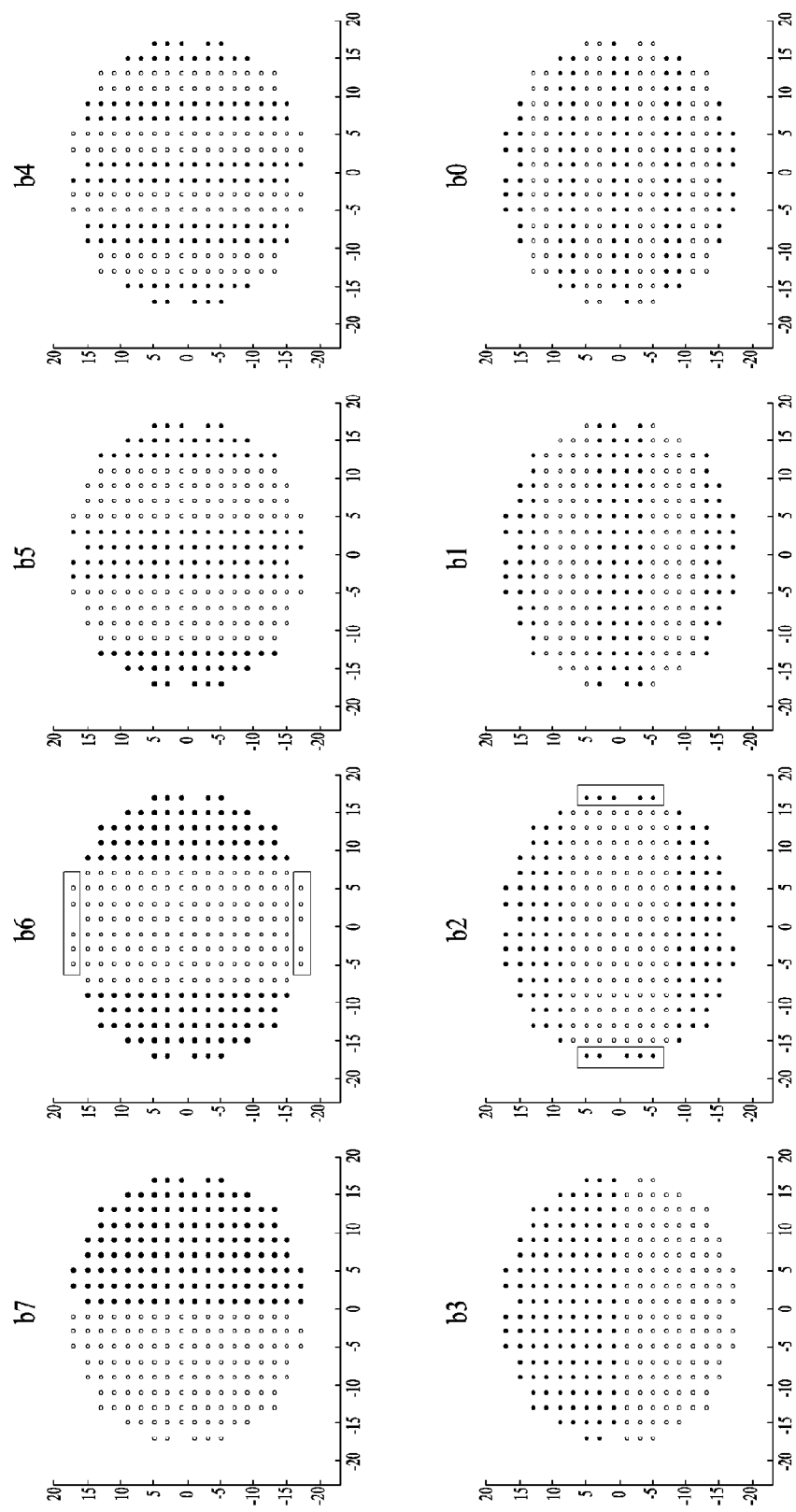
FIG. 54 is a view illustrating constellation points corresponding to 0 and 1 in a modified 256 QAM constellation per bit according to an embodiment of the present invention.

FIG. 54 is a view illustrating constellation points corresponding to 0 and 1 in a modified 256 QAM constellation per bit according to an embodiment of the present invention.

This figure illustrates a modified 256 QAM constellation per bit from the most significant bit (MSB) to the least significant bit (LSB) of each axis, and illustrates constellation points corresponding to values 0 and 1 when the values of each bit are 0 and 1. Allocation of values 0 and 1 of each bit to individual constellation points as described above is called labeling, and a set thereof is called a label. In this figure, a black dot may indicate a constellation point when the bit value is 0, and a white dot may indicate a constellation point when the bit value is 1.

When a log likelihood ratio (LLR) used as input for FEC decoding is calculated, the distribution of 0 and 1 for each bit and the characteristics of the boundary therebetween may influence the LLR value. Accordingly, the performance of FEC decoding may be influenced by the boundary between 0 and 1 of each bit. In this figure, b7 to b0 may be the same as those used in the above description of BRGC and 256 QAM. Accordingly, b7 and b3 may be the MSBs, and b4 and b0 may be the LSBs on two axes.

In the constellations of b6 and b2, constellation points moved when modified 256 QAM is generated (e.g., boxed regions in this figure) may be adjacent to a region of constellation points corresponding to a bit value of 1 (e.g., white dots). This may exert a negative influence on the LLR value of b6 and b2, and thus the performance of FEC decoding may be reduced. Accordingly, compared to conventional 256 QAM, modified 256 QAM may have a good performance period and a bad performance period depending on the amount of noise. In the good performance period, modified 256 QAM may replace conventional 256 QAM.

Figure 55:
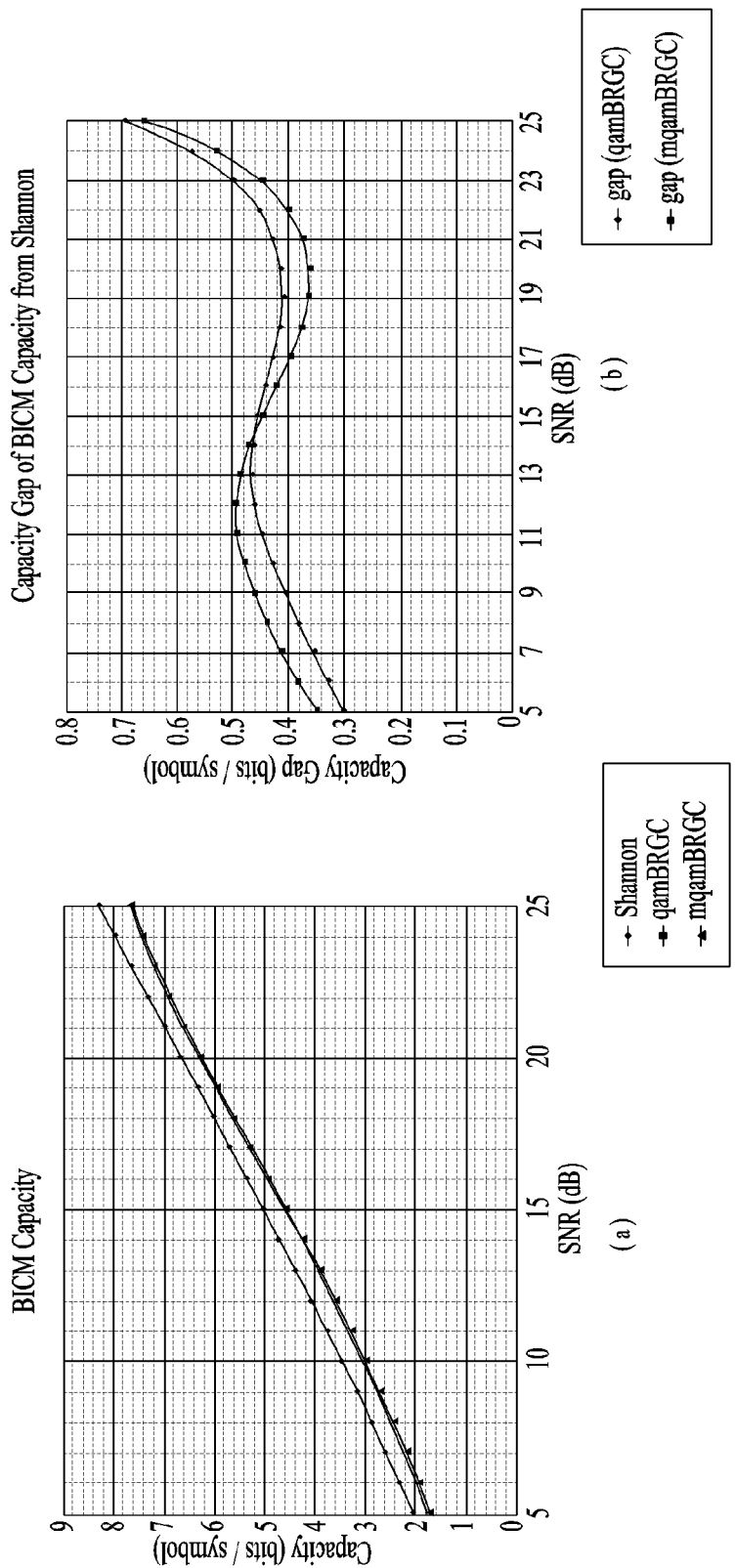
FIG. 55 is a view illustrating performance achieved when modified 256 QAM is used, according to an embodiment of the present invention.

FIG. 55 is a view illustrating performance achieved when modified 256 QAM is used, according to an embodiment of the present invention.

In this figure, (a) illustrates a BICM capacity or a parallel decoding capacity. 'Shannon' may refer to a capacity based on Shannon theory. The capacity based on Shannon theory may be an ideal capacity. In addition, 'qamBRGC' may refer to a capacity based on conventional 256 QAM, and 'mqamBRGC' may refer to a capacity based on modified 256 QAM.

In this figure, (b) illustrates a capacity gap between a capacity based on Shannon theory and a BICM capacity. In this figure, 'gap(qamBRGC)' may be a value obtained by subtracting the value of 'qamBRGC' from the value of 'Shannon' of (a). Furthermore, 'gap(mqamBRGC)' may be a value obtained by subtracting the value of 'mqamBRGC' from the value of 'Shannon' of (a). In this figure, (b) shows that the gap between a capacity according to modified 256 QAM and a capacity according to Shannon is less than the gap between a capacity according to 256 QAM and the capacity according to Shannon at an SNR greater than about 14.5 dB. This result shows that a larger amount of information may be transmitted using modified 256 QAM compared to conventional 256 QAM in an SNR period greater than about 14.5 dB.

Figure 56:
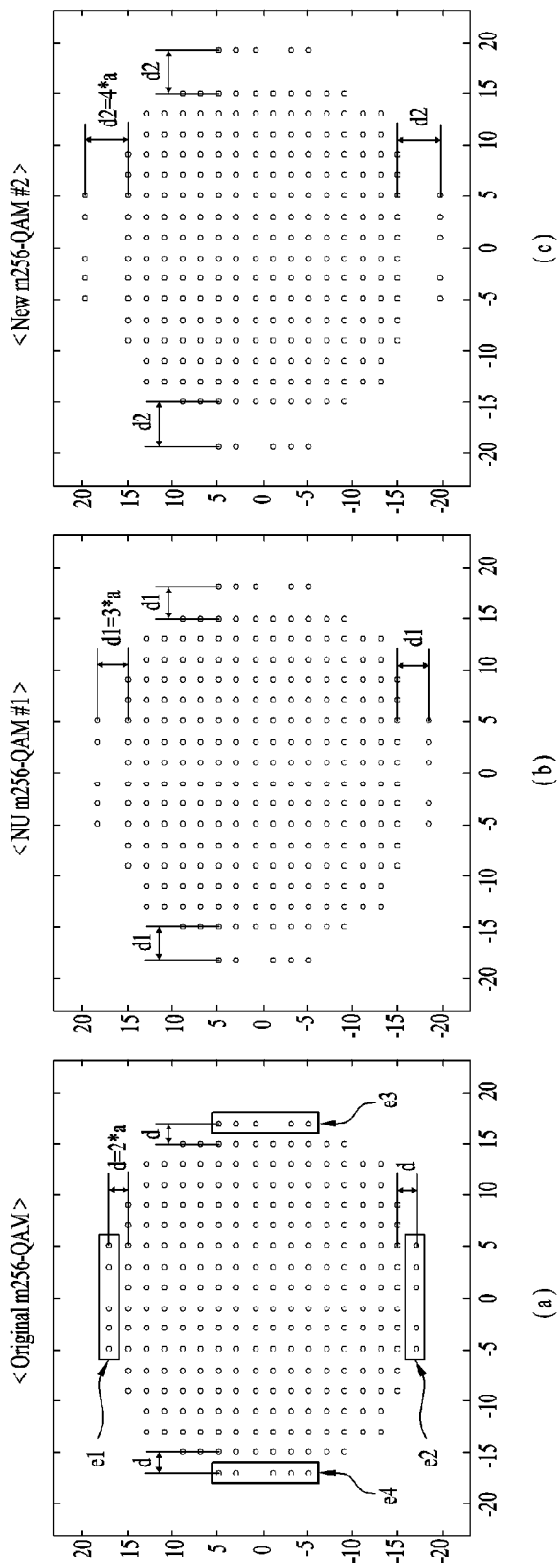
FIG. 56 is a view illustrating constellations of new modified 256 QAM according to an embodiment of the present invention.

FIG. 56 is a view illustrating constellations of new modified 256 QAM according to an embodiment of the present invention.

In this figure, (a) illustrates the above-described constellation of modified 256 QAM, and (b) and (c) illustrate constellations of new modified 256 QAM further improved from modified 256 QAM. The constellations of (b) and (c) of this figure may be obtained by additionally moving constellation points e1 to e4 of modified 256 QAM to increase the value d. Here, d may refer to the shortest distance from the constellation points e1 to e4 to adjacent constellation points. The constellation of (b) of this figure may be called 'New m256 QAM #1', and the constellation of (c) of this figure may be called '(New m256 QAM #2)'.

As described above, the constellation points e1 to e4 may exert a negative influence on the LLR value of b6 and b2. As such, the performance of FEC decoding may be lowered. Accordingly, the present invention proposes new modified 256 QAM using a value greater than 2*a as the value d of modified 256 QAM. Here, a is an arbitrary reference value, and the following description assumes a=1.

The constellation of (b) of this figure uses d1=3*a instead of d of modified 256 QAM. The constellation of (c) of this figure uses d2=4*a instead of d of modified 256 QAM. If an integer multiple of a is used as d, complexity of a transmitter/receiver may be reduced.

This method for varying characteristics of a constellation by changing the value D of the regions e1 to e4 may be equally applied to modified 256 QAM and higher versions thereof. Particularly, if a code rate of FEC is high, performance may be further improved.

An expression of a method for moving coordinates from square 256 QAM (conventional 256 QAM) may be as given below.

1) $|y|>10$ and $((x>14$ and $y>-14)$ or $(x<-14$ and $y<14)):(x,y) \rightarrow (x+(\text{sign of } x)*(d+Na), (\text{sign of } y)*16-y)$ 2) $|x|>10$ and $((y<-14$ and $x>-14)$ or $(y>14$ and $x<14)):(x,y) \rightarrow ((\text{sign of } x)*16-x, x+(\text{sign of } y)*(d+Na))$ Expression 4

New m256 QAM #1 and New m256 QAM #2 may be obtained from conventional 256 QAM by applying 1) and 2) of the above expression, respectively. The above expression may be obtained by adding component Na to the above-described expression for generating modified 256 QAM. N=1 for New m256 QAM #1, and N=2 for New m256 QAM #2. The current embodiment assumes a=1. Here, N is a number greater than 0.

FIG. 57 is a view illustrating constellation moving methods of new modified 256 QAM using coordinate values according to an embodiment of the present invention.

In this figure, (a) illustrates a constellation moving method of modified 256 QAM using coordinate values. A description of the constellation moving method is as given above. The coordinate values may be indicated as given by (I component, Q component), and the I component may indicate a horizontal axis while the Q component may indicate a vertical axis.

In this figure, (b) illustrates a constellation moving method of new modified 256 QAM using coordinate values. In the case of New m256 QAM #1, among the coordinate values of the above-described constellation moving method of modified 256 QAM, (17, x) and (x, 17) may be changed into (18, x) and (x, 18). In the case of New m256 QAM #2, among the coordinate values of the above-described constellation moving method of modified 256 QAM, (17, x) and (x, 17) may be changed into (19, x) and (x, 19). A method for moving coordinate values into modified coordinate values while maintaining integer values has been used.

Figure 58:
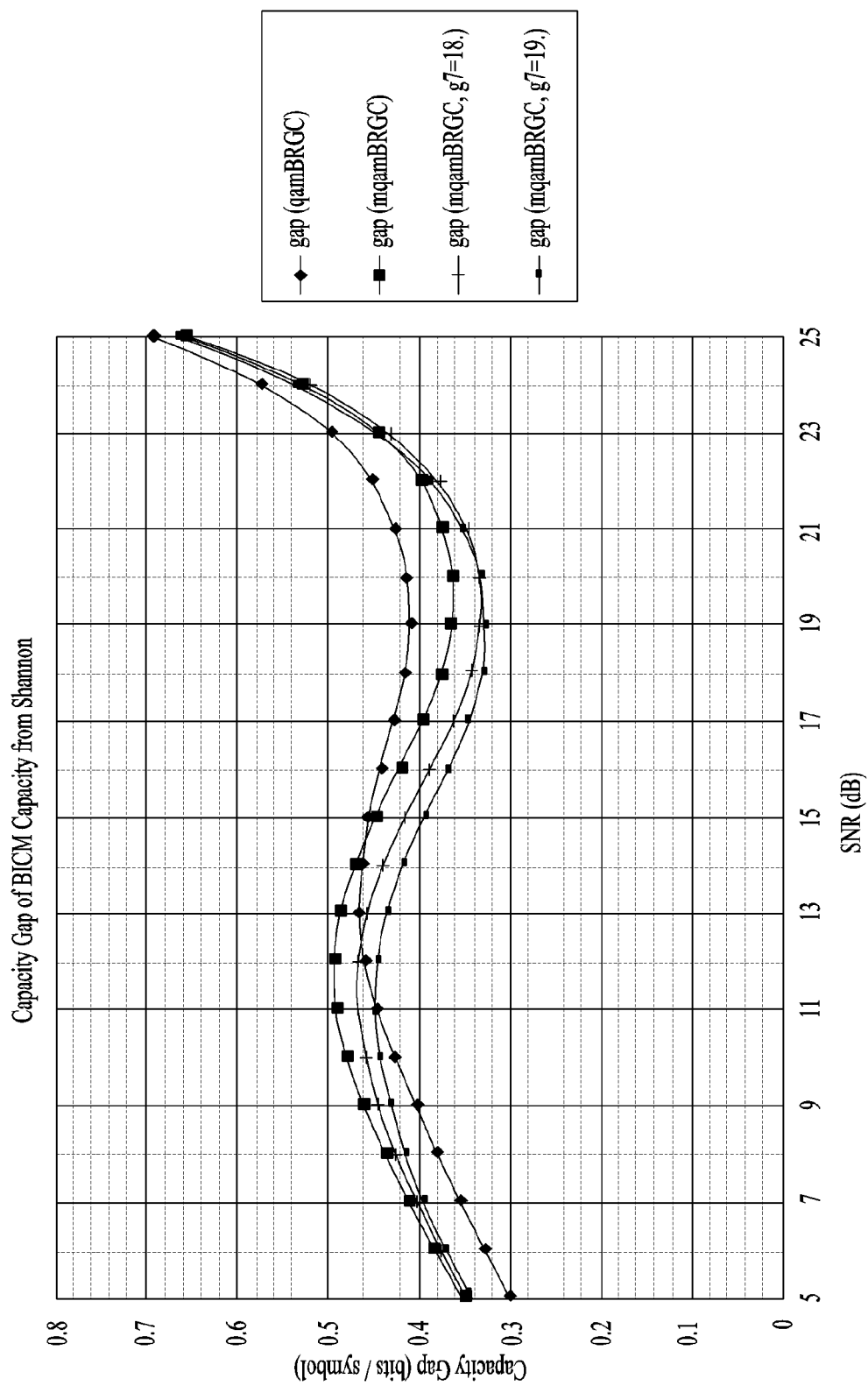
FIG. 58 is a view illustrating capacities of new modified 256 QAM according to an embodiment of the present invention.

FIG. 58 is a view illustrating capacities of new modified 256 QAM according to an embodiment of the present invention.

This figure illustrates a gap between a capacity based on Shannon theory and a capacity based on new modified 256 QAM according to an SNR. In this figure, 'gap(qamBRGC)' and 'gap(mqamBRGC)' are as described above. Furthermore, 'gap(mqamBRGC, g7=18)' may refer to a gap between the capacity based on Shannon theory and a capacity based on New m256 QAM #1. In addition, 'gap(mqamBRGC, g7=19)' may refer to a gap between the capacity based on Shannon theory and a capacity based on New m256 QAM #2. This gap shows the difference in capacity from the Shannon limit. If a value thereof is small, the capacity is close to the Shannon limit.

The graph of this figure shows that the capacities of New m256 QAM #1 and New m256 QAM #2 are closer to the Shannon limit in most SNR periods compared to that of conventional 256 QAM. Bad performance periods compared to conventional 256 QAM include about 14.5 dB for modified 256 QAM, and about 11 dB and 12.5 dB for New m256 QAM #1 and New m256 QAM #2. Accordingly, new modified 256 QAM achieves better capacity performance compared to conventional 256 QAM in a broader SNR range.

Furthermore, in terms of shaping gain, an average power ratio is 0.96176 for modified 256 QAM, 0.97785 for New m256 QAM #1, and 0.99485 for New m256 QAM #2.

Accordingly, all values are less than 1. This shows that shaping gain is still achieved compared to conventional 256 QAM (square 256 QAM). Here, the average power ratio may refer to a value obtained by dividing average power of modified 256 QAM (or New m256 QAM #1 or New m256 QAM #2) by average power of conventional 256 QAM.

Figure 59:
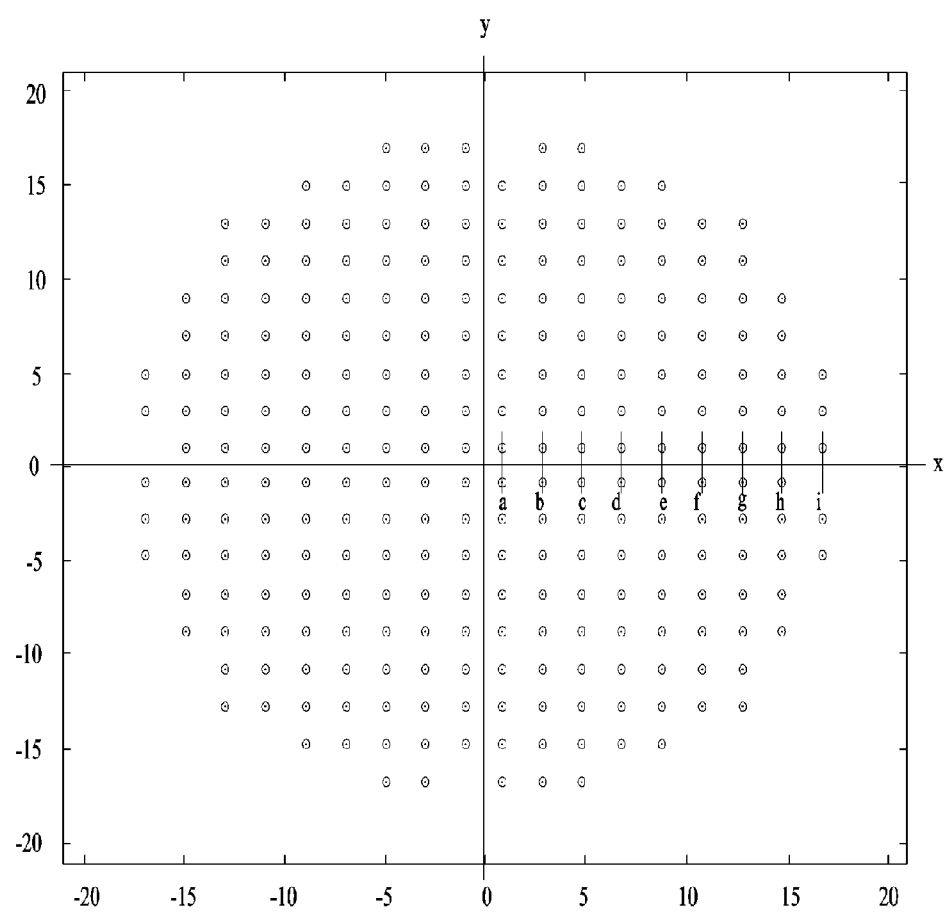
FIG. 59 is a view illustrating a new non-uniform constellation generation method according to an embodiment of the present invention.

FIG. 59 is a view illustrating a new non-uniform constellation generation method according to an embodiment of the present invention.

The above-described constellation mapper may modulate input cell words using QPSK, QAM-16, non-uniform QAM, non-uniform constellation, or the like. Non-uniform QAM is abbreviated to NUQ. Non-uniform constellation may be abbreviated to NUC. Non-uniform QAM may include NUQ-64, NUQ-256, NUQ-1024, etc. Non-uniform constellation may include NUC-16, NUC-64, NUC-256, NUC-1024, etc. Constellation mapping may be applied to DPs. NUQ and NUC may be determined per code rate.

This figure defines new parameters in the above-described constellation of modified 256 QAM. These new parameters may be used to find an ideal constellation having the maximum parallel decoding capacity.

A horizontal axis of the illustrated constellation may be defined as the x axis, and a vertical axis thereof may be defined as the y axis. Each constellation point is one point on x-y coordinates and may be expressed as an x value and a y value. In the illustrated constellation, locations corresponding to x values of constellation points having positive x values are denoted by a to i. The distance to location a on the y axis may be defined as da. In the same manner, the distances to locations b, c, . . . , i on the y axis may be defined as db, dc, . . . , di, respectively. Constellation points having negative values on the x axis are individually symmetrical to the constellation points having positive values. Accordingly, values thereof may be −da, −db, . . . , −di. In the constellation, values of the y axis follow the definition of the x axis, the distances of constellation points from the x axis may have values of −di, −dh, . . . , −da, da, . . . , dh, di (listed in the order from the smallest negative value). Consequently, constellation points generated based on the above-described definition may be symmetrical to each other about both the x axis and the y axis.

A constellation having the highest parallel decoding capacity may be determined based on values of constellation points found while varying the above-defined values da to di. Based on this scheme, the present invention proposes a constellation having the highest parallel decoding capacity per SNR, and gains thereof (e.g., da to di). Furthermore, the present invention additionally proposes a gain value appropriate for actual hardware implemented using a binary system.

Figure 60:
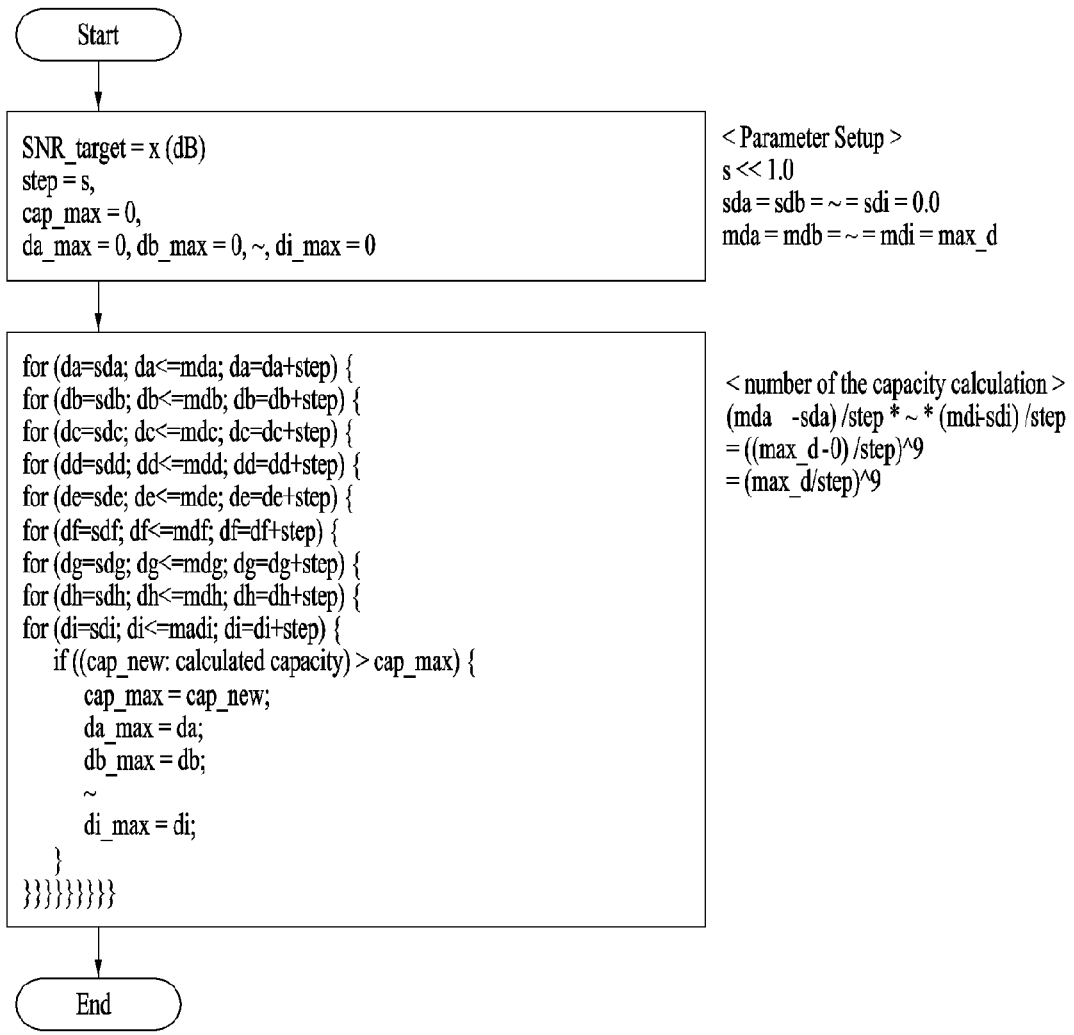
FIG. 60 is a flowchart of Embodiment #1 of the new non-uniform constellation generation method according to an embodiment of the present invention.

FIG. 60 is a flowchart of Embodiment #1 of the new non-uniform constellation generation method according to an embodiment of the present invention.

Embodiment #1 of the new non-uniform constellation generation method may refer to one embodiment of a method for determining an optimal non-uniform constellation of modified 256 QAM.

Here, gain values corresponding to the optimal constellation may be denoted by da_max, db_max, . . . , di_max. The values da_max to di_max may be set to 0 when started.

To find the value da_max, sda may be set as a start value of da. The value sda may be a positive value. The maximum value of da may be mda, and da may be a value equal to or greater than sda. The value da_max may be found by increasing da by one step at a time from sda to mda. The step may be set when started (step=s). In this case, the value da in a case when the parallel decoding capacity is the largest may be stored as da_max.

Since all of the values da_max, db_max, . . . , di_max should be found, cap_max and da_max to di_max may be found from all combinations of variables by increasing the values da to di by the size of a step from start values sda to sdi, to mda to mdi. Here, cap_max may refer to a capacity value in a case when da to di have the values da_max to di_max, respectively. The value cap_max value may be set to 0 when started. As shown in for syntax of the flowchart, all values of db may be found for one value of da, and then all values of dc may be found for one value of db. In this manner, values of dd to dh may also be found.

A parallel decoding capacity may be calculated for each combination of variables. The parallel decoding capacity based on each combination may be stored as cap_new. If the value cap_new is greater than the stored value of cap_max, cap_max and da_max to di_max may be updated to the values of the corresponding combination.

If capacities are calculated for all combinations of variables and then compared, the search process may be completed. The values da_max to di_max obtained through the above-described process may be values for achieving the maximum parallel decoding capacity at a given SNR (target SNR). SNR_target is a target SNR value of the search process, and may be a variable input to calculate the parallel decoding capacity. SNR_target may be set when started (SNR_target=x). SNR may be a signal power to noise power ratio. If the target SNR is changed, optimal values of da_max to di_max may also be changed. Accordingly, the above-described values da_max to di_max may be found for each desired SNR.

For the above-described search process, the step value may be set to a value sufficiently less than 1 to find a gain value through one search process. The current embodiment sets s=0.1. A step value less than 0.1 may not form a meaningful gap in calculating a capacity value. Step values for da to di may be the same.

For the above-described search process, the values sda to sdi may be all set to 0.0 to find the lowest gain first.

For the above-described search process, the values mda to mdi may be equally set to max_d. The value max_d may be set to a value sufficiently greater than an estimated value of di. The current embodiment uses a value equal to or greater than 25.0. If the search process is performed using the values set as described above, all values between 0 to max_d may be found for each of da to di. However, a long search time may be taken.

The number of capacity calculations is calculated in the above-described search process may be expressed as (max_d/step)^9 indicating the number of calculations for each of the gain values da to di, e.g., (max_d/step)^9. Accordingly, the number of calculations may be remarkably increased in units of power of 9 based on the values of max_d and the step.

Figure 61:
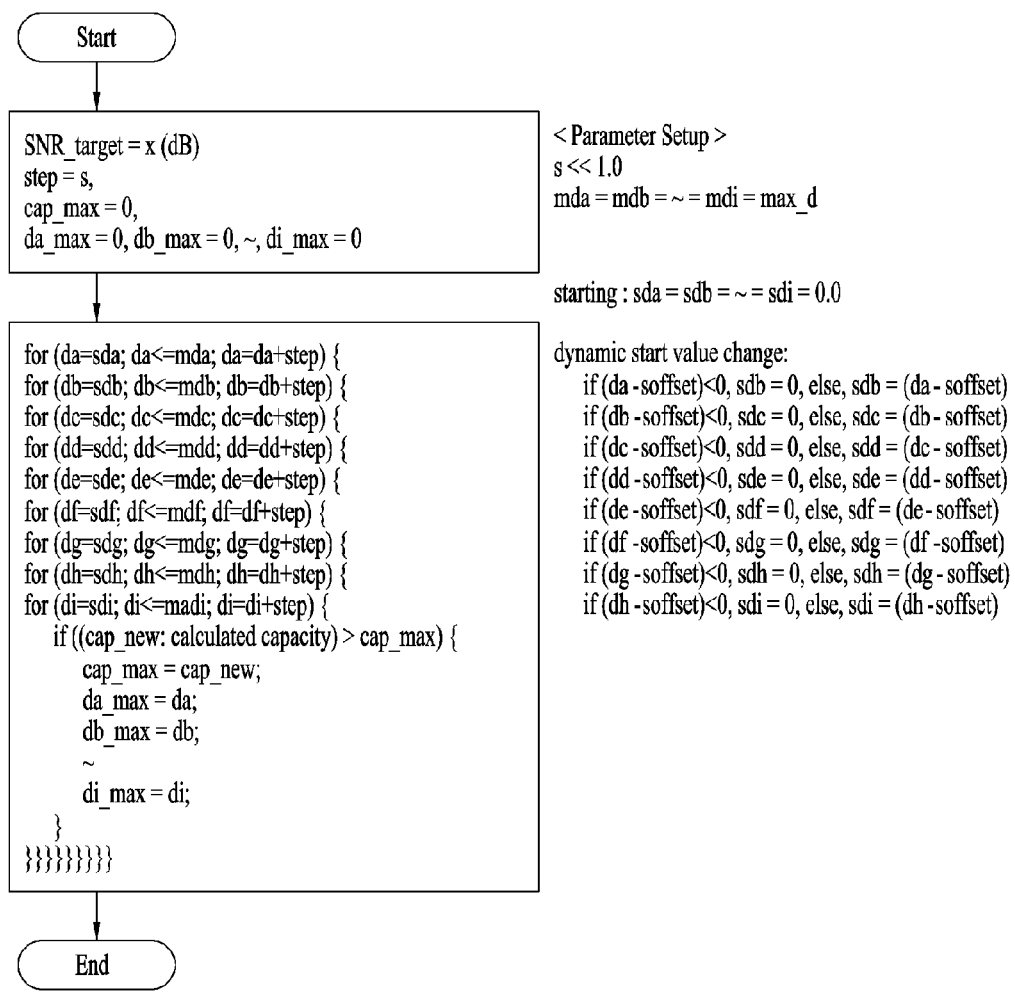
FIG. 61 is a flowchart of Embodiment #2 of the new non-uniform constellation generation method according to an embodiment of the present invention.

FIG. 61 is a flowchart of Embodiment #2 of the new non-uniform constellation generation method according to an embodiment of the present invention.

Embodiment #2 of the new non-uniform constellation generation method may refer to one embodiment of a method for determining an optimal non-uniform constellation of modified 256 QAM.

Embodiment #2 is similar to Embodiment #1 described above but is different therefrom in that a mechanism for reducing the number of searches is added. That is, the difference of Embodiment #2 compared to Embodiment #1 may be that the start values sda to sdi of gain are associated with each other and may be dynamically changed when the search process is performed by varying each gain value using for syntax, to reduce the number of searches.

The start values sda to sdi may be all set to 0.0 to find the lowest gain first. After that, based on the iteration and hierarchy of the for syntax shown in the illustrated flowchart, the start value of db may be set to sdb=0 if the value of (da−soffset) is less than 0, or set to sdb=(da−soffset) if the value of (da−soffset) is not less than 0. The value soffset may be set to a value equal to or greater than 0, and the current embodiment uses 1.0. Likewise, as the value db is increased based on iteration of the for syntax, sdc may be set to sdc=0 if the value of (db−soffset) is less than 0, or set to sdc=(db−soffset) if the value of (db−soffset) is not less than 0. The same principle may be applied to sdd to sdi, and thus the values sda to sdi may be dynamically changed per iteration of the for syntax.

According to the above-described method, a search range of the value db may be reduced as the value da is increased, a search range of the value dc may be reduced as the value db is increased, and thus the search range may be continuously reduced to di. Accordingly, a total number of capacity calculations may be remarkably reduced compared to Embodiment #1.

Figure 62:
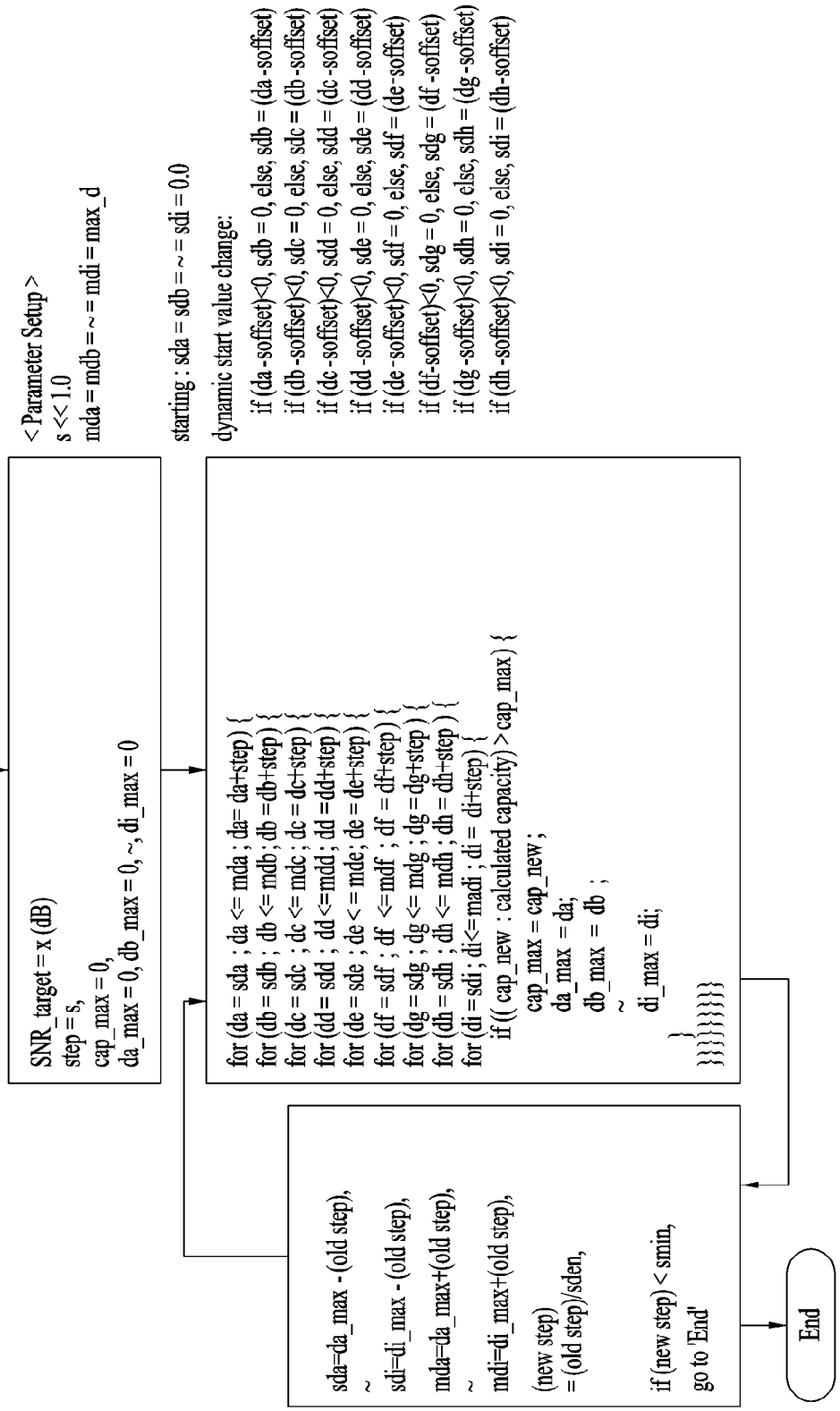
FIG. 62 is a flowchart of Embodiment #3 of the new non-uniform constellation generation method according to an embodiment of the present invention.

FIG. 62 is a flowchart of Embodiment #3 of the new non-uniform constellation generation method according to an embodiment of the present invention.

Embodiment #3 of the new non-uniform constellation generation method may refer to one embodiment of a method for determining an optimal non-uniform constellation of modified 256 QAM.

Embodiment #3 may be another embodiment for reducing the number of capacity calculations. Embodiment #3 relates to a method additionally applicable to Embodiment #1 and Embodiment #2. The following description of Embodiment #3 is given based on Embodiment #2 described above, and only added or modified parts compared to Embodiment #2 are now described.

In Embodiment #3, the initial step value s may be set to a larger value compared to Embodiment #2. As such, the value of (mda−sda)/step indicating the number of iterations of for syntax for finding each gain may be smaller. Likewise, for the values db to di, the number of iterations of the for syntax may be reduced.

If da_max to di_max are determined through calculation using a large step value, the step value may be reduced and the values sda and mda may be set to sda=(da_max−old step) and mda=(da_max+old step), respectively. Here, old step may refer to the large value before the step value is reduced. The reduced step value may be expressed using a variable called new_step, e.g., new_step=(old step)/sden. The value sden may be a value used to reduce the step. The values sdb to sdi and mdb to mdi may also be reset in the same manner. Using the reset variable values, a process for finding the values da_max to di_max again may be performed. If a search range is reduced by changing the step value from a large value to a small value as described above, a total number of capacity calculations may be reduced.

In the current embodiment, the initial step value s may be set to 0.4 or 0.8. The value sden value may use an arbitrary value greater than 1, and the current embodiment may use sden=2. As the step value is changed, the number of iterations of the search process may be determined based on the initial step value s, the value sden, and value smin. The value smin may refer to the minimum value of the step value. The current embodiment may use smin=0.1. The value smin may use an arbitrary value greater than 0 and less than 1.

Figure 63:
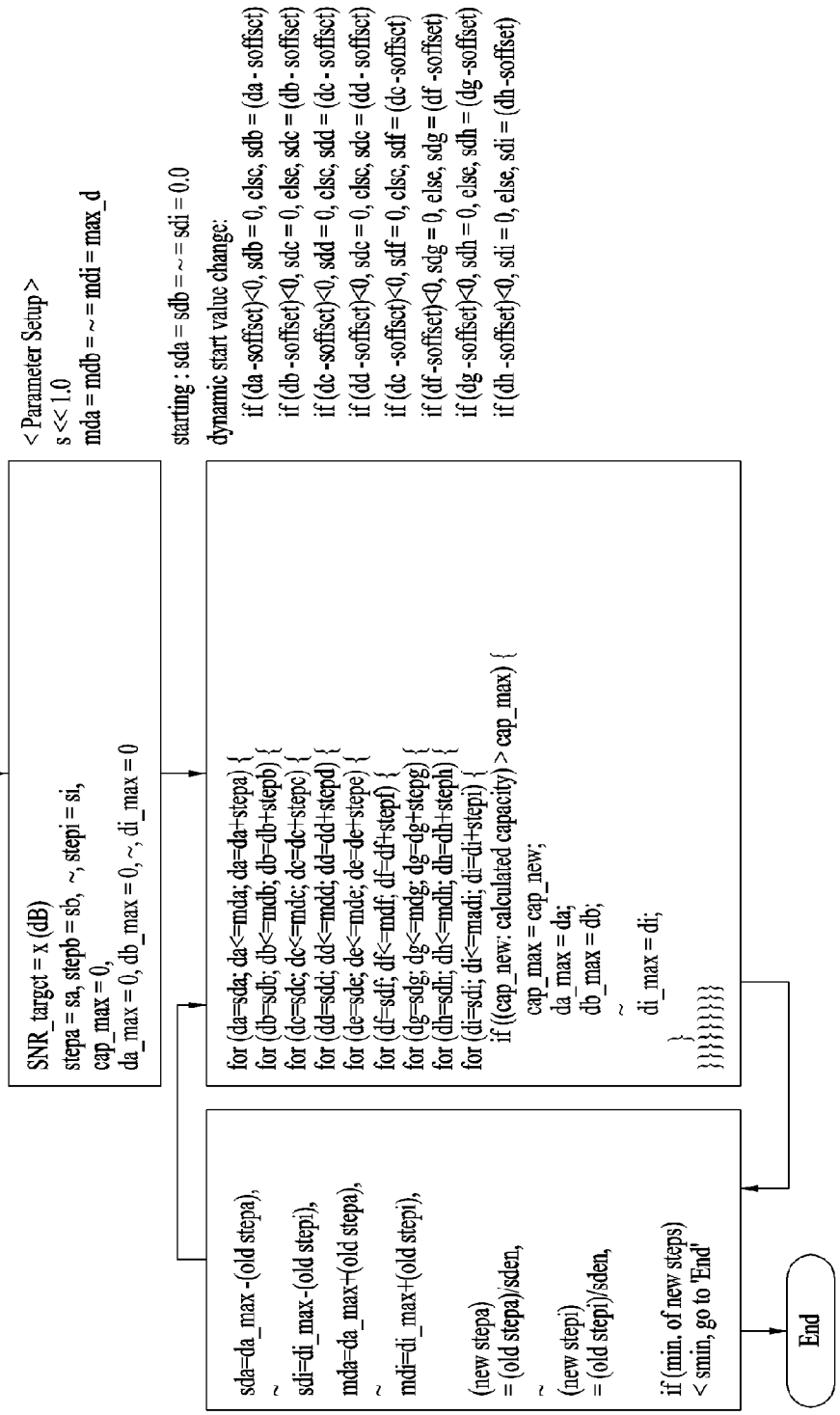
FIG. 63 is a flowchart of Embodiment #4 of the new non-uniform constellation generation method according to an embodiment of the present invention.

FIG. 63 is a flowchart of Embodiment #4 of the new non-uniform constellation generation method according to an embodiment of the present invention.

Embodiment #4 of the new non-uniform constellation generation method may refer to one embodiment of a method for determining an optimal non-uniform constellation of modified 256 QAM.

Embodiment #4 may be another embodiment for reducing the number of capacity calculations. Embodiment #4 relates to a method additionally applicable to Embodiment #1 and Embodiment #2. The following description of Embodiment #4 is given based on Embodiment #3 described above, and a description is now given of a method for more efficiently implementing Embodiment #3.

Although Embodiment #3 uses the same step value, Embodiment #4 relates to a method for setting the step value differently per gain. The values da_max to di_max may be found more efficiently by setting a large step value for a gain having a large value range, and setting a small step value for a gain having a relatively small value range.

Values stepa to stepi may refer to step values per gain to find da_max to di_max, respectively. That is, a case in which the values stepa to stepi are the same may correspond to Embodiment #3. In Embodiment #4, variable values may be set to, for example, stepa=stepb= . . . =stepd, and stepe= . . . =stepi, and thus adjacent gains have the same step value. Gain values of non-uniform modified 256 QAM to be described below may be determined using the method for setting the same step value for adjacent gains. Although an arbitrary method may be used to group adjacent gains, a method for grouping adjacent gains to have the same step value is more efficient.

In the illustrated flowchart, a total searching loop may be ended if the smallest value among updated step values per gain is less than the value smin. Alternatively, according to another embodiment, the total searching loop may be ended if the largest value among the updated step values per gain is less than the value smin.

Figure 64:
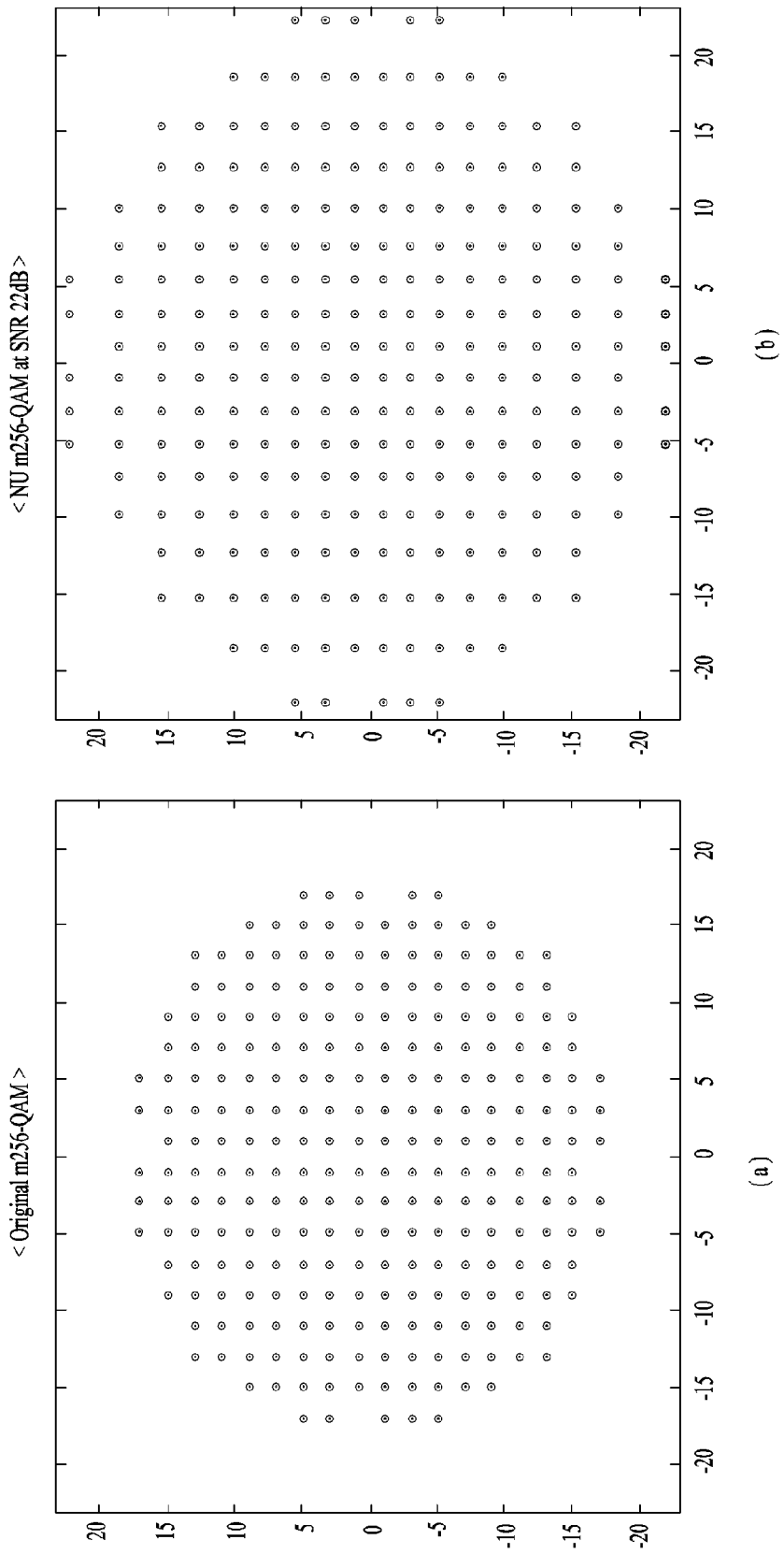
FIG. 64 is a view illustrating non-uniform modified 256 QAM according to the present invention in comparison to modified 256 QAM when an SNR value is 22 dB.

FIG. 64 is a view illustrating non-uniform modified 256 QAM according to the present invention in comparison to modified 256 QAM when an SNR value is 22 dB.

In this figure, (a) illustrates modified 256 QAM described above.

In this figure, (b) illustrates non-uniform modified 256 QAM. The constellation of (b) may have been drawn using the values da_max to di_max determined using the above-described scheme of Embodiment #4. If the SNR value is 22 dB, the values da_max to di_max may be da_max=1, db_max=3.1, dc_max=5.3, dd_max=7.5, de_max=9.9, df_max=12.4, dg_max=15.3, dh_max=18.4, and di_max=22. The constellation of (b) may be a constellation before power normalization is performed.

The constellation of (b) of this figure may be a constellation determined through the above-described calculation process and having the maximum parallel decoding capacity at the corresponding SNR. This constellation of (b) may be different from the constellation of (a) having a uniform interval.

Figure 65:
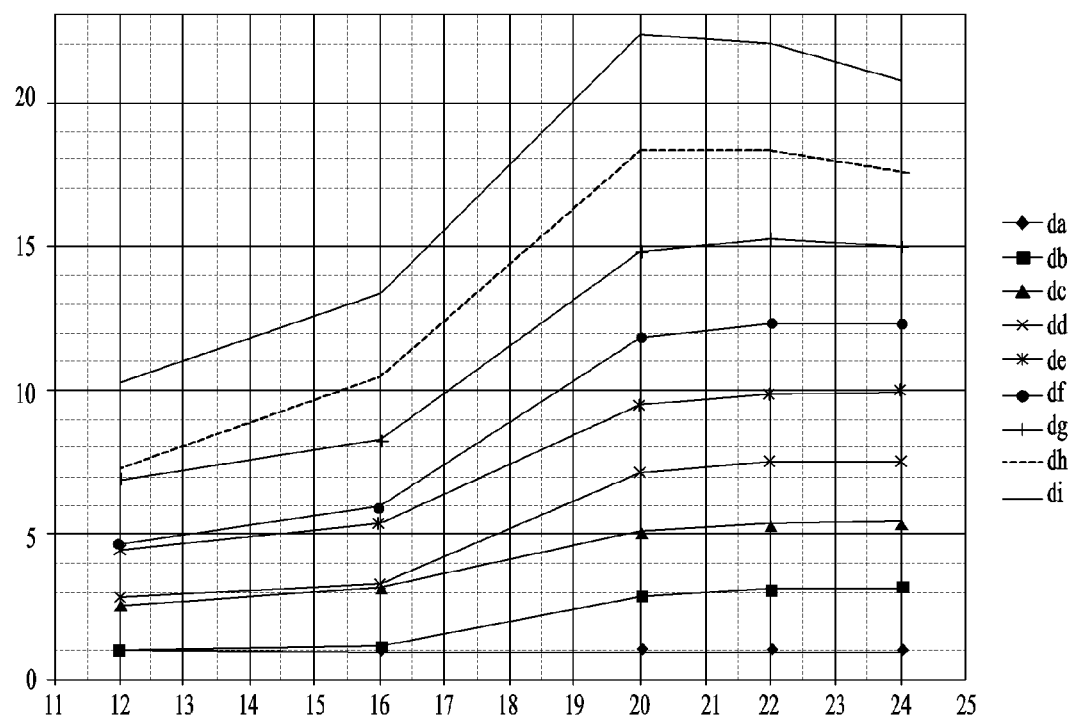
FIG. 65 is a graph showing gain values of non-uniform modified 256 QAM according to an embodiment of the present invention.

FIG. 65 is a graph showing gain values of non-uniform modified 256 QAM according to an embodiment of the present invention.

The x axis of this graph may indicate SNR values, and the y axis may indicate gain values. The gain values of this graph may be values determined using the above-described scheme of Embodiment #4. This graph shows gain values per SNR for some SNR values (e.g., 12, 16, 20, 22, and 24 dB).

The gain values of this graph may be as given by the following table.

TABLE 6

| SNR | da | db  | dc  | dd  | de  | df   | dg   | dh   | di   |
|-----|----|-----|-----|-----|-----|------|------|------|------|
| 12  | 1  | 1   | 2.6 | 2.8 | 4.5 | 4.7  | 7    | 7.3  | 10.3 |
| 16  | 1  | 1.1 | 3.2 | 3.3 | 5.4 | 6    | 8.3  | 10.5 | 13.4 |
| 20  | 1  | 2.9 | 5.1 | 7.1 | 9.5 | 11.9 | 14.9 | 18.3 | 22.3 |
| 22  | 1  | 3.1 | 5.3 | 7.5 | 9.9 | 12.4 | 15.3 | 18.4 | 22   |
| 24  | 1  | 3.2 | 5.4 | 7.6 | 10  | 12.4 | 15   | 17.6 | 20.8 |

The above table may list the values da to di for each SNR value. Constellations using the listed values da to di may have the maximum parallel decoding capacity at the corresponding SNR. For the other SNR values, the values da to di for maximizing the capacity may be calculated using the above-described schemes.

The above-described scheme may be applied to constellations of modified 1024-QAM and higher versions thereof. The present invention proposes non-uniform modified 256 QAM as an example.

Figure 66:
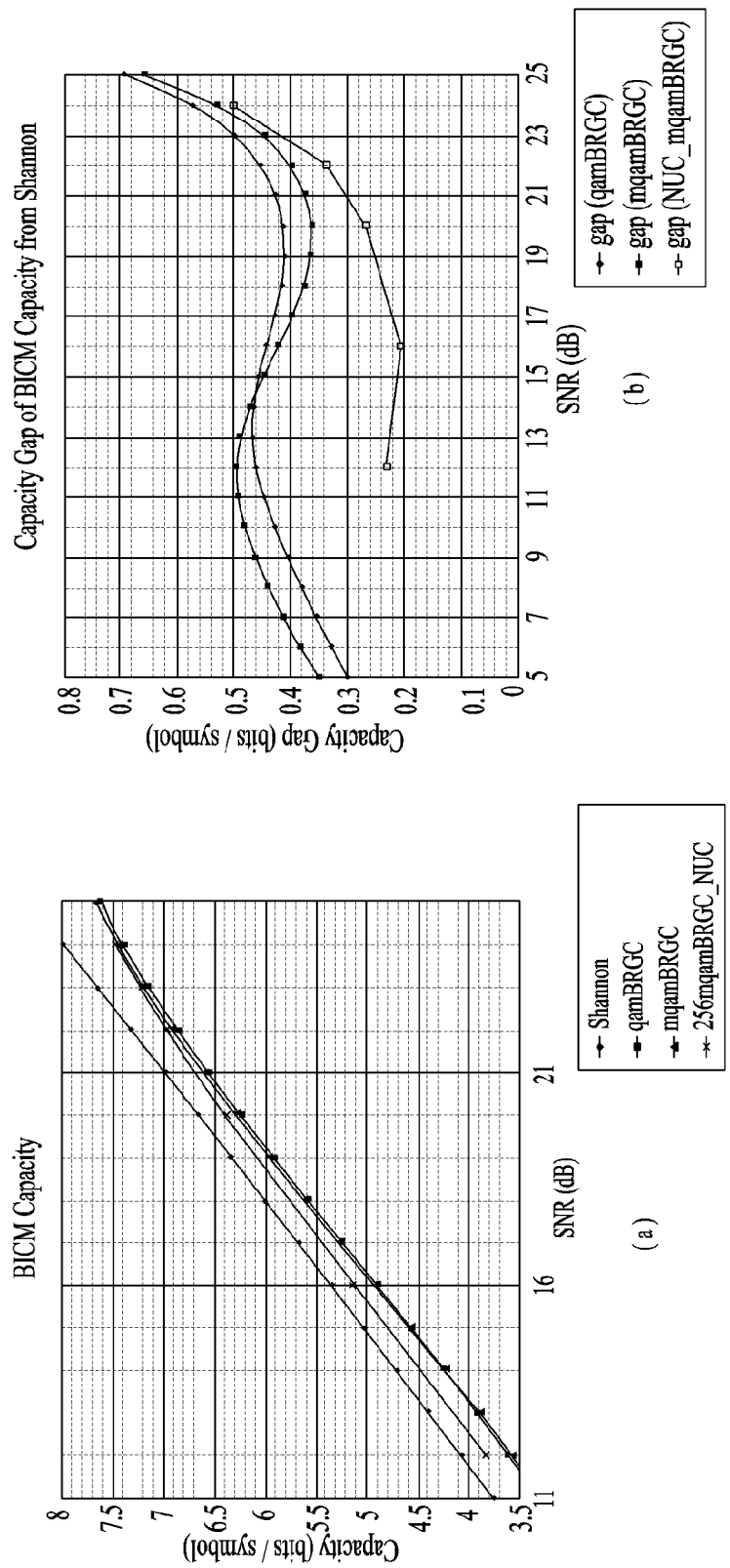
FIG. 66 is a view illustrating capacities of non-uniform modified 256 QAM according to an embodiment of the present invention, and capacity gaps from the Shannon limit.

FIG. 66 is a view illustrating capacities of non-uniform modified 256 QAM according to an embodiment of the present invention, and capacity gaps from the Shannon limit.

'256mqamBRGC_NUM' of (a) of this figure indicates a parallel decoding capacity calculated using gain values of non-uniform modified 256 QAM. The graph of '256mqamBRGC_NUM' is closer to the Shannon limit compared to 'qamBRGC' and 'mqamBRGC' described above. This means that non-uniform modified 256 QAM may transmit a larger amount of information compared to the other constellations on the same condition.

In this figure, (b) shows how far the capacity value of non-uniform modified 256 QAM is apart from the Shannon limit. A smaller capacity gap indicates a larger amount of information transmittable on the same condition. Here, 'gap(NUC_mqamBRGC)' may refer to the gap between the capacity according to non-uniform modified 256 QAM and the Shannon limit. As shown in the graph, the value of 'gap(NUC_mqamBRGC)' may be less than those of 'gap (qamBRGC)' and 'gap(mqamBRGC)'.

Figure 67:
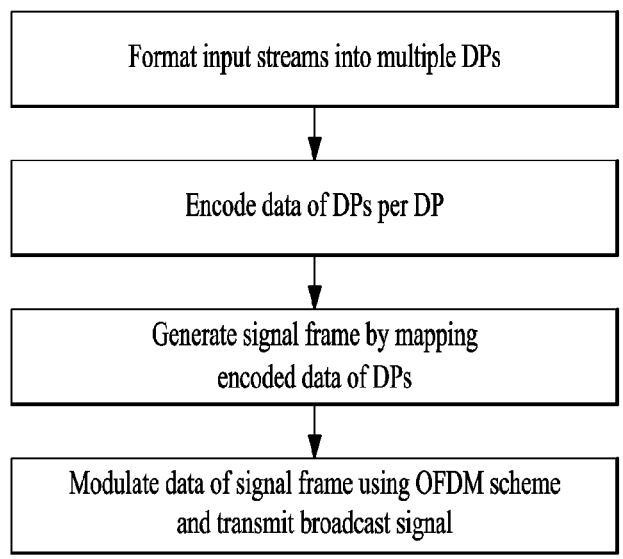
FIG. 67 is a view illustrating a broadcast signal transmission method according to an embodiment of the present invention.

FIG. 67 is a view illustrating a broadcast signal transmission method according to an embodiment of the present invention.

The broadcast signal transmission method according to the present invention may include formatting input streams into a plurality of data pipes (DPs), encoding data of the DPs per DP, generating a signal frame by mapping the encoded data of the DPs, and/or modulating data of the signal frame using an orthogonal frequency division multiplexing (OFDM) scheme and transmitting a broadcast signal.

The formatting of the input streams into the DPs may correspond to formatting/processing the input streams into the DPs by the above-described input formatting module. Here, the DPs may also be called physical layer pipes (PLPs).

The encoding of the data of the DPs per DP may correspond to encoding the data of the DPs per DP based on a code rate by the above-described coding & modulation module. This step may include low density parity check (LDPC)-encoding the data of the DPs, bit-interleaving the LDPC-encoded data, mapping the bit-interleaved data to a constellation based on a code rate, multiple-input multiple-output (MIMO)-encoding the mapped data, and/or diagonal-time-interleaving the MIMO-encoded data.

The LDPC-encoding of the data of the DPs may correspond to performing LDPC encoding as described above. LDPC encoding may be performed based on the code rate.

The bit-interleaving of the LDPC-encoded data may correspond to performing bit interleaving as described above by the above-described bit interleaver block.

The mapping of the bit-interleaved data to the constellation based on the code rate may correspond to mapping the data to the constellation based on the code rate by the above-described constellation mapper block. The constellation may be the above-described constellation of QAM, NUQ, NUC, or the like. The constellation may vary based on the code rate.

The MIMO-encoding of the mapped data may correspond to performing MIMO encoding by the above-described MIMO processing block. MIMO encoding may be performed using an MIMO encoding matrix.

The diagonal-time-interleaving of the MIMO-encoded data may correspond to performing time interleaving as described above by the above-described time interleaver block.

The generating of the signal frame by mapping the encoded data of the DPs may correspond to generating the frame by the above-described frame structure module.

The modulating of the data of the signal frame using the OFDM scheme and the transmitting of the broadcast signal may correspond to performing data modulation and broadcast signal transmission by the above-described waveform generation module.

In the broadcast signal transmission method according to another embodiment of the present invention, the diagonal-time-interleaving may further include performing column-wise write operation to store the MIMO-encoded data in a memory, and interleaving the stored data by performing diagonal-wise read operation from the memory. Here, the diagonal-time-interleaving may correspond to performing time interleaving by the above-described diagonal time interleaver. At this time, the diagonal time interleaver may be a type-A or type-B diagonal time interleaver.

In the broadcast signal transmission method according to another embodiment of the present invention, the generating of the signal frame may further include frequency-interleaving data of the generated signal frame on an OFDM symbol pair basis. Here, the frequency-interleaving may correspond to performing frequency interleaving by the above-described new frequency interleaver.

In the broadcast signal transmission method according to another embodiment of the present invention, the frequency-interleaving may include performing interleaving using two memories. As described above, the new frequency interleaver of the transmitter may perform frequency interleaving using two memories. The new frequency deinterleaver of the receiver may perform deinterleaving using a single memory.

In the broadcast signal transmission method according to another embodiment of the present invention, the above-described constellation may be a quadrature amplitude modulation (QAM) constellation or a non-uniform QAM (NU-QAM) constellation having the maximum capacity per DP. As described above, the constellation may be a QAM constellation, a NU-QAM constellation, or a non-uniform constellation (NUC) per DP. Here, the NU-QAM constellation having the maximum capacity may be a NU-QAM constellation determined using the above-described method for finding a non-uniform constellation having the maximum capacity. This non-uniform constellation may be a non-uniform modified constellation having the maximum capacity and determined using the above-described new non-uniform constellation generation method.

In the broadcast signal transmission method according to another embodiment of the present invention, the encoding of the data of the DPs per DP may further include interleaving the data mapped to the constellation. Here, the interleaving of the data mapped to the constellation may further include splitting the data mapped to the constellation into real number components and imaginary number components and delaying the imaginary number components, and sequentially writing the delayed data to store the data in a memory and reading the data stored in the memory using memory indexes. The splitting of the data into the real number components and the imaginary number components and the delaying of the imaginary number components may correspond to operation of the above-described Q delay block. Here, the sequentially writing and the reading using the memory indexes may correspond to block-by-block I/Q interleaving described above. As described above, block-by-block I/Q interleaving may not be performed by an independent block but may be performed by another block. In addition, block-by-block I/Q interleaving may be omitted or performed by another block having the same or similar function. The memory indexes may be memory indexes used for read operation of block-by-block I/Q interleaving described above.

The above-described steps may be omitted or replaced by other steps having the same or similar functions.

Figure 68:
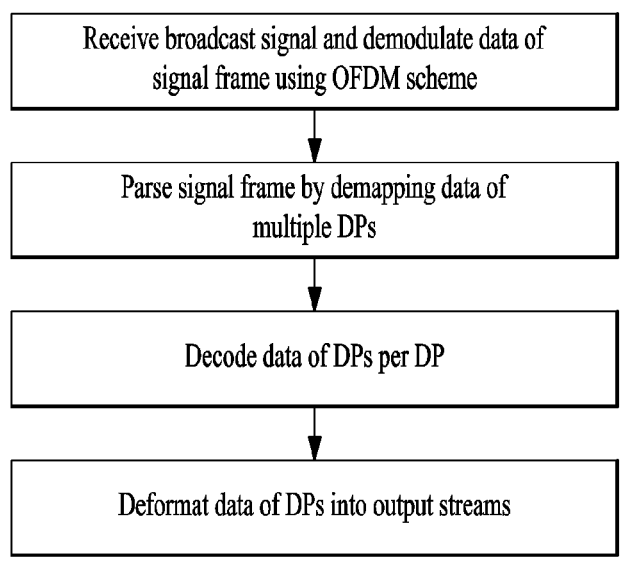
FIG. 68 is a view illustrating a broadcast signal reception method according to an embodiment of the present invention.

FIG. 68 is a view illustrating a broadcast signal reception method according to an embodiment of the present invention.

The broadcast signal reception method according to an embodiment of the present invention may include receiving a broadcast signal and demodulating data of a signal frame using an orthogonal frequency division multiplexing (OFDM) scheme, parsing the signal frame by demapping data of a plurality of data pipes (DPs), decoding the data of the DPs per DP, and/or deformatting the data of the DPs into output streams.

The receiving of the broadcast signal and the demodulating of the data of the signal frame using the OFDM scheme may correspond to receiving the broadcast signal and demodulating the data by the above-described synchronization & demodulation module.

The parsing of the signal frame by demapping the data of the DPs may correspond to parsing the signal frame by the above-described frame parsing module.

The decoding of the data of the DPs per DP may correspond to decoding the data of the DPs per DP path by the above-described demapping & decoding module. The decoding of the data of the DPs per DP may include diagonal-time-deinterleaving the data of the DPs, multiple-input multiple-output (MIMO)-decoding the time-deinterleaved data, demapping the MIMO-decoded data from a constellation based on a code rate, bit-deinterleaving the data demapped from the constellation, and/or low density parity check (LDPC)-decoding the bit-deinterleaved data.

The diagonal-time-deinterleaving of the data of the DPs may correspond to performing time deinterleaving by the above-described time deinterleaver block. This step may correspond to performing diagonal time deinterleaving by the above-described diagonal time deinterleaver. The diagonal time deinterleaver may be type A or type B.

The MIMO-decoding of the time-deinterleaved data may correspond to performing MIMO decoding by the above-described MIMO decoding block. The MIMO decoding block may perform an inverse operation of the MIMO processing block.

The demapping of the MIMO-decoded data from the constellation based on the code rate may correspond to demapping the data from the constellation by the above-described constellation demapper block. The constellation may differ per DP path. As described above, the constellation may be a quadrature amplitude modulation (QAM) constellation, a non-uniform QAM (NU-QAM) constellation, or a non-uniform constellation (NUC). The constellation may differ based on the above-described code rate.

The bit-deinterleaving of the data demapped from the constellation may correspond to performing bit deinterleaving as described above by the above-described bit deinterleaver block.

The LDPC-decoding of the bit-deinterleaved data may correspond to performing LDPC decoding on the data as described above. LDPC decoding may be performed based on the code rate.

The deformatting of the data of the DPs into the output streams may correspond to performing output processing by the above-described output processor.

In the broadcast signal reception method according to another embodiment of the present invention, the diagonal-time-deinterleaving may further include performing diagonal-wise write operation to store the data of the DPs in a memory, and deinterleaving the stored data by performing column-wise read operation from the memory. Here, the diagonal-wise write operation and the column-wise read operation may correspond to operation of the above-described diagonal time deinterleaver. The diagonal time deinterleaver may be a type-A or type-B diagonal time deinterleaver.

In the broadcast signal reception method according to another embodiment of the present invention, the parsing of the signal frame may further include frequency-deinterleaving the data of the signal frame on an OFDM symbol pair basis. Here, the frequency-deinterleaving may correspond to operation of the above-described new frequency deinterleaver.

In the broadcast signal reception method according to another embodiment of the present invention, the frequency-deinterleaving may include performing deinterleaving using one memory. As described above, the new frequency deinterleaver may perform frequency deinterleaving using a single memory.

In the broadcast signal reception method according to another embodiment of the present invention, the constellation may be a QAM constellation or a NU-QAM constellation having the maximum capacity per DP. The used constellation may differ per DP. In this case, the constellation may be a QAM constellation, a NU-QAM constellation, or a NUC. Here, the NU-QAM constellation having the maximum capacity may be a NU-QAM constellation determined using the above-described method for finding a non-uniform constellation having the maximum capacity. This non-uniform constellation may be a non-uniform modified constellation having the maximum capacity and determined using the above-described new non-uniform constellation generation method.

In the broadcast signal reception method according to another embodiment of the present invention, the decoding of the data of the DPs per DP may further include deinterleaving the time-deinterleaved data. In addition, the deinterleaving of the time-deinterleaved data may further include inserting 0 to memory index locations ignored due to skip operation of the time-deinterleaved data and performing write operation using memory indexes to store the data in a single memory simultaneously with read operation performed on the data stored in the single memory, and splitting the read data into real number components and imaginary number components and delaying the real number components. The splitting of the data into the real number components and the imaginary number components and the delaying of the real number components may correspond to operation of the above-described I delay block. Here, the inserting of 0 and the performing of the write operation simultaneously with the read operation may correspond to block-by-block I/Q deinterleaving described above. As described above, block-by-block I/Q deinterleaving may not be performed by an independent block but may be performed by another block. In addition, block-by-block I/Q deinterleaving may be omitted or performed by another block having the same or similar function. The memory indexes may be memory indexes used for block-by-block I/Q deinterleaving described above.

The above-described steps may be omitted or replaced by other steps having the same or similar functions.

While the present invention has been described with reference to separate drawings for convenience, a new embodiment may be implemented by combining embodiments described in the drawings. When needed, designing a computer-readable recording medium having recorded thereon a program for executing the afore-described embodiments of the present invention may fall within the scope of the present invention.

The apparatus and method according to the present invention are not limited to the above-described embodiments. The whole or part of each embodiment may be selectively combined with that of another embodiment so as to make various modifications to the embodiments.

The broadcast signal transmission/reception method according to the present invention can also be embodied as processor-readable code on a processor-readable recording medium. The processor-readable recording medium is any data storage device that can store data which can be thereafter read by a processor. Examples of the processor-readable recording medium include read-only memory (ROM), random-access memory (RAM), magnetic tapes, floppy disks, optical data storage devices and carrier waves (e.g., transmission through the Internet). The processor-readable recording medium can also be distributed over network coupled computer systems so that the processor-readable code is stored and executed in a distributed fashion.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

In addition, the disclosure describes both a product invention as well as a method invention, and descriptions of both inventions may be complementarily applied as needed.

MODE FOR INVENTION

Various embodiments have been described in the best mode for carrying out the invention.

INDUSTRIAL APPLICABILITY

The present invention has industrial applicability in broadcasting and telecommunication fields.

The invention claimed is:

1. A method of transmitting a broadcast signal, the method comprising:
    formatting input streams into a plurality of data pipes (DPs);
    encoding data;
    bit-interleaving the encoded data;
    mapping the bit-interleaved data to constellations;
    cell interleaving the mapped data with an interleaving sequence used for each Forward Error Correction (FEC) block of the mapped data;
    block interleaving the cell interleaved data by skipping virtual cells;
    generating at least one signal frame having symbols including the block interleaved data;
    modulating data in the generated signal frame using an orthogonal frequency division multiplexing (OFDM) scheme; and
    transmitting the broadcast signal comprising the modulated data.

2. The method of claim 1, wherein the block interleaving further comprises:
    column-wise writing the cell interleaved data or the mapped data into a memory; and
    diagonal-wise reading the written data from the memory.

3. The method of claim 1, wherein the method further comprises:
    frequency-interleaving data in the generated at least one signal frame based on a symbol pair.

4. The method of claim 1, wherein the constellations are quadrature amplitude modulation (QAM) constellations or non-uniform QAM (NU-QAM) constellations having a maximum capacity of the DP.

5. A method of receiving a broadcast signal, the method comprising:
    receiving the broadcast signal;
    demodulating the received broadcast signal, using an orthogonal frequency division multiplexing (OFDM) scheme;
    parsing at least one signal frame having symbols from the demodulated broadcast signal by demapping data in a plurality of data pipes (DPs);
    block deinterleaving data based on a location of virtual cells;
    cell deinterleaving the block deinterleaved data with a deinterleaving sequence used for each Forward Error Correction (FEC) block of the deinterleaved data;
    demapping the cell deinterleaved data;
    bit-deinterleaving the demapped data; and
    decoding the bit-deinterleaved data.

6. The method of claim 5, wherein the block deinterleaving further comprises:
    diagonal-wise writing the data into a memory; and
    column-wise reading out the written data from the memory while newly inputted data is written into the memory.

7. The method of claim 5, wherein the method further comprises;
    frequency-deinterleaving data in the at least one signal frame based on a symbol pair.

8. The method of claim 7, wherein the frequency-deinterleaving comprises performing deinterleaving using one memory.

9. The method of claim 5, wherein the demapping the cell deinterleaved data or the deinterleaved data from quadrature amplitude modulation (QAM) constellations or non-uniform QAM (NU-QAM) constellations having a maximum capacity of the DP.

10. A broadcast signal transmission apparatus comprising:
an input formatter to format input streams into a plurality of data pipes (DPs);
an encoder to encode data of a DP;
a bit interleaver to bit-interleave the encoded data;
a constellation mapper to map the bit-interleaved data to constellations;
a cell interleaver to cell interleave the mapped data with an interleaving sequence used for each Forward Error Correction (FEC) block of the mapped data;
a block interleaver to interleave the cell interleaved data by skipping virtual cells;
a frame builder to generate at least one signal frame having symbols including the interleaved data;
an waveform generator to modulate data in the generated at least one signal frame using an orthogonal frequency division multiplexing (OFDM) scheme; and
a transmitter to transmit the broadcast signal comprising the modulated data.

11. The apparatus of claim 10, wherein the block interleaver further performs column-wise writing of the cell interleaved data into a memory, and diagonal-wise reading out the written data from the memory.

12. The apparatus of claim 10, wherein the apparatus further comprises: a frequency interleaver to frequency interleave data in the generated at least one signal frame based on a symbol pair.

13. The apparatus of claim 10, wherein the constellations are quadrature amplitude modulation (QAM) constellations or non-uniform QAM (NU-QAM) constellations having a maximum capacity of the DP.

14. An apparatus of receiving a broadcast signal, the apparatus comprising:
a receiver to receive the broadcast signal;
a demodulator to demodulate the received broadcast signal using an orthogonal frequency division multiplexing (OFDM) scheme;
a frame parser to parse at least one signal frame having symbols from the demodulated broadcast signal by demapping data in a plurality of data pipes (DPs);
a block deinterleaver to deinterleave data of a DP based on a location of virtual cells;
a cell deinterleaver to cell deinterleave the block deinterleaved data with a deinterleaving sequence used for each Forward Error Correction (FEC) block of the block deinterleaved data;
a constellation demapper to demap the cell deinterleaved data;
a bit deinterleaver to bit-deinterleave the demapped data; and
a decoder to decode the bit-deinterleaved data.

15. The apparatus of claim 14, wherein the block deinterleaver performs diagonal-wise writing of the data into a memory, and column-wise reading out the written data from the memory while newly inputted data is written into the memory.

16. The apparatus of claim 14, wherein the apparatus further comprises: a frequency deinterleaver to frequency-deinterleave data in the at least one signal frame based on a symbol pair.

17. The apparatus of claim 16, wherein the frequency deinterleaver performs deinterleaving using one memory.

18. The apparatus of claim 14, wherein the constellation demapper demaps the cell deinterleaved data or the block deinterleaved data from quadrature amplitude modulation (QAM) constellations or non-uniform QAM (NU-QAM) constellations having a maximum capacity of the DP.

* * * * *

UNITED STATES PATENT AND TRADEMARK OFFICE
CERTIFICATE OF CORRECTION

PATENT NO. : 9,577,861 B2
APPLICATION NO. : 14/759604
DATED : February 21, 2017
INVENTOR(S) : Jongseob Baek et al.

It is certified that error appears in the above-identified patent and that said Letters Patent is hereby corrected as shown below:

In the Claims

Column 62, Line 45, of Claim 5, replace "a location of" with --locations of--.

Column 64, Line 9, of Claim 14, replace "a location of" with --locations of--.

Signed and Sealed this
Twenty-first Day of March, 2023

*Katherine Kelly Vidal*

Katherine Kelly Vidal
*Director of the United States Patent and Trademark Office*